(12) United States Patent
Hirano et al.

(10) Patent No.: US 9,696,625 B2
(45) Date of Patent: Jul. 4, 2017

(54) METHOD OF FORMING RESIST PATTERN

(71) Applicant: TOKYO OHKA KOGYO CO., LTD., Kawasaki-shi (JP)

(72) Inventors: Tomoyuki Hirano, Kawasaki (JP); Junichi Tsuchiya, Kawasaki (JP); Rikita Tsunoda, Kawasaki (JP); Tomonari Sunamichi, Kawasaki (JP); Takayoshi Mori, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/883,875

(22) Filed: Oct. 15, 2015

(65) Prior Publication Data
US 2016/0266495 A1 Sep. 15, 2016

(30) Foreign Application Priority Data

Oct. 17, 2014 (JP) .................................. 2014-212936
Mar. 24, 2015 (JP) .................................. 2015-060592
(Continued)

(51) Int. Cl.
*G03F 7/11* (2006.01)
*G03F 7/32* (2006.01)
(Continued)

(52) U.S. Cl.
CPC ................ *G03F 7/11* (2013.01); *C08F 22/22* (2013.01); *C08F 22/36* (2013.01); *C08F 22/38* (2013.01);
(Continued)

(58) Field of Classification Search
CPC ........ G03F 7/11; G03F 7/0045; G03F 7/0046; G03F 7/32; G03F 7/40; H01L 21/0274;
(Continued)

(56) References Cited

U.S. PATENT DOCUMENTS 8,101,333 B2 * 1/2012 Noya ........................ G03F 7/40
430/270.1
8,329,384 B2 * 12/2012 Watanabe ............. G03F 7/0035
430/270.1
(Continued)

FOREIGN PATENT DOCUMENTS

JP   A-2008-518260   5/2008
JP   A-2010-002870   1/2010
(Continued)

*Primary Examiner* — Amanda C Walke
(74) *Attorney, Agent, or Firm* — Knobbe Martens Olson & Bear LLP

(57) ABSTRACT

A method of forming a resist pattern, including: step A in which a first resist pattern is formed on a substrate, step B in which a basic composition is applied to cover the first resist pattern, step C in which a base contained in the basic composition and the first resist pattern are neutralized to form a developing solution insoluble region on a surface of the first resist pattern, and step D in which the covered first resist pattern is developed, the basic composition containing a basic component, and the basic component containing a polymeric compound having a structural unit (x0) represented by general formula (x0-1) (R is H, $C_{1-5}$ alkyl group, $C_{1-5}$ halogenated alkyl group; $Vx^{01}$ is divalent hydrocarbon group having ether bond or amide bond or divalent aromatic hydrocarbon group; $Yx^{01}$ is single bond or divalent linking group; $Rx^1$ is substituent having nitrogen atom).

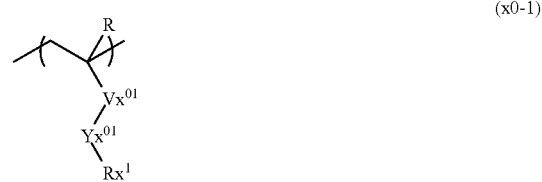

21 Claims, 5 Drawing Sheets

(30) Foreign Application Priority Data

| Aug. 28, 2015 | (JP) | ................................. | 2015-169516 |
| Aug. 28, 2015 | (JP) | ................................. | 2015-169517 |
| Sep. 1, 2015 | (JP) | ................................. | 2015-171960 |
| Sep. 28, 2015 | (JP) | ................................. | 2015-189686 |
| Sep. 30, 2015 | (JP) | ................................. | 2015-194184 |

(51) Int. Cl.

| *G03F 7/004* | (2006.01) |
| *C08F 26/06* | (2006.01) |
| *C08F 26/02* | (2006.01) |
| *C08F 220/26* | (2006.01) |
| *C08F 22/36* | (2006.01) |
| *C08F 22/22* | (2006.01) |
| *C08F 22/38* | (2006.01) |
| *C08F 220/30* | (2006.01) |
| *H01L 21/027* | (2006.01) |
| *C08F 220/36* | (2006.01) |
| *G03F 7/40* | (2006.01) |
| *C08F 220/28* | (2006.01) |

(52) U.S. Cl.
CPC .............. *C08F 26/02* (2013.01); *C08F 26/06* (2013.01); *C08F 220/26* (2013.01); *C08F 220/30* (2013.01); *C08F 220/36* (2013.01); *G03F 7/0045* (2013.01); *G03F 7/0046* (2013.01); *G03F 7/325* (2013.01); *G03F 7/405* (2013.01); *H01L 21/0274* (2013.01); *C08F 2220/283* (2013.01); *C08F 2220/285* (2013.01)

(58) Field of Classification Search
CPC .......... C08F 26/02; C08F 26/06; C08F 22/22; C08F 22/36; C08F 22/38; C08F 220/26; C08F 220/30; C08F 220/34; C08F 220/36; C08F 220/283; C08F 220/285
USPC ......... 430/270.1, 271.1, 322, 325, 329, 330, 430/331, 434, 435; 526/258, 303.1, 306, 526/307.4
See application file for complete search history.

(56) References Cited

U.S. PATENT DOCUMENTS

| 8,338,080 | B2 * | 12/2012 | Kozawa ................... G03F 7/40 430/273.1 |
| 9,316,915 | B2 * | 4/2016 | Hatakeyama ......... G03F 7/2037 |
| 9,360,756 | B2 * | 6/2016 | Yamamoto .............. C08F 12/24 |
| 2006/0088788 | A1 | 4/2006 | Kudo et al. |
| 2009/0197204 | A1 | 8/2009 | Shiono et al. |
| 2009/0317743 | A1 | 12/2009 | Shiono et al. |
| 2010/0310985 | A1 | 12/2010 | Mori et al. |
| 2011/0117499 | A1 | 5/2011 | Matsumiya et al. |
| 2013/0171825 | A1 * | 7/2013 | Xu ...................... H01L 21/0274 438/694 |
| 2014/0186772 | A1 * | 7/2014 | Pohlers .................. G03F 7/405 430/311 |
| 2015/0017587 | A1 | 1/2015 | Okayasu et al. |
| 2015/0086929 | A1 * | 3/2015 | Hatakeyama ............. G03F 7/40 430/324 |
| 2015/0338744 | A1 * | 11/2015 | Hatakeyama ............. G03F 7/40 430/331 |

FOREIGN PATENT DOCUMENTS

| JP | A-2010-032994 | 2/2010 |
| JP | A-2010-277043 | 12/2010 |
| JP | A-2011-013569 | 1/2011 |
| JP | A-2011-128226 | 6/2011 |
| JP | A-2013-083818 | 5/2013 |
| JP | A-2013-178515 | 9/2013 |
| JP | A-2015-055844 | 3/2015 |

* cited by examiner (A)

(B)

(C)

(D)

(E)

METHOD OF FORMING RESIST PATTERN

TECHNICAL FIELD

The present invention relates to a method of forming a resist pattern.

Priority is claimed on Japanese Patent Application No. 2014-212936, filed Oct. 17, 2014; Japanese Patent Application No. 2015-060592, filed Mar. 24, 2015; Japanese Patent Application No. 2015-189686, filed Sep. 28, 2015; Japanese Patent Application No. 2015-169516, filed Aug. 28, 2015; Japanese Patent Application No. 2015-169517, filed Aug. 28, 2015; Japanese Patent Application No. 2015-194184, filed Sep. 30, 2015; and Japanese Patent Application No. 2015-171960, filed Sep. 1, 2015; the contents of which are incorporated herein by reference.

DESCRIPTION OF RELATED ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam, extreme ultraviolet radiation (EUV), and X ray.

As a method of providing a finer pattern, there is proposed a method in which a pattern is thickened, so as to shrink (downsize) a hole pattern.

For example, Patent Literature 1 discloses, as a composition for covering a pattern to thicken the pattern, a composition containing an allylamine polymer.

Further, Patent Literature 2 discloses a method of thickening a resist pattern using an amine polymer, so as to form a fine pattern.

DOCUMENTS OF RELATED ART

Patent Literature

[Patent Literature 1] Japanese Unexamined Patent Application, First Publication No. 2008-518260

[Patent Literature 2] Japanese Unexamined Patent Application, First Publication No. 2013-83818

SUMMARY OF THE INVENTION

However, in the inventions described in Patent Literatures 1 and 2, there was still room for further improvement in downsizing a pattern to form a fine pattern.

The present invention takes the above circumstances into consideration, with an object of providing a method of forming a resist pattern in which a pattern is downsized to obtain a satisfactorily fine pattern.

A first aspect of the present invention is a method of forming a resist pattern, including: step A in which a first resist pattern is formed on a substrate, step B in which a basic composition is applied to cover the first resist pattern, step C in which a base contained in the basic composition and the first resist pattern are neutralized to form a developing solution insoluble region on a surface of the first resist pattern, and step D in which the covered first resist pattern is developed, the basic composition containing a basic component, and the basic component containing a polymeric compound having a structural unit (x0) represented by general formula (x0-1) shown below.

[Chemical Formula 1.]

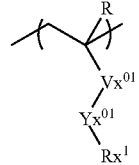

(x0-1)

In the formula, R represents a hydrogen atom, an alkyl group of 1 to 5 carbon atoms or a halogenated alkyl group of 1 to 5 carbon atoms; $Vx^{01}$ represents a divalent hydrocarbon group having an ether bond or an amide bond, a divalent aromatic hydrocarbon group, or a single bond; $Yx^{01}$ represents a single bond or a divalent linking group; and $Rx^1$ represents a substituent having a nitrogen atom.

According to the present invention, there is provided a method of forming a resist pattern in which a pattern is downsized to obtain a satisfactorily fine pattern.

DETAILED DESCRIPTION OF THE INVENTION

Figure 1:
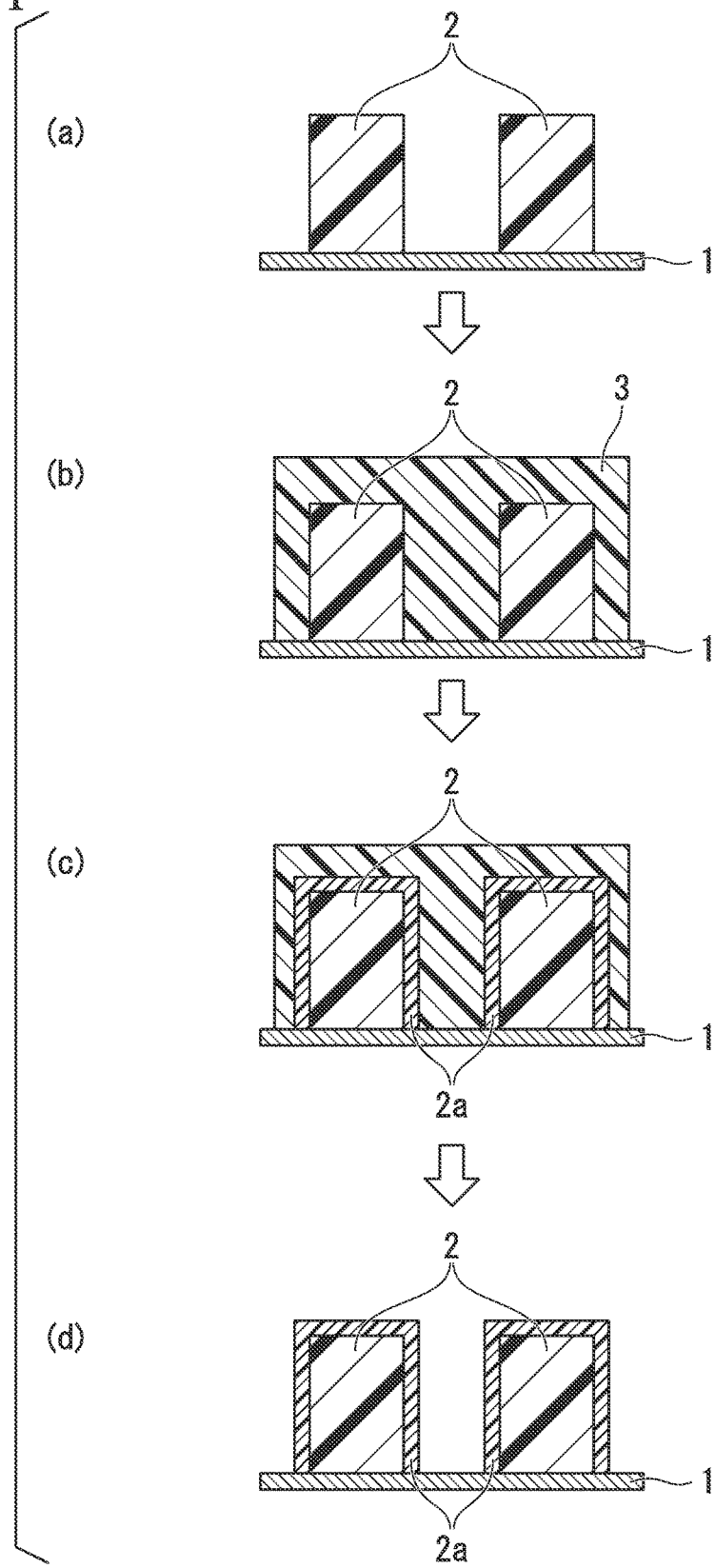
FIG. 1 is a diagram showing one example of schematic steps of the method of forming a resist pattern according to the present invention.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have the hydrogen atom bonded to the carbon atom on the α-position substituted with a substituent. The substituent ($R^\alpha$) with which the hydrogen atom bonded to the carbon atom at the α-position is substituted is an atom other than the hydrogen atom or a group, and examples thereof include an alkyl group having from 1 to 5 carbon atoms, a halogenated alkyl group having from 1 to 5 carbon atoms, and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "styrene derivative" refers to a compound in which the hydrogen atom on the α-position of styrene is substituted with a substituent such as an alkyl group, a halogenated alkyl group or the like.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The case of describing "may have a substituent" includes both of the case where the hydrogen atom (—H) is substituted with a monovalent group and the case where the methylene group (—$CH_2$—) is substituted with a divalent group.

The term "exposure" is used as a general concept that includes irradiation with any form of radiation.

[First Aspect]

<<Method of Forming a Resist Pattern>>

A first aspect of the present invention is a method of forming a resist pattern, including: step A in which a first resist pattern is formed on a substrate, step B in which a basic composition is applied to cover the first resist pattern, step C in which a base contained in the basic composition and the first resist pattern are neutralized to form a developing solution insoluble region on a surface of the first resist pattern, and step D in which the covered first resist pattern is developed, the basic composition containing a basic component, and the basic component containing a polymeric compound having a structural unit (x0) represented by general formula (x0-1).

[Chemical Formula 2.]

(x0-1)

In the formula, R represents a hydrogen atom, an alkyl group of 1 to 5 carbon atoms or a halogenated alkyl group of 1 to 5 carbon atoms; $Vx^{01}$ represents a divalent hydrocarbon group having an ether bond or an amide bond, or a divalent aromatic hydrocarbon group; $Yx^{01}$ represents a single bond or divalent linking group; and Rx' represents a substituent having a nitrogen atom.

[Step (A)]

Step A is a step in which a first resist pattern is formed on a substrate.

In the present invention, the method of forming a first resist pattern includes: forming a resist film on a substrate using a resist composition described later; conducting exposure of the resist film; and developing the resist film to form a resist pattern. As shown in FIG. 1(a), a first resist pattern 2 is formed on a substrate 1.

The method of forming a first resist pattern may be performed, for example, as follows.

Firstly, a resist composition described later is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

In the present embodiment, the developing treatment may be either an alkali developing process or a solvent developing process, but a solvent developing process is preferable.

(Substrate)

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

<Resist Composition>

In the present invention, the resist composition is preferably a resist composition which generates acid upon exposure and exhibits changed solubility in a developing solution under action of acid.

In the present embodiment, the resist composition preferably contains a base component (A) (hereafter, referred to as "base component (A)") which exhibits changed solubility in a developing solution.

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition.

Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

In step A, the resist composition usable in forming a first resist pattern has a function of generating acid upon exposure, and in the resist composition, the component (A) may generate acid upon exposure, or an additive component other than the component (A) may generate acid upon exposure.

More specifically, in the present embodiment, the resist composition may be
- a resist composition (1) containing an acid generator component (B) which generates acid upon exposure (hereafter, referred to as "component (B)";
- a resist composition (2) in which the component (A) is a component which generates acid upon exposure; or
- a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

In the present embodiment, it is particularly desirable that the resist composition is the aforementioned resist composition (1).

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a photosensitive resin pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A'), a resin, a low molecular weight compound, or a combination thereof may be used.

The component (A) is a base component which exhibits increased solubility in a developing solution under action of acid.

In the present invention, the component (A) may be a component that generates acid upon exposure.

In the present embodiment, the component (A) preferably contains a polymeric compound (A1) having a structural unit containing an acid decomposable group which exhibits increased polarity by the action of acid (hereafter, referred to as "structural unit (a1)"), a structural unit derived from an acrylate ester containing a lactone-containing cyclic group or a carbonate-containing cyclic group (hereafter, referred to as "structural unit (a2)"), and a structural unit containing a polar group-containing aliphatic hydrocarbon group (hereafter, referred to as "structural unit (a3)").

(Structural Unit (a1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—SO$_3$H). Among these, a sulfo group or a polar group containing —OH in the structure thereof (hereafter, referred to as "OH-containing polar group") is preferable, a carboxy group or a hydroxy group is more preferable, and a carboxy group or a hydroxy group is most preferable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, for the sake of convenience, sometimes referred to as "acetal-type acid dissociable group").

[Chemical Formula 3.]

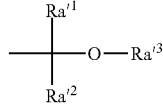

(a1-r-1)

In the formula, Ra$'^1$ and Ra$'^2$ represents a hydrogen atom or an alkyl group; and Ra$'^3$ represents a hydrocarbon group, provided that Ra$'^3$ may be bonded to Ra$'^1$ or Ra$'^2$.

In formula (a1-r-1), as the lower alkyl group for Ra$'^1$ and Ra$'^2$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

The hydrocarbon group for Ra$'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where Ra$'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the hydrocarbon group is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where Ra'$^3$ is bonded to Ra'1 or Ra'$^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 4.]

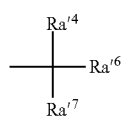

(a1-r-2)

In the formula, Ra'$^4$ to Ra'$^6$ each independently represents a hydrocarbon group, provided that Ra'$^5$ and Ra'$^6$ may be mutually bonded to form a ring.

As the hydrocarbon group for Ra'$^4$ to Ra'$^6$, the same groups as those described above for Ra'$^3$ can be mentioned. Ra'$^4$ is preferably an alkyl group having from 1 to 5 carbon atoms. In the case where Ra'$^5$ and Ra'$^6$ are mutually bonded to form a ring, a group represented by general formula (a1-r2-1) shown below can be mentioned.

On the other hand, in the case where Ra'$^4$ to Ra'$^6$ are not mutually bonded and independently represent a hydrocarbon group, the group represented by general formula (a1-r2-2) shown below can be mentioned.

[Chemical Formula 5.]

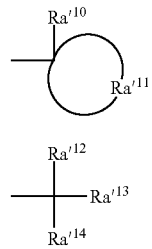

(a1-r2-1)

(a1-r2-2)

In the formulae, Ra'$^{10}$ represents an alkyl group of 1 to 10 carbon atoms; Ra'$^{11}$ is a group which forms an aliphatic cyclic group together with a carbon atom having Ra'$^{10}$ bonded thereto; and Ra'$^{12}$ to Ra'$^{14}$ each independently represents a hydrocarbon group.

In the formula (a1-r2-1), as the alkyl group of 1 to 10 carbon atoms for Ra'$^{10}$, the same groups as described above for the linear or branched alkyl group for Ra'$^3$ in the formula (a1-r-1) are preferable. In the formula (a1-r2-1), as the aliphatic cyclic group which is formed by Ra'$^{11}$, the same groups as those described above for the cyclic alkyl group for Ra'$^3$ in the formula (a1-r-1) are preferable.

In the formula (a1-r2-2), it is preferable that Ra'$^{12}$ and Ra'$^{14}$ each independently represents an alkyl group or 1 to 10 carbon atoms, and it is more preferable that the alkyl group is the same group as the described above for the linear or branched alkyl group for Ra'$^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that Ra'$^{13}$ is the same group as described above for the linear, branched or cyclic alkyl group for Ra'$^3$ in the formula (a1-r-1).

Among these, the same cyclic alkyl group as those describe above for Ra'$^3$ is more preferable.

Specific examples of the formula (a1-r2-1) are shown below. In the formulae shown below, "*" represents a valence bond.

[Chemical Formula 6.]

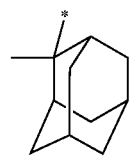

(r-pr-m1)

(r-pr-m2)

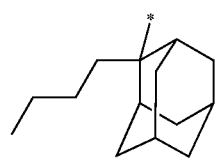

(r-pr-m3)

-continued
(r-pr-m4)
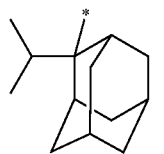
(r-pr-m5)
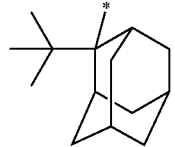
(r-pr-m6)
(r-pr-m7)
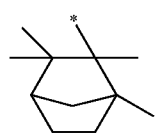
(r-pr-m8)
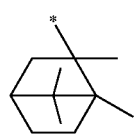
(r-pr-m9)
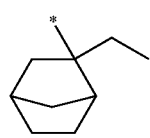
(r-pr-m10)
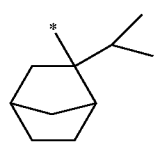
(r-pr-m11)
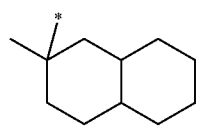
(r-pr-m12)
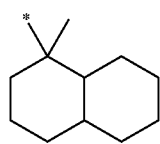
(r-pr-m13)
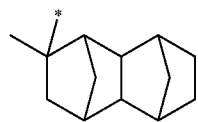
(r-pr-m14)
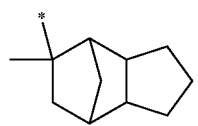
-continued
(r-pr-m15)
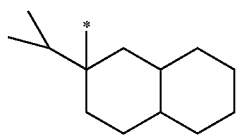
(r-pr-m16)
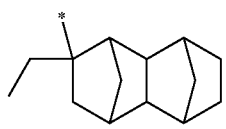
(r-pr-m17)
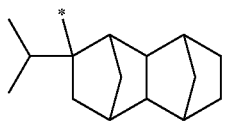
(r-pr-s1)
(r-pr-s2)
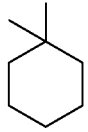
(r-pr-s3)
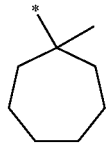
(r-pr-s4)
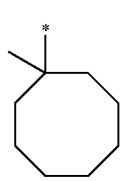
(r-pr-s5)
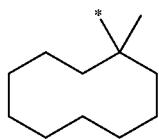
(r-pr-s6)
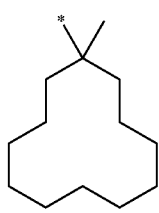
(r-pr-s7)
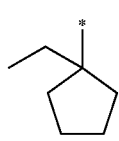

-continued
(r-pr-s8)
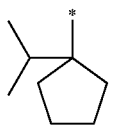
(r-pr-s9)
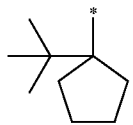
(r-pr-s10)
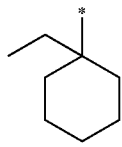
(r-pr-s11)
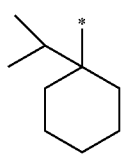
(r-pr-s12)
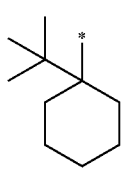
(r-pr-s13)
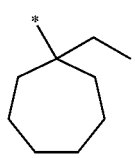
(r-pr-s14)
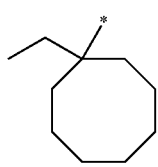
(r-pr-s15)
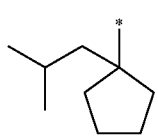
(r-pr-s16)
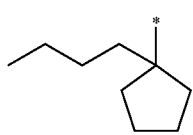
(r-pr-s17)
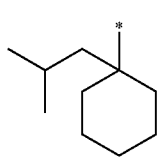
-continued
(r-pr-s18)
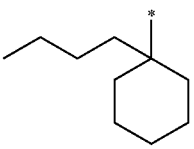
Specific examples of the formula (a1-r2-2) are shown below.
[Chemical Formula 7.]
(r-pr-cm1)
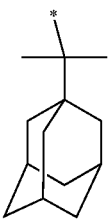
(r-pr-cm2)
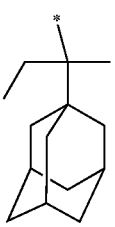
(r-pr-cm3)
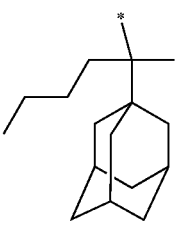
(r-pr-cm4)
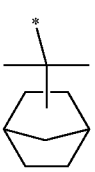
(r-pr-cm5)
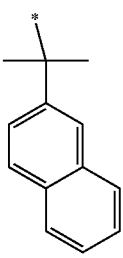

-continued (r-pr-cm6) 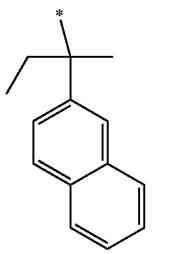

(r-pr-cm7) 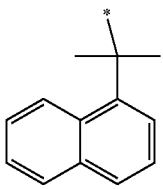

(r-pr-cm8) 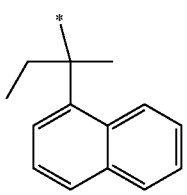

(r-pr-cs1) 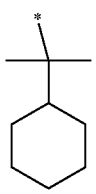

(r-pr-cs2) 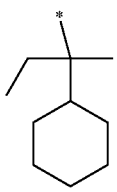

(r-pr-cs3) 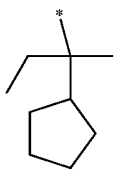

(r-pr-sc4) 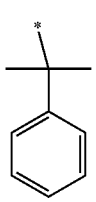

(r-pr-cs5) 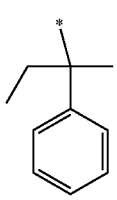

-continued (r-pr-c1) 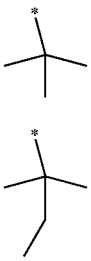

(r-pr-c2) 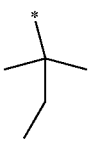

(r-pr-c3) 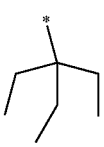

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 8.]

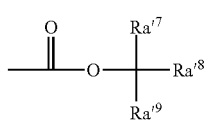

(a1-r-3)

In the formula, $Ra'^{7}$ to $Ra'^{9}$ each independently represents an alkyl group.

In the formula (a1-r-3), $Ra'^{7}$ to $Ra'^{9}$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formula (a1-1) or (a1-2) shown below are preferable.

[Chemical Formula 9.]

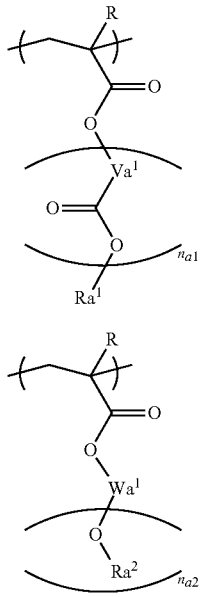

(a1-1)

(a1-2)

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, an urethane bond or an amide bond; each $n_{a1}$ represents an integer of 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_{a2}$ represents an integer of 1 to 3; and $Ra^2$ represents an acid dissociable group represented by the aforementioned formula (a1-r-1) or (a1-r-3).

In general formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the aforementioned formula (a1-2), the hydrocarbon group for Wa$^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for Va$^1$ in the aforementioned formula (a1-1) can be mentioned.

The valency of $n_{a2}+1$ is preferably divalent, trivalent or tetravalent, and divalent or trivalent is more preferable.

As the structural unit (a1-2), a structural unit represented by general formula (a1-2-01) shown below is particularly desirable.

[Chemical Formula 10.]

(a1-2-01)

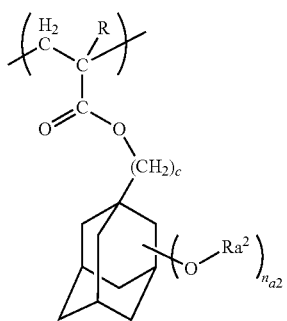

In the formula (a1-2-01), Ra$^2$ represents an acid dissociable group represented by the aforementioned formula (a1-r-1) or (a1-r-3); $n_{a2}$ is an integer of 1 to 3, preferably 1 or 2, and more preferably 1; c is an integer of 0 to 3, preferably 0 or 1, and more preferably 1; R is the same as defined above.

Specific examples of the structural units (a1-1) and (a1-2) are shown below. In the formulae shown below, R$^\alpha$ represents a hydrogen atom, a methyl group or a trifluoromethyl group.

[Chemical Formula 11.]

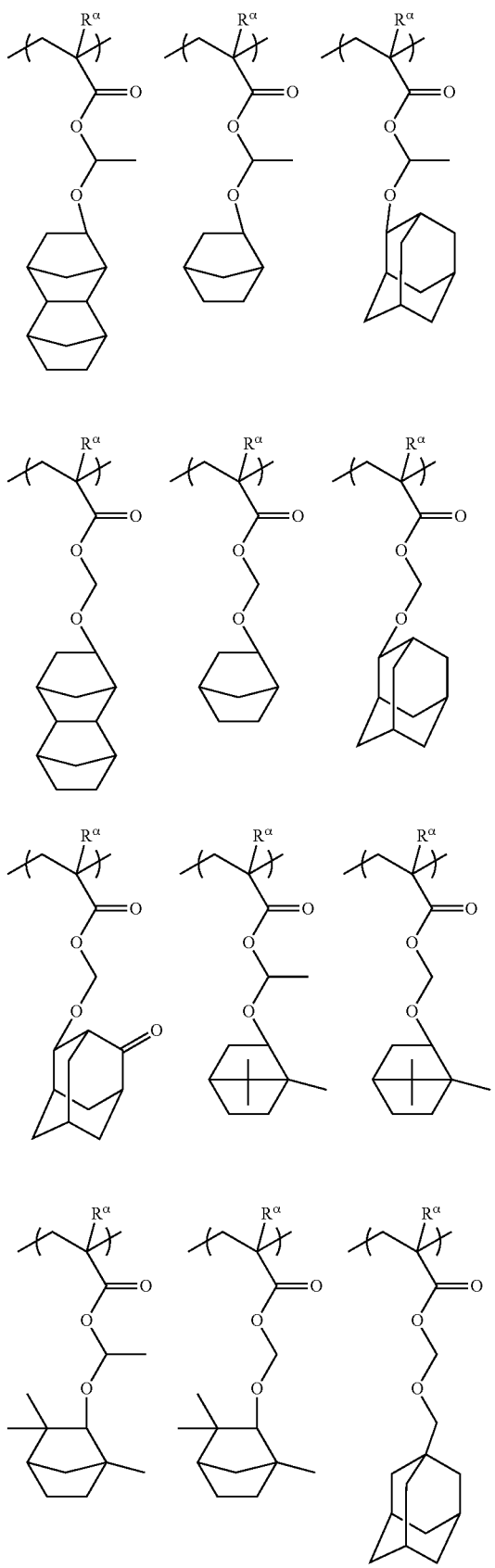

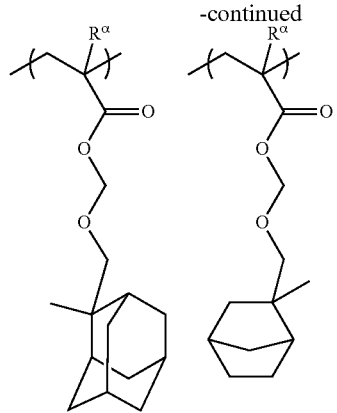
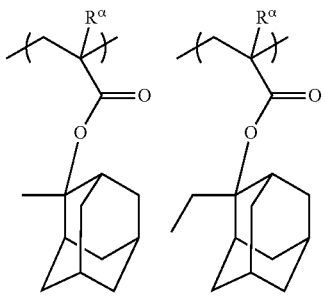
[Chemical Formula 13.]
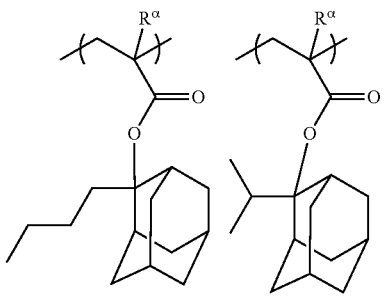
[Chemical Formula 12.]
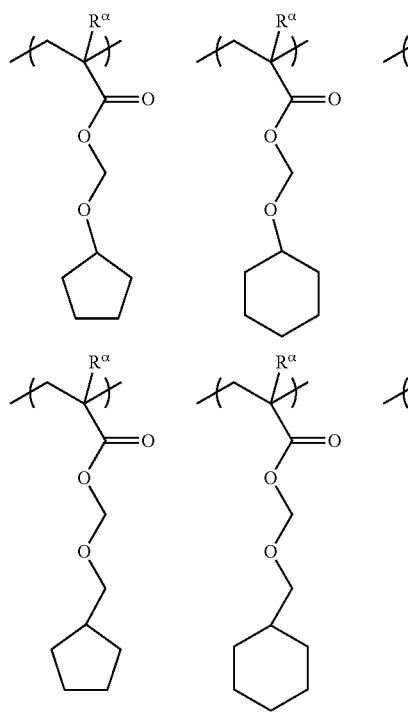
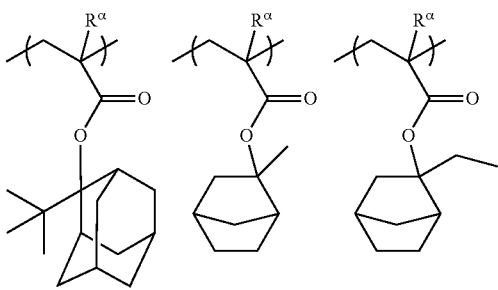
lp;-1p
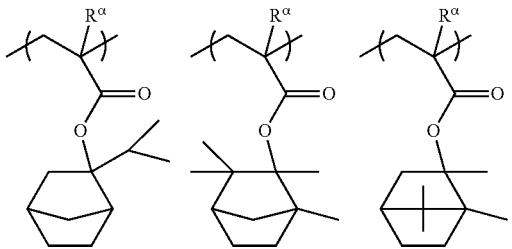
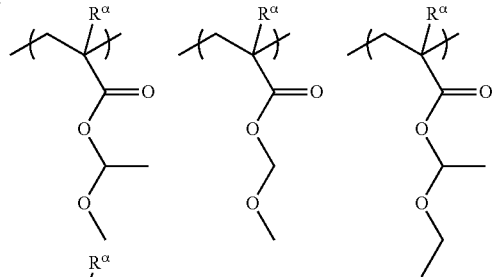
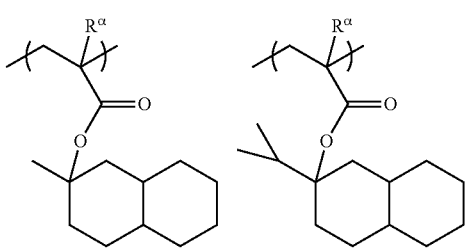
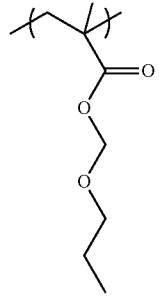
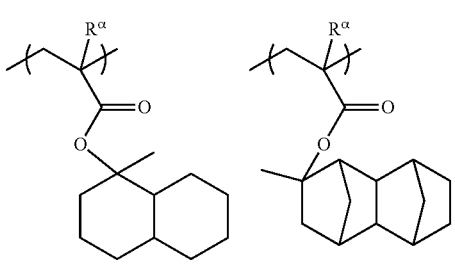

-continued
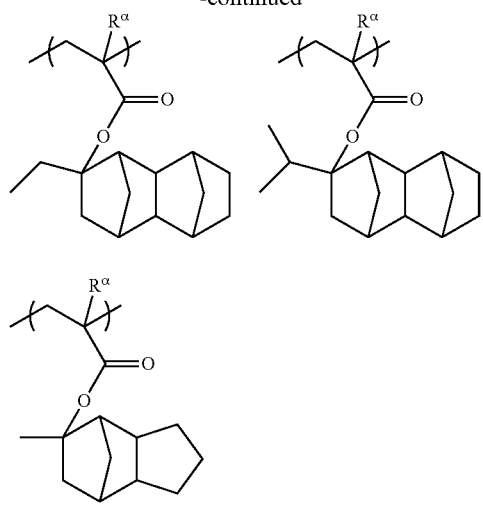
[Chemical Formula 14.]
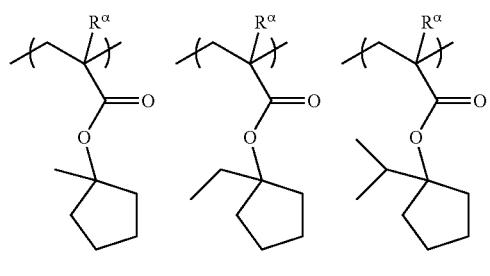
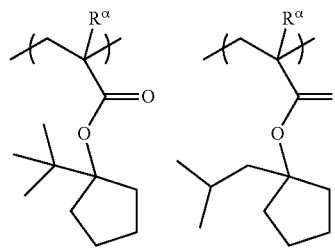
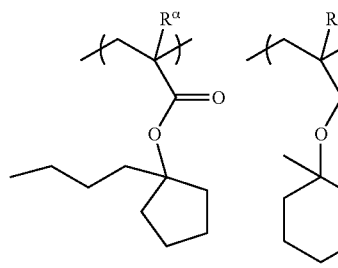
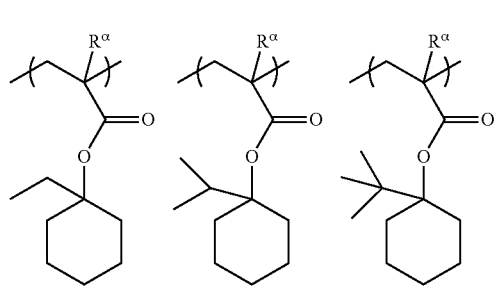
-continued
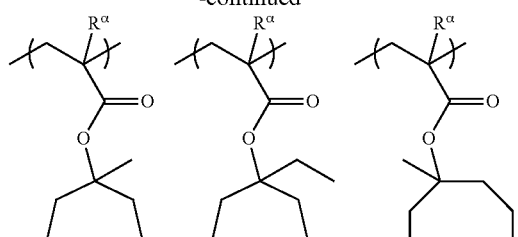
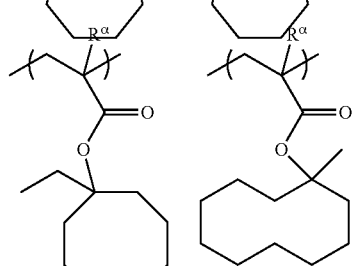
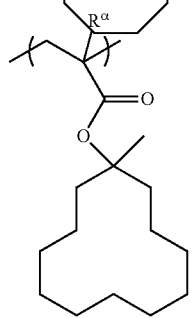
[Chemical Formula 15.]
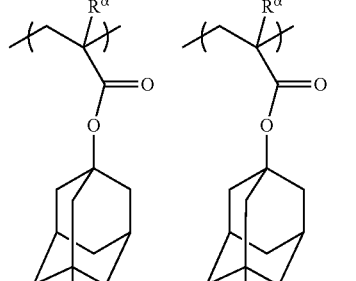
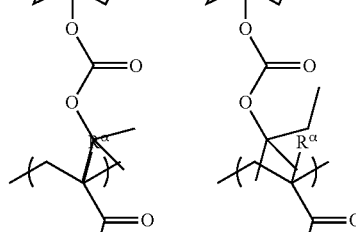
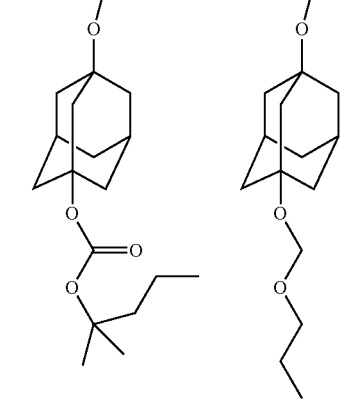

-continued

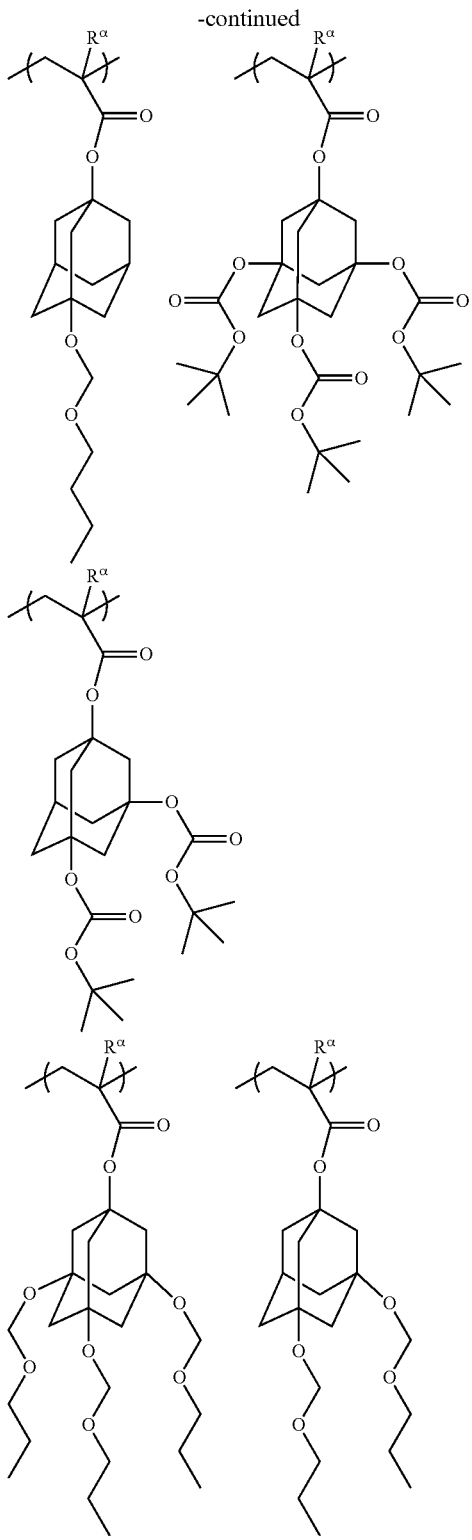

In the component (A), the amount of the structural unit (a1) based on the combined total of all structural units constituting the component (A) is preferably 20 to 80 mol %, more preferably 20 to 75 mol %, and still more preferably 25 to 70 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a2))

The structural unit (a2) is a structural unit containing a lactone-containing cyclic group or a carbonate-containing cyclic group.

When the component (A1) is used for forming a resist film, the structural unit (a2) containing a lactone-containing cyclic group or a carbonate-containing cyclic group is effective in improving the adhesion between the resist film and the substrate.

In the present invention, the component (A1) preferably has a structural unit (a2).

The aforementioned structural unit (a1) which contains a lactone-containing cyclic group, —$SO_2$— containing cyclic group or a carbonate-containing cyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 16.]

(a2-1)

In the formula, R represents a hydrogen atom, an alkyl group of 1 to 5 carbon atoms, a halogenated alkyl group of 1 to 5 carbon atoms, a hydroxyalkyl group, an alkoxy group; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group, provided that, when $La^{21}$ represents —O—, $Ya^{21}$ does not represents —CO—; and $Ra^{21}$ represents a lactone-containing cyclic group, an —$SO_2$— containing cyclic group, or a carbonate-containing cyclic group.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof. Specifically, groups exemplified above for $Va^1$ in the aforementioned formula (a1-1) ca be mentioned.

The linear or branched aliphatic hydrocarbon group may or may not have a substituent. Examples of the substituent include a fluorine atom, a fluorinated alkyl group of 1 to 5 carbon atoms, and a carbonyl group.

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for $Va^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Specific examples of the aromatic hydrocarbon group as a divalent hydrocarbon group include the same group as exemplified above for $Va^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, C(=O)—, —O—C(=O)—O—, C(=O)—NH—, —NH—, —NH—C(=NH)— (wherein H may be substituted with a substituent such as an alkyl group or an acyl group), —S—, —S(=O)$_2$—, —S(=O)$_2$—O—, a group represented by general formula —$Y^{21}$—O—$Y^{22}$—, —$Y^{21}$—O—, —$Y^{21}$—C(=O)—O—, —C(=O)—O—$Y^{21}$, —[$Y^{21}$—C(=O)—O]$_{m'}$—$Y^{22}$— or $Y^{21}$—O—C(=O)—$Y^{22}$— [in the formulae, $Y^{21}$ and $Y^{22}$ each independently represents a divalent hydrocarbon group which may have a substituent, and O represents an oxygen atom; and m' represents an integer of 0 to 3.

The divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formulae —$Y^{21}$—O—$Y^{22}$—, —$Y^{21}$—O—, —$Y^{21}$—C(=)—O—, —C(=O)—O—$Y^{21}$, [$Y^{21}$—C(=O)—O]$_{m'}$—$Y^{22}$— and —$Y^{21}$—O—C(=O)—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, $Ya^{21}$ preferably represents an ester bond [—C(=O)—O—], an ether bond (—O—), a linear or branched alkylene group, a combination of these, or a single bond.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group as the cyclic hydrocarbon group for $R^1$ is not particularly limited, and an arbitrary group may be used. Specific examples include groups represented by general formulas (a2-r-1) to (a2-r-7) shown below. Hereinbelow, "*" represents a valence bond.

[Chemical Formula 17.]

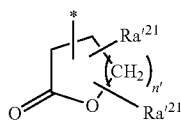
(a2-r-1)

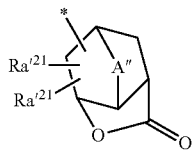
(a2-r-2)

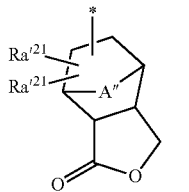
(a2-r-3)

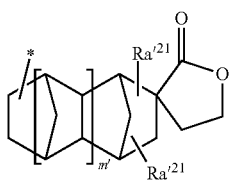
(a2-r-4)

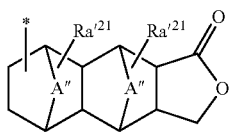
(a2-r-5)

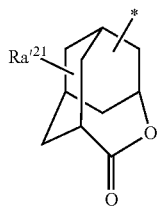
(a2-r-6)

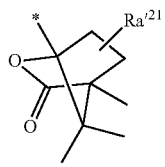
(a2-r-7)

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulae (a2-r-1) to (a2-r-7) above, A" represents an oxygen atom (—O—), a sulfur atom (—S—) or an alkylene group of 1 to 5 carbon atoms which may contain an oxygen atom or a sulfur atom. As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group. Each $Ra'^{21}$ independently represents an alkyl group, an alkoxy group, a halogen atom, a halogenated alkyl group, —COOR", —OC(=O)R", a hydroxyalkyl group or a cyano group.

The alkyl group for $Ra'^{21}$ is preferably an alkyl group of 1 to 5 carbon atoms.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

Specific examples of the groups represented by the aforementioned general formulae (a2-r-1) to (a2-r-7) are shown below.

[Chemical Formula 18.]

(r-Ic-1-1)

(r-Ic-1-2)

33
-continued
(r-Ic-1-3)
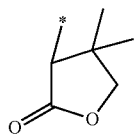
(r-Ic-1-4)
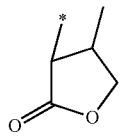
(r-Ic-1-5)
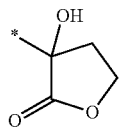
(r-Ic-1-6)
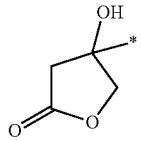
(r-Ic-1-7)
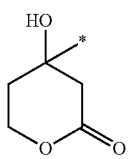
(r-Ic-2-1)
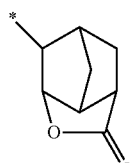
(r-Ic-2-2)
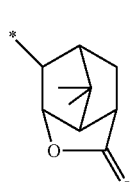
(r-Ic-2-3)
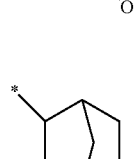
(r-Ic-2-4)
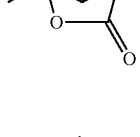
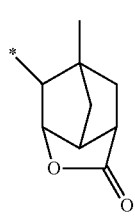
34
-continued
(r-Ic-2-5)
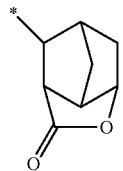
(r-Ic-2-6)
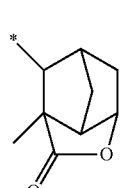
(r-Ic-2-7)
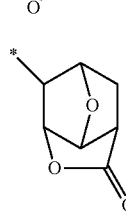
(r-Ic-2-8)
(r-Ic-2-9)
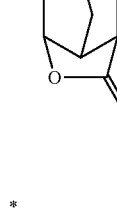
(r-Ic-2-10)
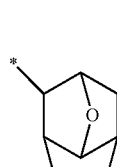
(r-Ic-2-11)
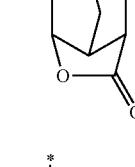
(r-Ic-2-12)
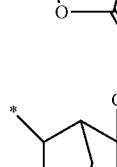

-continued
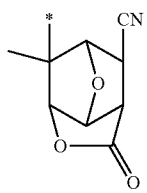 (r-Ic-2-13)
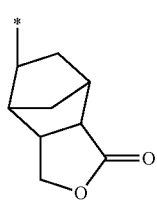 (r-Ic-3-1)
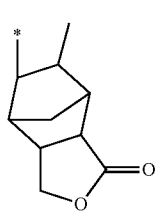 (r-Ic-3-2)
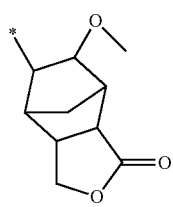 (r-Ic-3-3)
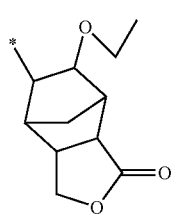 (r-Ic-3-4)
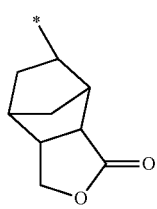 (r-Ic-3-5)
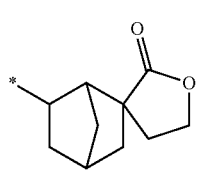 (r-Ic-4-1)
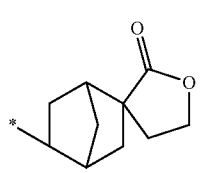 (r-Ic-4-2)
-continued
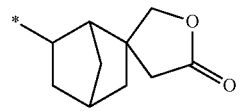 (r-Ic-4-3)
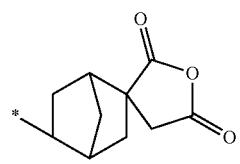 (r-Ic-4-4)
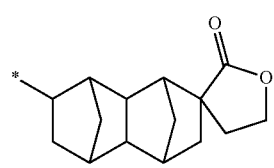 (r-Ic-4-5)
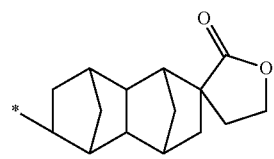 (r-Ic-4-6)
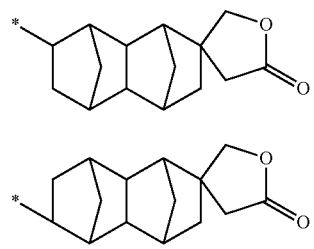 (r-Ic-4-7)
(r-Ic-4-8)
 (r-Ic-4-9)
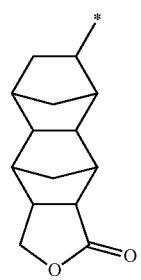 (r-Ic-5-1)
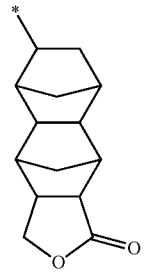 (r-Ic-5-2)

-continued

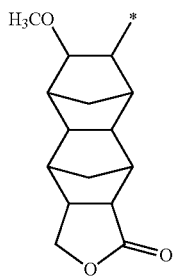
(r-Ic-5-3)

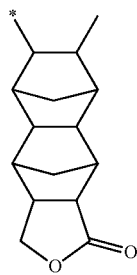
(r-Ic-5-4)

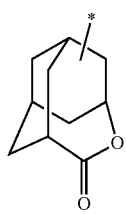
(r-Ic-6-1)

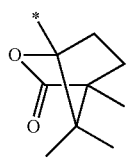
(r-Ic-7-1)

An "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group for the cyclic hydrocarbon group represented by R$^1$, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable. Specific examples of the —SO$_2$— containing cyclic group include groups represented by general formulae (a5-r-1) to (a5-r-4) shown below.

[Chemical Formula 19.]

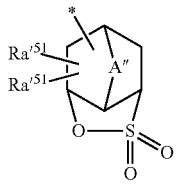
(a5-r-1)

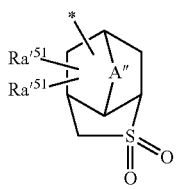
(a5-r-2)

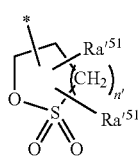
(a5-r-3)

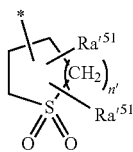
(a5-r-4)

In the formulae, each Ra$'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) to (a5-r-4), A" is the same as defined for A" in general formulae (a2-r-1) to (a2-r-7) described later. The alkyl group, alkoxy group, halogen atom, halogenated alkyl group, —COOR", —OC(=O)R" and hydroxyalkyl group for Ra$'^{51}$ are the same as defined for Ra$'^{21}$ in general formulae (a2-r-1) to (a2-r-7) described later.

Specific examples of the groups represented by the aforementioned general formulas (a5-r-1) to (a5-r-4) are shown below. In the formulae shown below, "Ac" represents an acetyl group.

[Chemical Formula 20.]

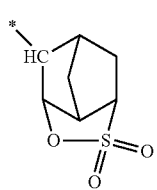
(r-sl-1-1)

(r-sl-1-2)
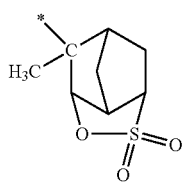
(r-sl-1-3)
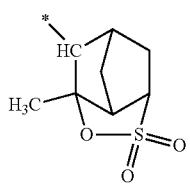
(r-sl-1-4)
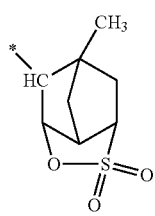
(r-sl-1-5)
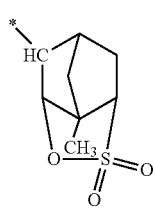
(r-sl-1-6)
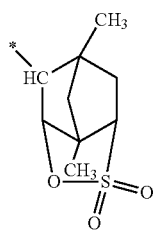
(r-sl-1-7)
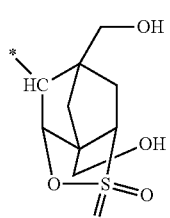
(r-sl-1-8)
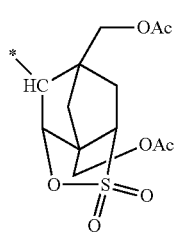
(r-sl-1-9)
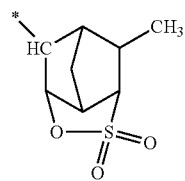
(r-sl-1-10)
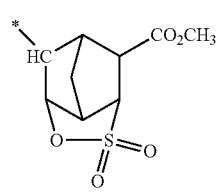
(r-sl-1-11)
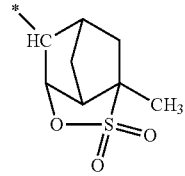
(r-sl-1-12)
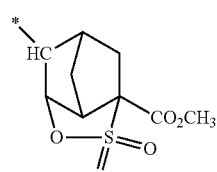
(r-sl-1-13)
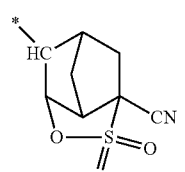
(r-sl-1-14)
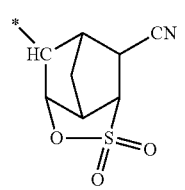
(r-sl-1-15)
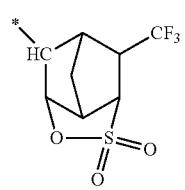
(r-sl-1-16)

(r-sl-1-17)
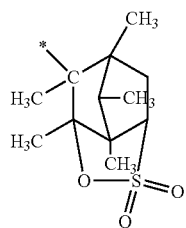
(r-sl-1-18)
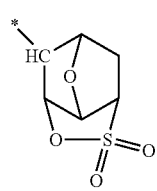
(r-sl-1-19)
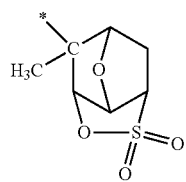
(r-sl-1-20)
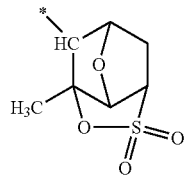
(r-sl-1-21)
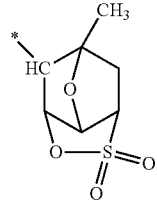
[Chemical Formula 21.]
(r-sl-1-22)
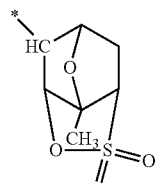
(r-sl-1-23)
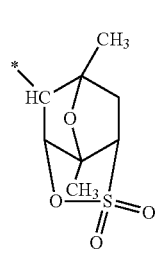
(r-sl-1-24)
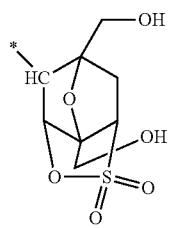
(r-sl-1-25)
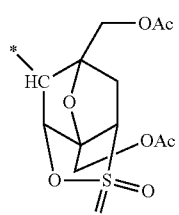
(r-sl-1-26)
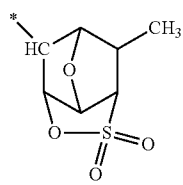
(r-sl-1-27)
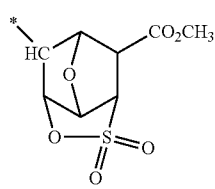
(r-sl-1-28)
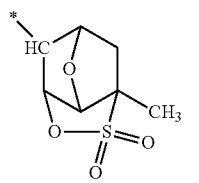
(r-sl-1-29)
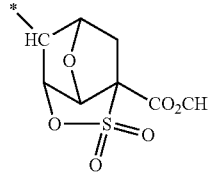
(r-sl-1-30)
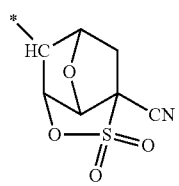
(r-sl-1-31)

(r-sl-1-32)
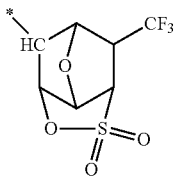

(r-sl-1-33)
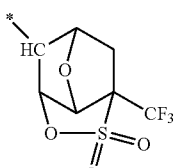

[Chemical Formula 22.]

(r-sl-2-1)
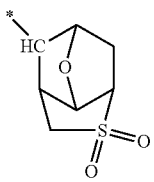

(r-sl-2-2)
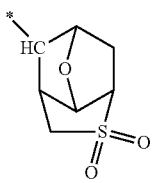

(r-sl-3-1)
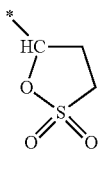

(r-sl-4-1)
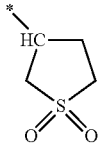

As the —$SO_2$— containing cyclic group, a group represented by the aforementioned general formula (a5-r-1) is preferable, at least one member selected from the group consisting of groups represented by the aforementioned chemical formulae (Rx1-1-1), (Rx1-1-18), (Rx1-3-1) and (Rx1-4-1) is more preferable, and a group represented by chemical formula (Rx1-1-1) is most preferable.

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group as the cyclic hydrocarbon group for $R^1$ is not particularly limited, and an arbitrary group may be used. Specific examples include groups represented by general formulas (ax3-r-1) to (ax3-r-3) shown below.

[Chemical Formula 23.]

(ax3-r-1)
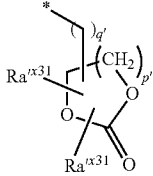

(ax3-r-2)
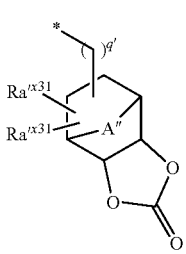

(ax3-r-3)
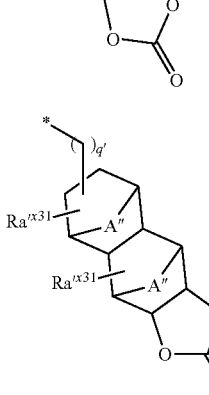

In the formulae, each $Ra'^{31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and q' represents 0 or 1.

In general formulae (ax3-r-1) to (ax3-r-3), A" is the same as defined for A" in general formula (a2-r-1).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 24.]

(r-cr-1-1)
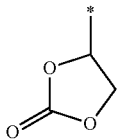

(r-cr-1-2)
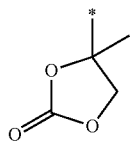
(r-cr-1-3)
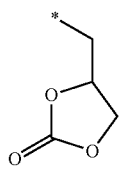
(r-cr-1-4)
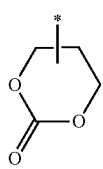
(r-cr-1-5)
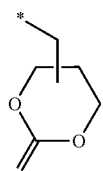
(r-cr-1-6)
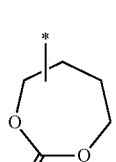
(r-cr-1-6)
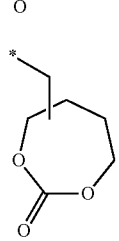
(r-cr-2-1)
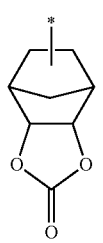
(r-cr-2-2)
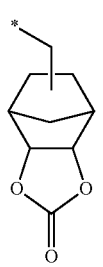
(r-cr-2-3)
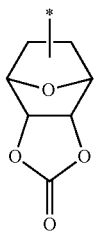
(r-cr-2-4)
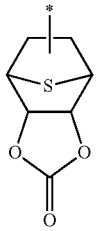
(r-cr-3-1)
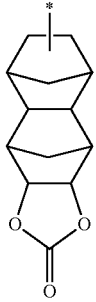
(r-cr-3-2)
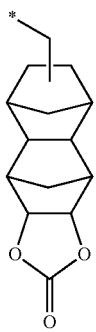
(r-cr-3-3)
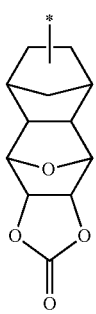

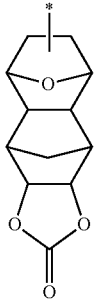
(r-cr-3-4)

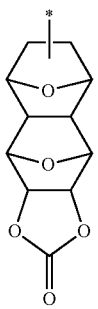
(r-cr-3-5)

Among these examples, as the lactone-containing cyclic group, a group represented by general formula (a2-r-1) or (a2-r-2) is preferable, and a group represented by the chemical formula (r-1c-1-1) is more preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

(Structural Unit (a3))

The structural unit (a3) is a structural unit containing a polar group-containing aliphatic hydrocarbon group (provided that the structural units that fall under the definition of structural units (a1) and (a2) are excluded).

When the component (A1) includes the structural unit (a3), it is presumed that the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 25.]

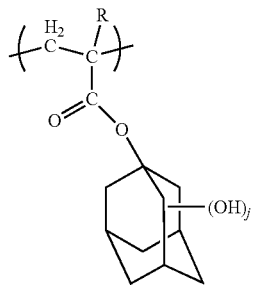
(a3-1)

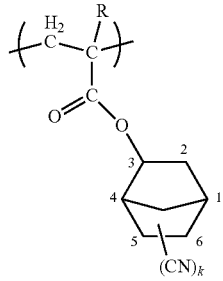
(a3-2)

-continued (a3-3)

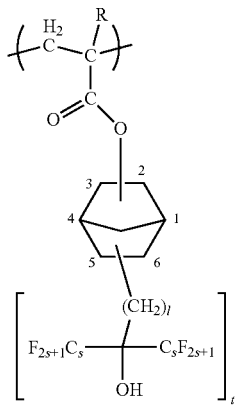

In the formulas, R is the same as defined above; j is an integer of 1 to 3; k is an integer of 1 to 3; t' is an integer of 1 to 3; 1 is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1.1 is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

The component (A1) may also include a structural unit (a4) which is other than the above-mentioned structural units (a1), (a2) and (a3).

(Structural Unit (a4))

The structural unit (a4) is a structural unit containing an acid non-dissociable cyclic group. When the component (A1) includes the structural unit (a4), dry etching resistance of the resist pattern to be formed is improved. Further, the hydrophobicity of the component (A1) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of acid generated from the component (B) described later upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 26.]

(a4-1)

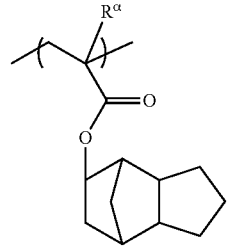

(a4-2)

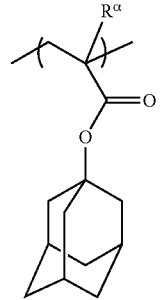

(a4-3)

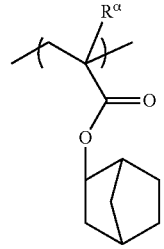

-continued

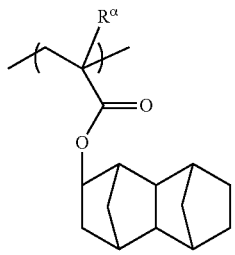

(a4-4)

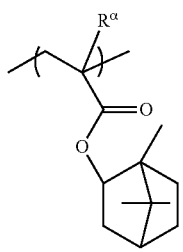

(a4-5)

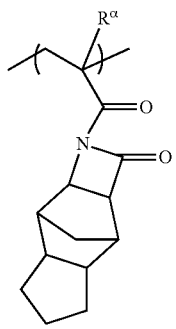

(a4-6)

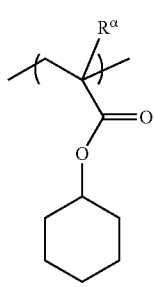

(a4-7)

In the formulae, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

The component (A1) is preferably a copolymer having the structural units (a1), (a2) and (a3).

The component (A1) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the present invention, the weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

As the component (A), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

In the present embodiment, as the component (A), one kind of compound may be used, or two or more kinds of compounds may be used in combination.

In the present embodiment, the amount of the component (A) can be appropriately adjusted depending on the thickness of the resist film to be formed, and the like.

<Acid Generator Component; Component (B)>

In the present invention, the resist composition may include an acid generator component (B) (hereafter, referred to as "component (B)") which generates acid upon exposure. As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

[Chemical Formula 27.]

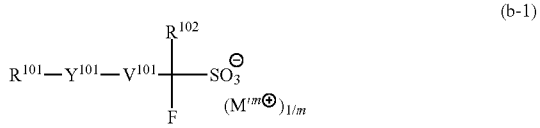

(b-1)

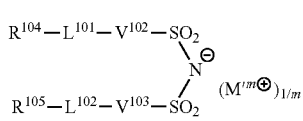  (b-2)

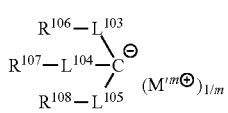  (b-3)

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{106}$ and $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m.

{Anion Moiety}
Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent for $R^{101}$)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for $Va^1$ in the formula (a1-1) can be mentioned, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —SO$_2$— containing cyclic groups represented by the aforementioned formulas (a5-r-1) to (a5-r-4) and heterocyclic groups (r-hr-1) to (r-hr-16) shown below.

[Chemical Formula 28.]

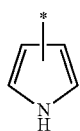  (r-hr-1)

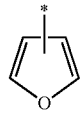  (r-hr-2)

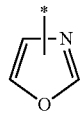  (r-hr-3)

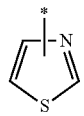  (r-hr-4)

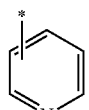  (r-hr-5)

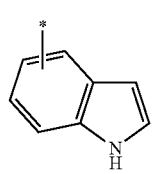  (r-hr-6)

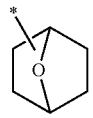  (r-hr-7)

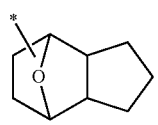  (r-hr-8)

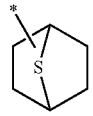  (r-hr-9)

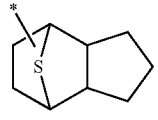  (r-hr-10)

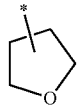  (r-hr-11)

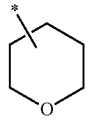  (r-hr-12)

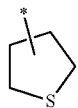  (r-hr-13)

-continued

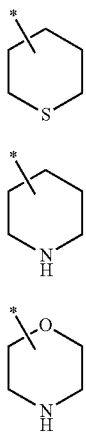

(r-hr-14)

(r-hr-15)

(r-hr-16)

As the substituent for the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

(Chain-Like Alkyl Group which May have a Substituent for $R^{101}$)

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent for $R^{101}$)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. As the combination, the linking group represented by formulas (y-a1-1) to (y-a1-7) shown below can be mentioned.

[Chemical Formula 29.]

(y-a1-1)

(y-a1-2)

(y-a1-3)

(y-a1-4)

(y-a1-5)

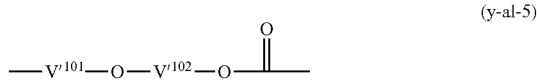

(y-a1-6)

-continued (y-al-7)

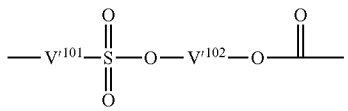

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —$CH(CH_3)$—, —$CH(CH_2CH_3)$—, —$C(CH_3)_2$—, —$C(CH_3)(CH_2CH_3)$—, —$C(CH_3)$ $(CH_2CH_2CH_3)$— and —$C(CH_2CH_3)_2$—; an ethylene group [—$CH_2CH_2$—]; an alkylethylene group, such as —CH $(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; an alkyltrimethylene group, such as —$CH(CH_3)CH_2CH_2$— and —$CH_2CH(CH_3)$ $CH_2$—; a tetramethylene group [—$CH_2CH_2CH_2CH_2$—]; an alkyltetramethylene group, such as —$CH(CH_3)$ $CH_2CH_2CH_2$—, —$CH_2CH(CH_3)CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for $Ra'^3$ in the aforementioned formula (a1-r-1), and a cyclohexylene group, 1,5-adamantylene group or 2,6-adamantylene group is preferable.

$Y^{101}$ preferably a divalent linking group containing an ether bond or an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As a specific example of the anion moiety for the component (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 30.]

(an-1)
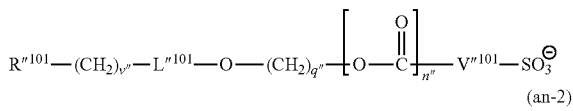

(an-2)
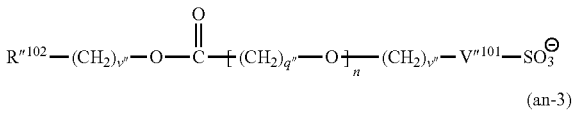

(an-3)
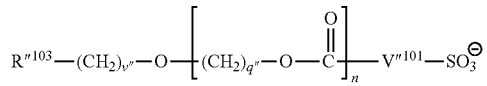

In the formulae, $R'''^{101}$ represents an aliphatic cyclic group which may have a substituent, a group represented by any one of the aforementioned formulae (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulae (a2-r-1) to (a2-r-7) or an —$SO_2$— containing cyclic group represented by any one of the aforementioned formulae (a5-r-1) to (a5-r-4); $R'''^{103}$ represents an aromatic cyclic group which may have a substituent, an aliphatic cyclic group which may have a substituent or a chain-like alkenyl group which may have a substituent; $V'''^{101}$ represents a fluorinated alkylene group; $L'''^{101}$ represents —C(=O)— or —$SO_2$—; $v''$ represents an integer of 0 to 3; $q''$ represents an integer of 1 to 20; and $n''$ represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable. $V'''^{101}$ is preferably a fluorinated alkylene group of 1 to 3 carbon atoms, and most preferably —$CF_2$—, —$CF_2CF_2$—, —$CHFCF_2$—, —$CF(CF_3)CF_2$— or —$CH(CF_3)CF_2$—.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{10}4$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —SO$_2$—.

{Cation Moiety}

In formulae (b-1), (b-2) and (b-3), $M^{'m+}$ represents an organic cation having a valency of m, preferably a sulfonium cation or an iodonium cation, and most preferably a cation represented by any one of formulae (ca-1) to (ca-4) shown below.

[Chemical Formula 31.]

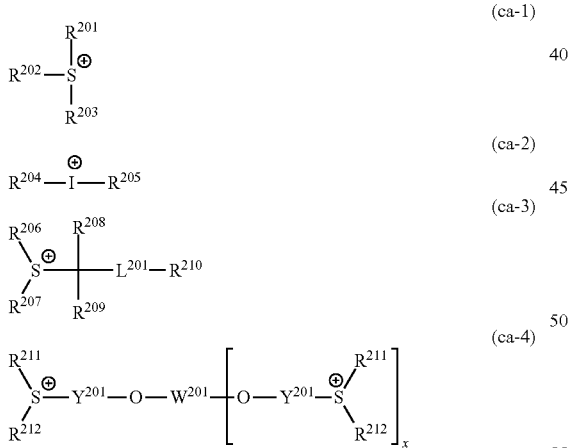

In the formulae, $R^{201}$ to $R^{207}$, $R^{211}$ and $R^{212}$ independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an —SO$_2$— containing cyclic group which may have a substituent; $L^{201}$ represents —C(=O)— or —C(=O)O—Y$^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, an arylthio group and groups represented by formulae (ca-r-1) to (ca-r-7) shown below.

The aryl group within the arylthio group as the substituent is the same as defined for $R^{101}$, and specific examples include a phenylthio group and a biphenylthio group.

[Chemical Formula 32.]

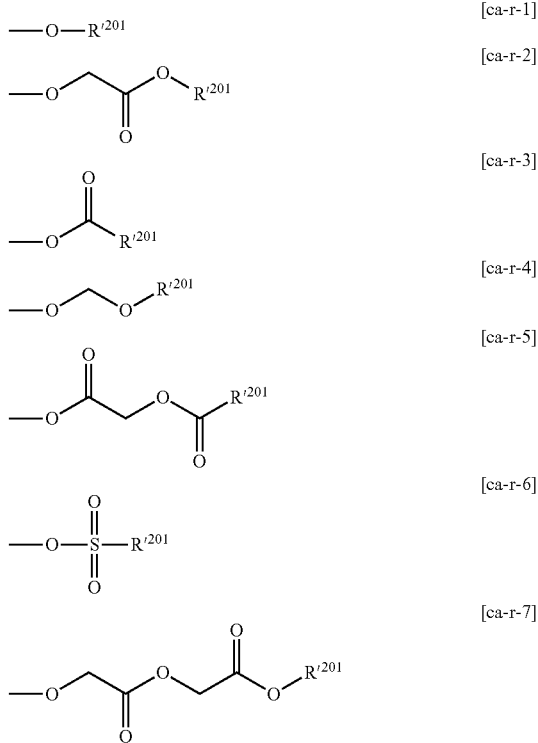

In the formulae, $R^{'201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R^{'201}$, the same groups as those described above for $R^{101}$ can be mentioned. As the cyclic group which may have a substituent and chain-like alkyl group which may have a substituent, the same groups as those described above for the acid dissociable group represented by the aforementioned formula (a1-r-2) can be also mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —SO$_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —SO$_2$— containing cyclic group for $R^{210}$ which may have a substituent, the same "—SO$_2$— containing cyclic groups" as those described above for Ra$^{21}$ in the aforementioned general formula (a2-1) can be mentioned, and the group represented by the aforementioned general formula (a5-r-1) is preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

The alkylene group and the alkenylene group for $Y^{201}$ is the same as defined for the aliphatic hydrocarbon group as the divalent linking group represented by Va$^1$ in the aforementioned general formula (a1-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups as those described above for Ya$^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-63) shown below.

[Chemical Formula 33.]

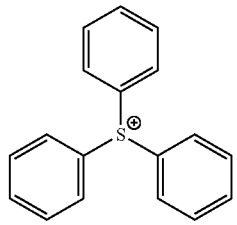

(ca-1-1)

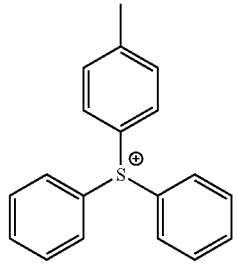

(ca-1-2)

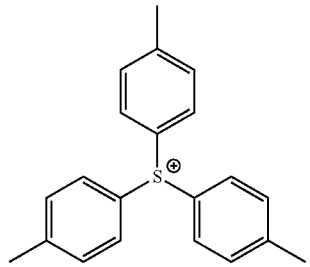

(ca-1-3)

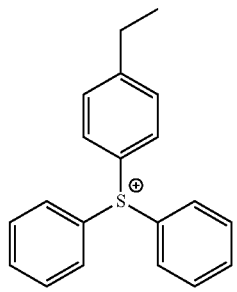

(ca-1-4)

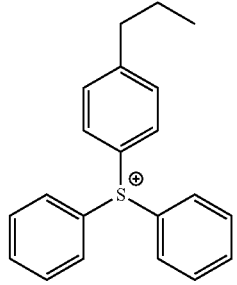

(ca-1-5)

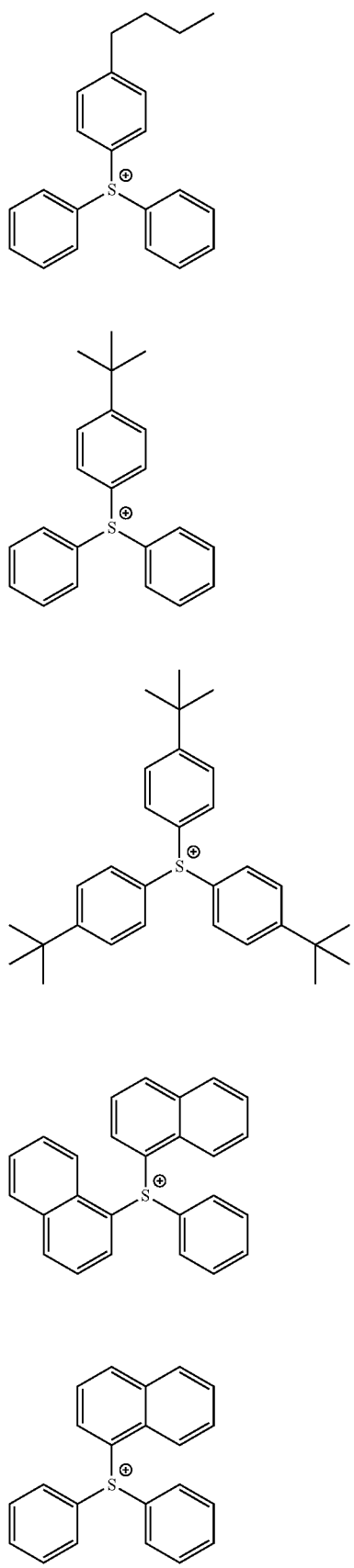
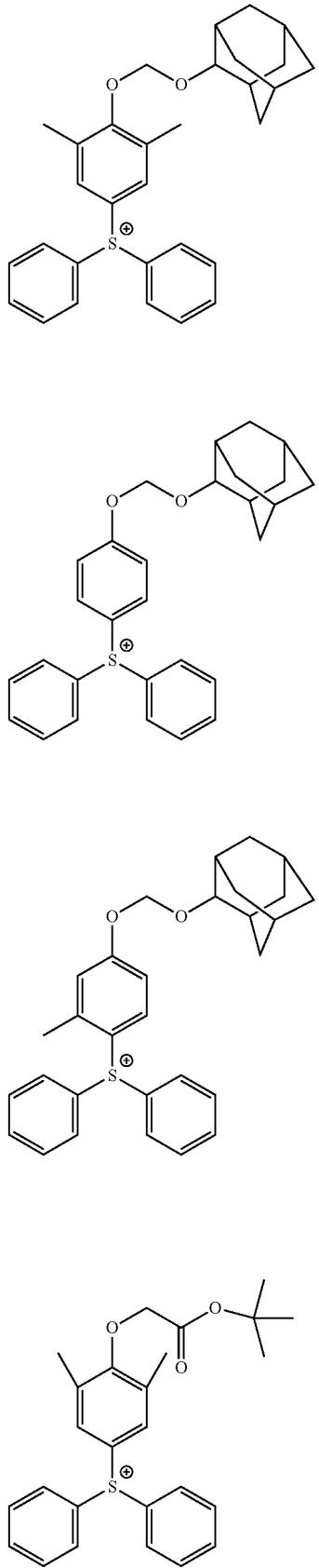

(ca-1-15)
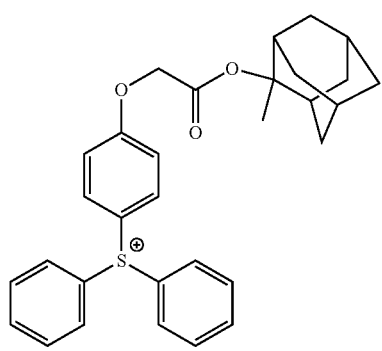
(ca-1-16)
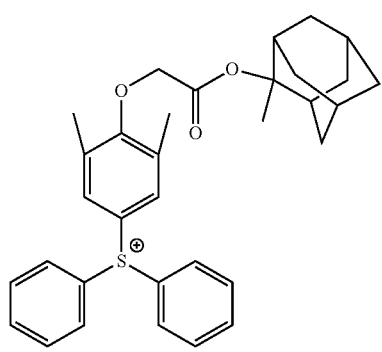
[Chemical Formula 34.]
(ca-1-17)
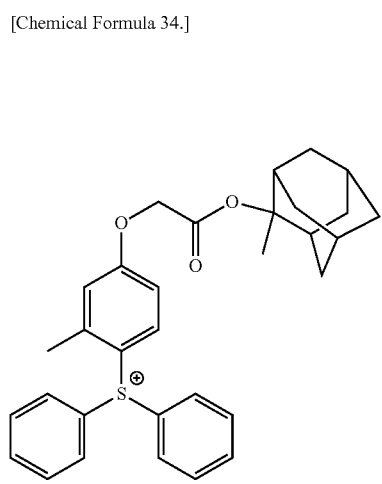
(ca-1-18)
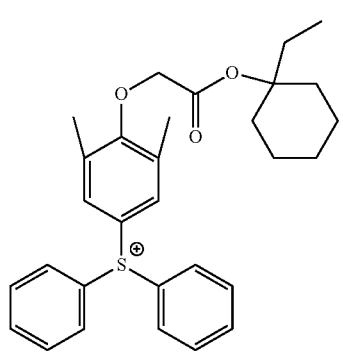
(ca-1-19)
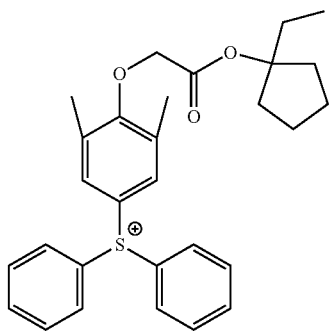
(ca-1-20)
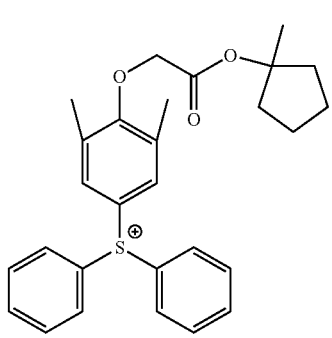
(ca-1-21)
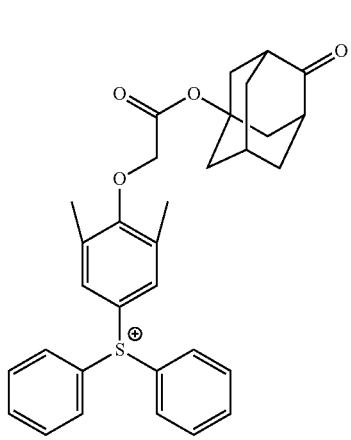
(ca-1-22)
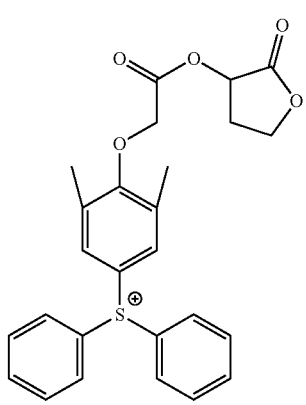

(ca-1-23)
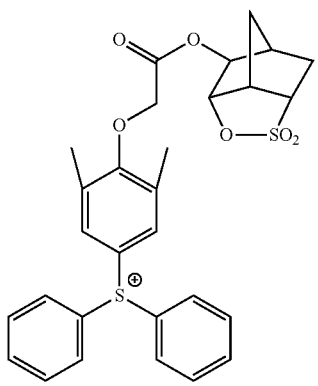
(ca-1-24)
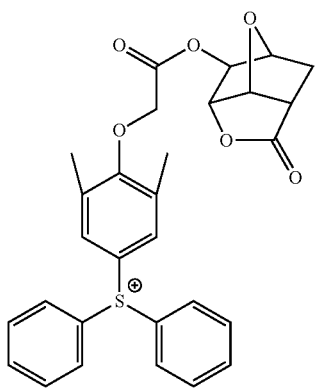
(ca-1-25)
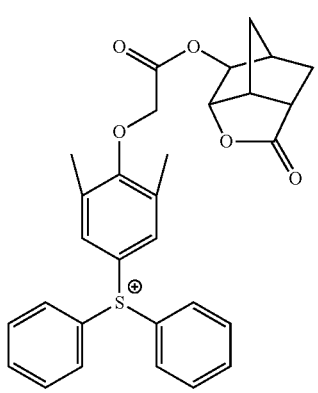
(ca-1-26)
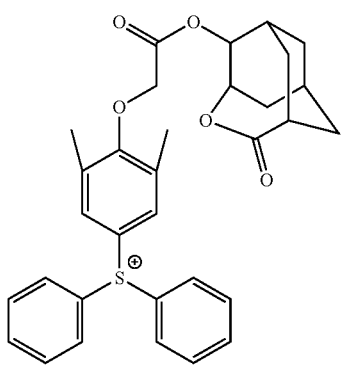
(ca-1-27)
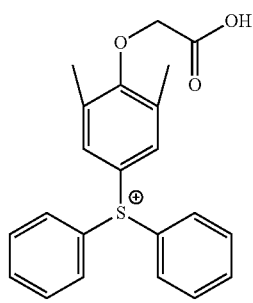
(ca-1-28)
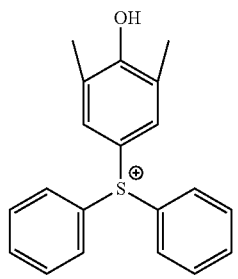
(ca-1-29)
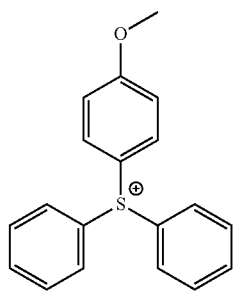
(ca-1-30)
(ca-1-31)
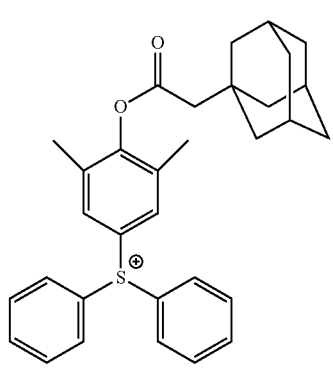

(ca-1-32) 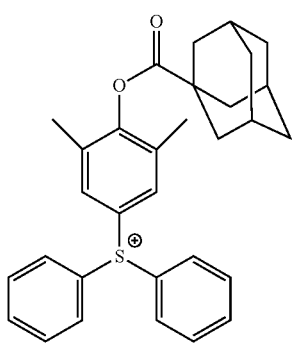
(ca-1-33) 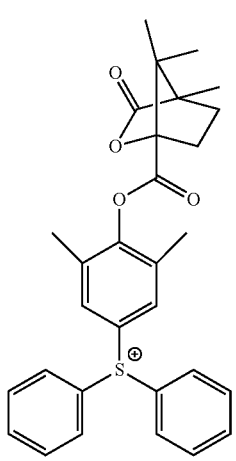
[Chemical Formula 35.]
(ca-1-34) 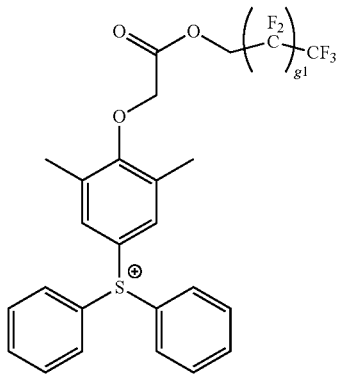
(ca-1-35) 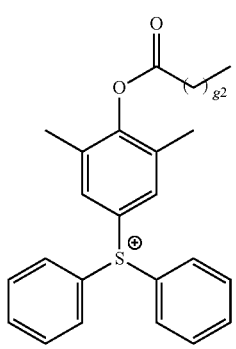
(ca-1-36) 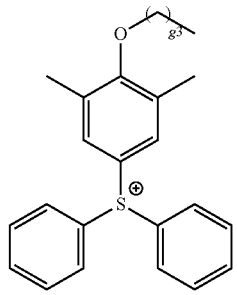
(ca-1-37) 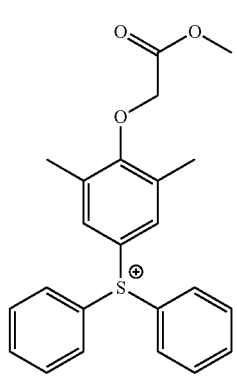
(ca-1-38) 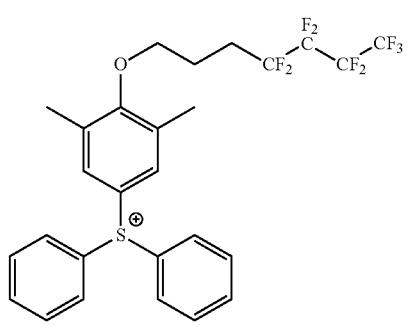
(ca-1-39) 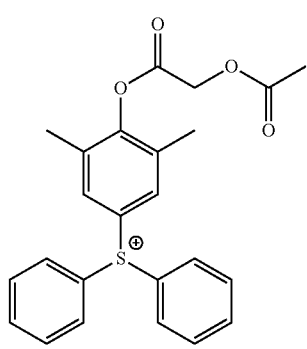

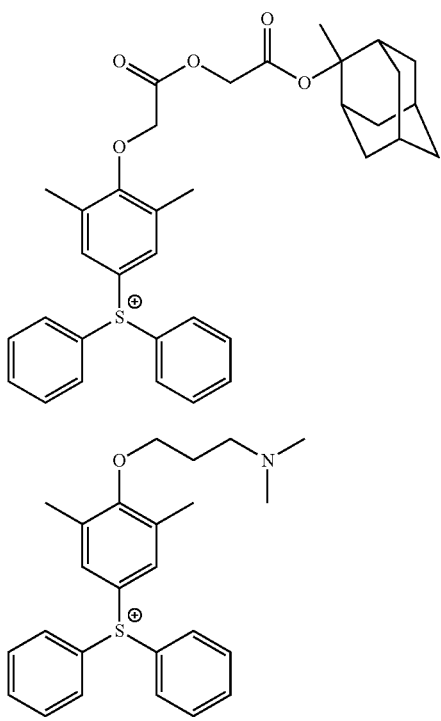
(ca-1-40)
(ca-1-41)
(ca-1-42)
(ca-1-43)
(ca-1-44)
(ca-1-45)
(ca-1-46)
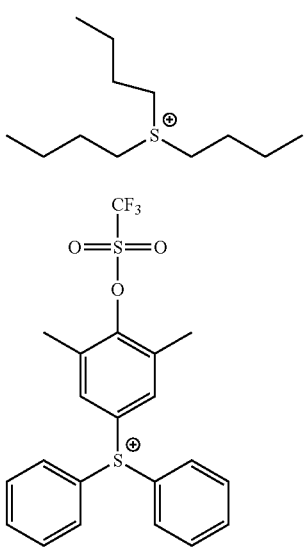
(ca-1-47)
(ca-1-48)
In the formulae, g1, g2 and g3 represent recurring numbers, wherein g1 is an integer of 1 to 5, g2 is an integer of 0 to 20, and g3 is an integer of 0 to 20.
[Chemical Formula 36.]
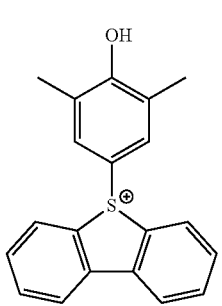
(ca-1-49)
(ca-1-50)
(ca-1-51)

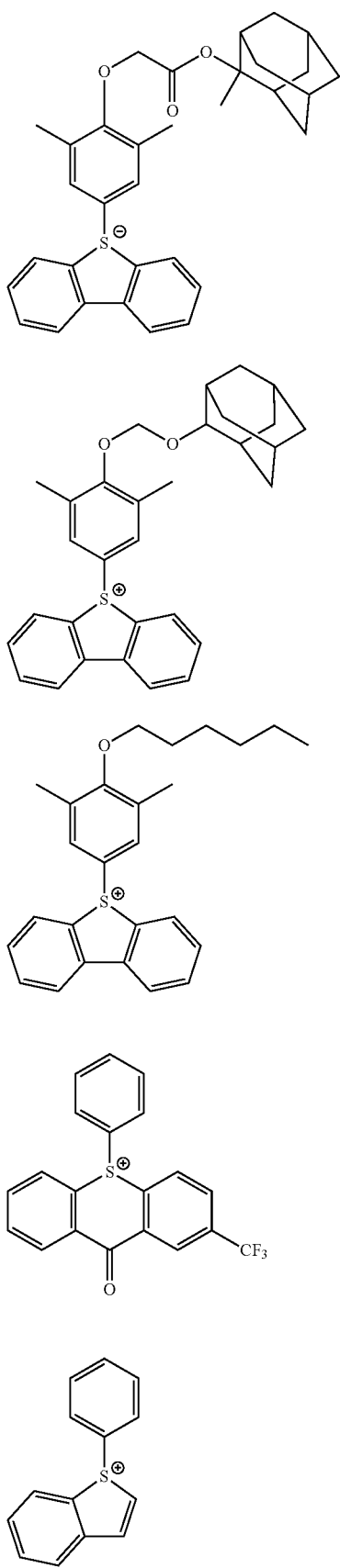
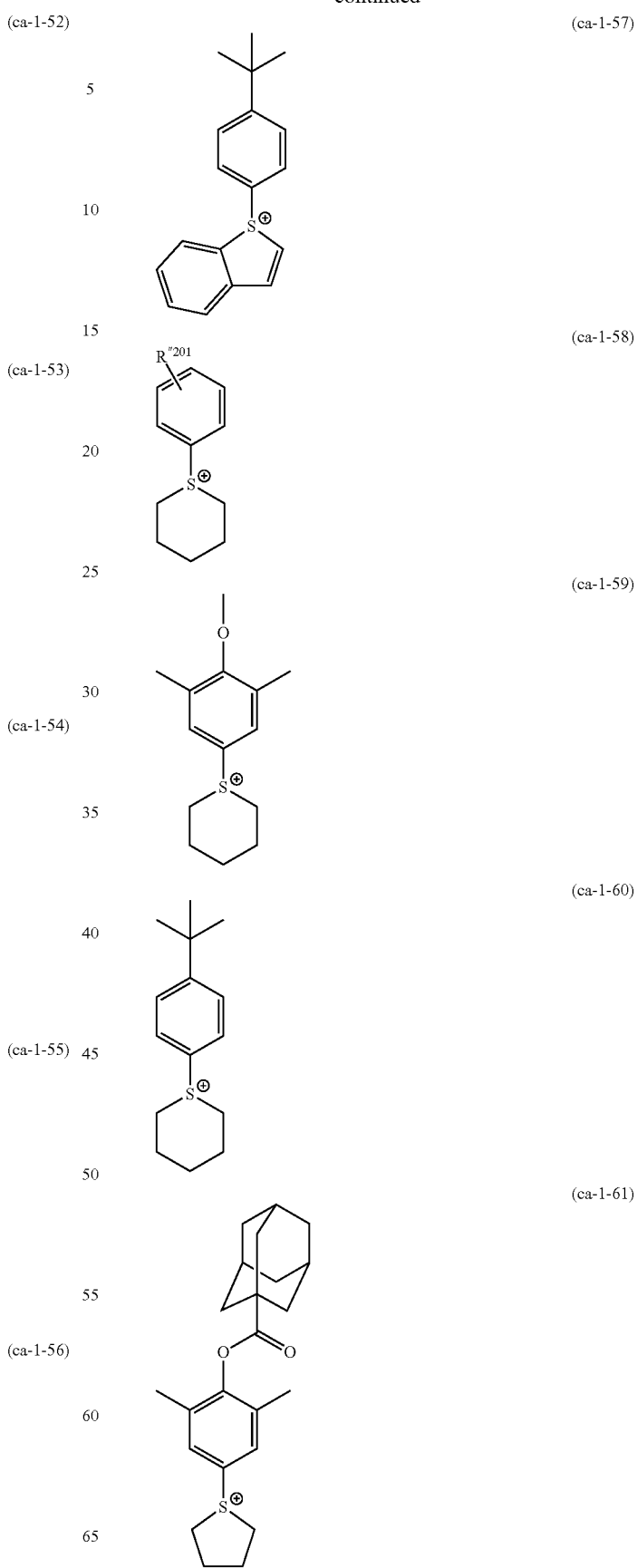

-continued (ca-1-62)

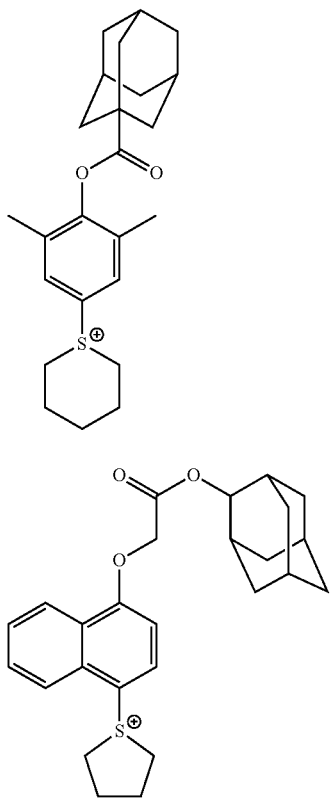

(ca-1-63)

In the formulae, R"²⁰¹ represents a hydrogen atom or a substituent, and as the substituent, the same groups as those described above for substituting R201 to R207 and R²¹⁰ to R²¹² can be mentioned.

Specific examples of preferable cations represented by formula (ca-3) include cations represented by formulae (ca-3-1) to (ca-3-6) shown below.

[Chemical Formula 37.]

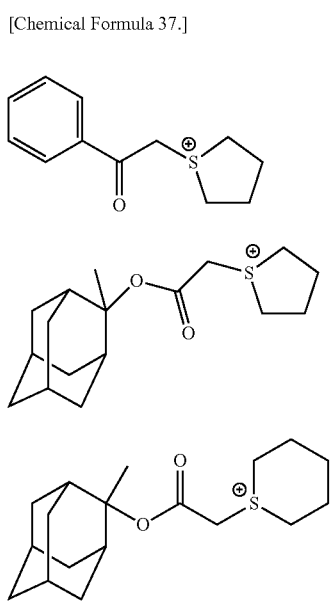

(ca-3-1)

(ca-3-2)

(ca-3-3)

-continued (ca-3-4)

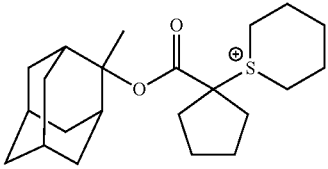

(ca-3-5)

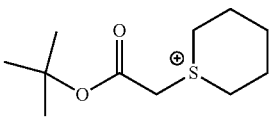

(ca-3-6)

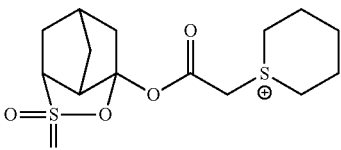

Specific examples of preferable cations represented by formula (ca-4) include cations represented by formulae (ca-4-1) and (ca-4-2) shown below.

[Chemical Formula 38.]

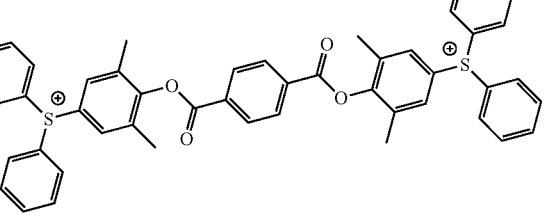

(ca-4-1)

(ca-4-2)

As the component (B), one type of these acid generators may be used alone, or two or more types may be used in combination.

In the present embodiment, when the resist composition contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Basic Compound Component; Component (D)>

The resist composition according to the present embodiment may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated from the component (B) and the like upon exposure.

In the present invention, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 39.]

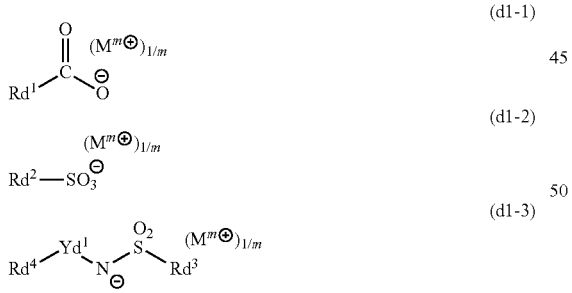

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents a cation having a valency of m.

{Component (d1-1)}

Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$.

Among these, as the group for Rd, an aromatic hydrocarbon group which may have a substituent, an aliphatic cyclic group which may have a substituent and a chain-like hydrocarbon group which may have a substituent are preferable. As the substituents which these groups may have, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a carbon atom, a hydrogen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 40.]

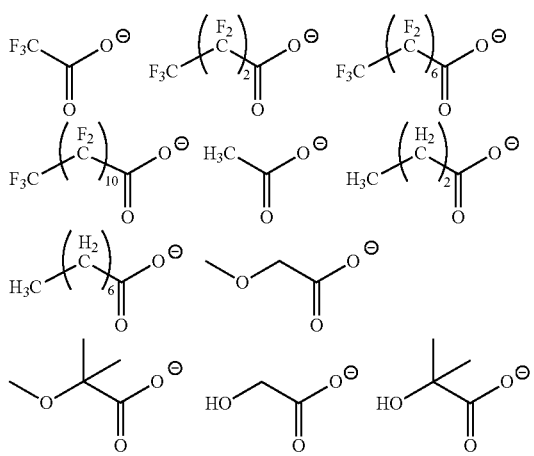

-continued

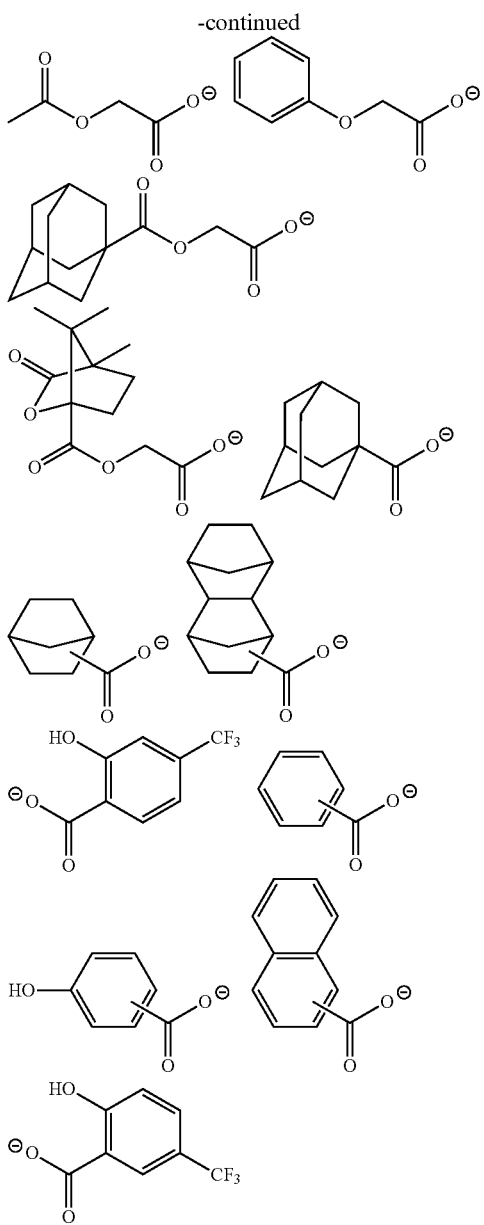

Cation Moiety

In formula (d1-1), $M^{m+}$ represents an organic cation having a valency of m.

The organic cation for $M^{m+}$ is not particularly limited, and examples thereof include the same cation moieties as those represented by the aforementioned formulas (ca-1) to (ca-4), and cation moieties represented by the aforementioned formulas (ca-1-1) to (ca-1-63) are preferable.

As the component (d1-1), one type of compound may be used, or two or more types of compounds may be used in combination.

{Component (d1-2)}

Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$, provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for Rd in the formula (d1-1) can be mentioned.

Specific examples of preferable anion moieties for the component (d1-2) are shown below.

[Chemical Formula 41.]

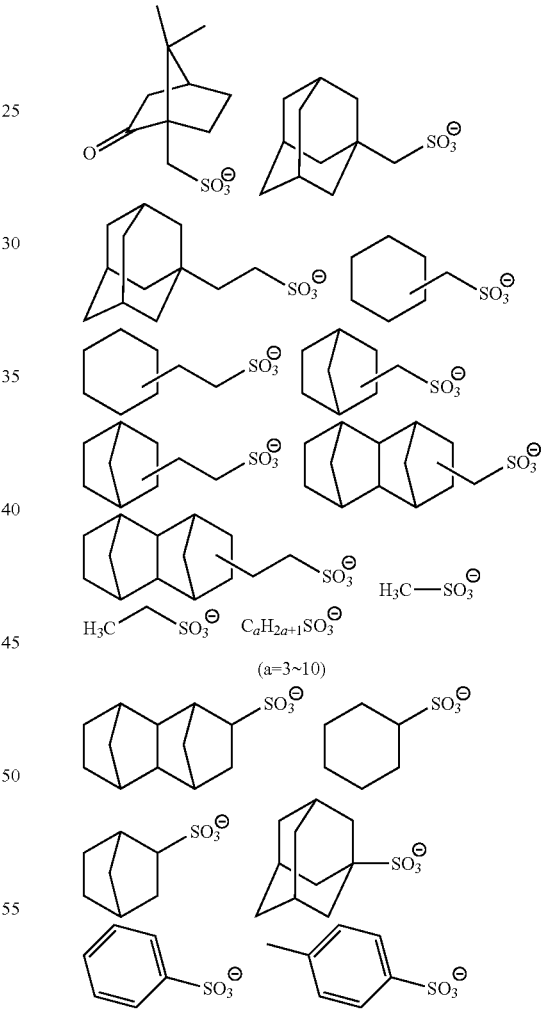

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and more preferably the same fluorinated alkyl groups as those described above for Rd.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$.

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 42.]

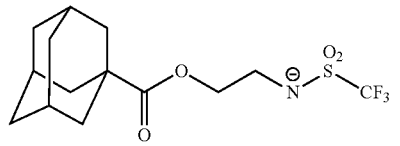
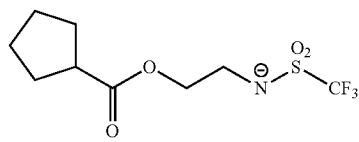
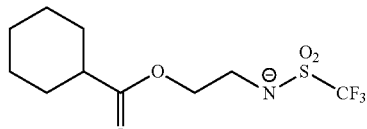
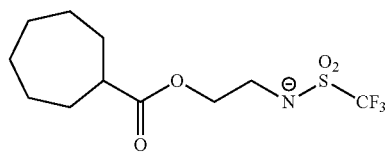
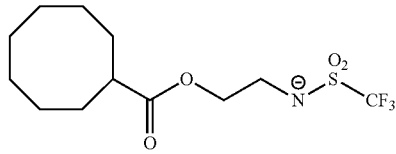
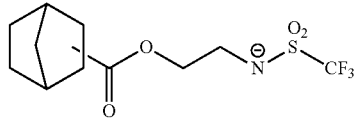
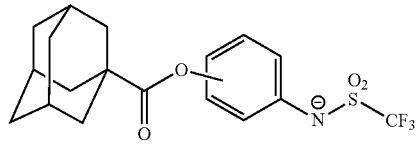
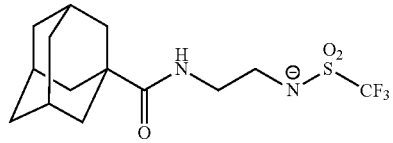
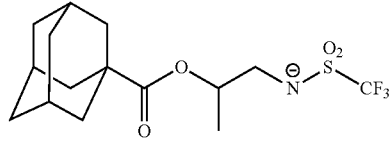
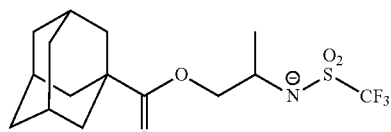

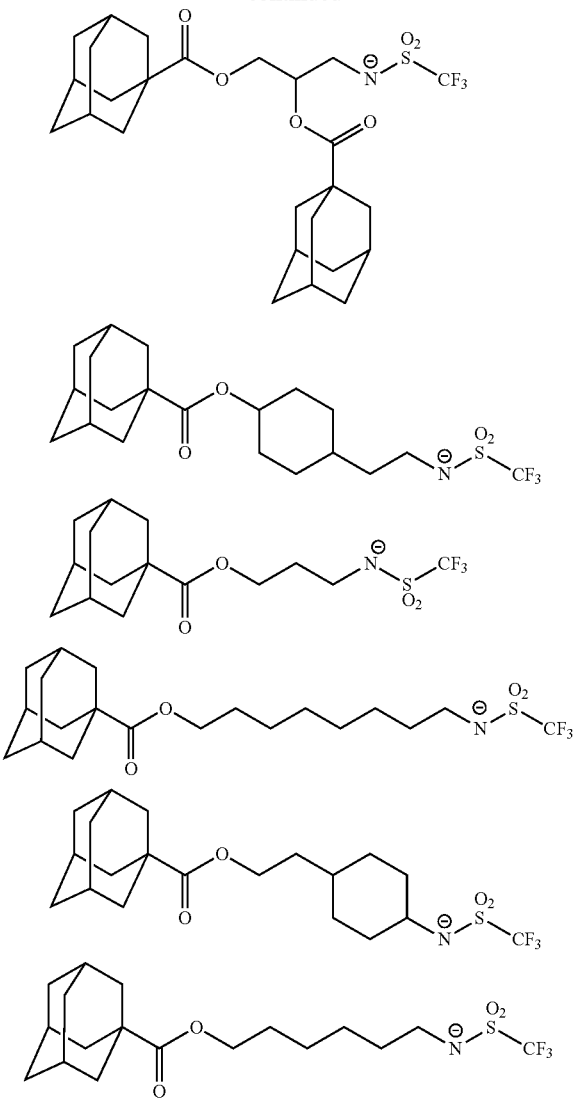

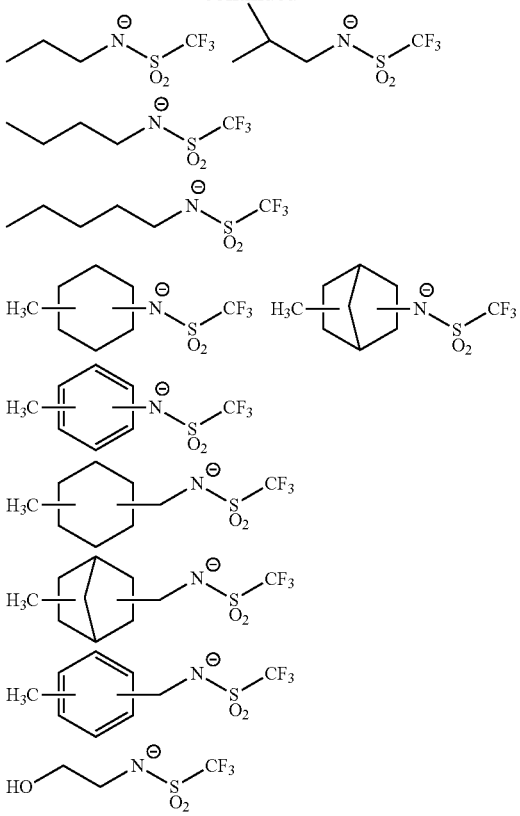

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

The amount of the component (D1) relative to 100 parts by weight of the component (A) is preferably within a range from 0.5 to 10.0 parts by weight, more preferably from 0.5 to 8.0 parts by weight, and still more preferably from 1.0 to 8.0 parts by weight. When the amount of at least as large as the lower limit of the above-mentioned range, excellent lithography properties and excellent resist pattern shape can be obtained. On the other hand, when the amount of the component (D) is no more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris[2-{2-(2-hydroxyethoxy)ethoxy}ethyl] amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

In the present embodiment, when the resist composition contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount of the component (D) is no more than the upper limit of the above-mentioned range, sensitivity can be maintained at a satisfactory level, and through-put becomes excellent.

<Optional Components>

[Component (E)]

In the present invention, in the resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

In the present invention, the resist composition of the present invention may contain a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) represented by formula (f1-1) shown below and the aforementioned structural unit (a1); and a copolymer of a structural unit (f1) represented by formula (f1-1) shown below, a structural unit derived from acrylic acid or methacrylic acid and the aforementioned structural unit (a1) are preferable. As the structural unit (a1) to be copolymerized with a structural unit (f1) represented by formula (f1-1) shown below, a structural unit derived from 1-ethyl-1-cyclooctyl (meth)acrylate or a structural unit represented by the aforementioned formula (a1-2-01) is preferable.

[Chemical Formula 44.]

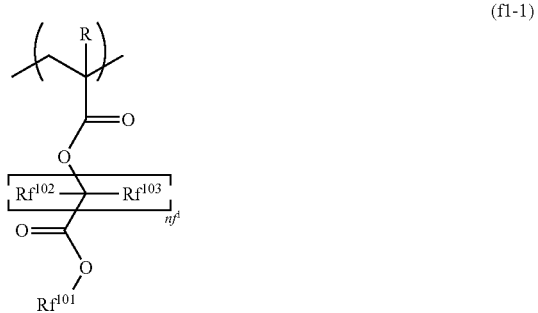

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a methyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is generally used in an amount within a range from 0.5 to 10 parts by weight, relative to 100 parts by weight of the component (A).

In the present invention, if desired, other miscible additives can also be added to the resist composition. Examples of such miscible additives include additive resins for improving the performance of the resist film, dissolution inhibitors, plasticizers, stabilizers, colorants, halation prevention agents, and dyes.

[Component (S)]

In the present invention, the resist composition can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone (2-heptanone), methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

[Step (B)]

Step B is a step in which a basic composition is applied to cover the first resist pattern formed in step A. In the present embodiment, the basic composition contains a basic component. More specifically, as shown in FIG. 1(b), a basic composition is applied to cover the first resist pattern, so as to form a basic composition layer 3.

<Basic Composition>

In the present embodiment, the basic composition contains a basic component, and the basic component contains a polymeric compound (hereafter, referred to as "polymeric compound (X)") having a structural unit (x0) represented by general formula (x0-1).

[Chemical Formula 45.]

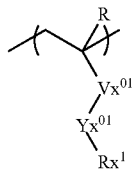

(x0-1)

In the formula, R represents a hydrogen atom, an alkyl group of 1 to 5 carbon atoms or a halogenated alkyl group of 1 to 5 carbon atoms; $Vx^{01}$ represents a divalent hydrocarbon group having an ether bond or an amide bond, a divalent aromatic hydrocarbon group, or a single bond; $Yx^{01}$ represents a single bond or a divalent linking group; and $Rx^1$ represents a substituent having a nitrogen atom.

[R]

In general formula (x0-1), R represents a hydrogen atom, an alkyl group of 1 to 5 carbon atoms or a halogenated alkyl group of 1 to 5 carbon atoms. R is the same as defined above.

[$Vx^{01}$]

In general formula (x0-1), $Vx^{01}$ represents a divalent hydrocarbon group having an ether bond or an amide bond, or a divalent aromatic hydrocarbon group.

The divalent hydrocarbon group having an ether bond or an amide bond for $Vx^{01}$ is the same as defined for the divalent hydrocarbon group having an ether bond or an amide bond for $Va^1$ in the aforementioned general formula (a1-1).

As the divalent aromatic hydrocarbon group for $Vx^{01}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

[$Yx^{01}$]

In general formula (x0-1), with respect to the single bond or divalent linking group for $Yx^{01}$, the divalent linking group for $Yx^{01}$ is the same as defined for the divalent linking group for $Ya^{21}$ in the aforementioned general formula (a2-1). Among these, as $Yx^{01}$, a linear or branched aliphatic hydrocarbon group is preferable. The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2$$CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

[$Rx^1$]

In general formula (x0-1), $Rx^1$ represents a substituent having a nitrogen atom. As the substituent having a nitrogen atom, a substituent having a conjugate acid with a high pKa is preferable. Specifically, a substituent having a nitrogen atom in which the conjugate acid has a pKa of −3 to 15 is preferable.

In the present embodiment, preferable examples of the substituent having a nitrogen atom include primary, secondary or tertiary aliphatic amines, aromatic amines and heterocyclic amines.

Examples of aliphatic amines include ethylamine, n-propylamine, sec-butylamine, tert-butylamine, hexylamine, cyclohexylamine, octylamine, dodecylamine, ethylenediamine, tetraethylenepentamine, dimethylamine, diethylamine, di-n-propylamine, diisopropylamine, di-n-butylamine, diisobutylamine, di-sec-butylamine, dipentylamine, dihexylamine, dicyclohexylamine, dioctylamine, didodecylamine, N,N-dimethylethylenediamine, N,N-dimethyltetraethylenepentamine, trimethylamine, triethylamine, tri-n-propylamine, triisopropylamine, tri-n-butylamine, triisobutylamine, tri-sec-butylamine, tripentylamine, trihexylamine, tricyclohexylamine, tri-heptylamine, trioctylamine, tridecylamines, tridodecylamine, N,N,N',N'-tetramethyldiamine, N,N,N',N'-tetramethylethylenediamine, N,N,N',N'-tetramethyltetraethylenepentamine, dimethylethylamine, methylethylpropylamine, benzylamine, phenethylamine, benzyldimethylamine, monoethanolamine, diethanolamine, triethanolamine, N-ethyl-diethanolamine, N,N-diethylethanolamine, triisopropanolamine, 2-aminoethanol, 3-amino-1-propanol, 4-amino-1-butanol, 2,2,6,6-tetramethylpiperidine, and 2,2,6,6-pentamethylpiperidine.

Examples of aromatic amines and heterocyclic amines include aniline, diphenyl(p-tolyl)amine, methyldiphenylamine, triphenylamine, phenylenediamine, naphthylamine, diaminonaphthalene, pyrrole, oxazole, thiazole, imidazole, pyrazole, furazan, pyrroline, pyrrolidine, imidazoline, imidazolidine, pyridine (preferably 2-(2-hydroxyethyl)pyridine), pyridazine, pyrimidine, pyrazine, pyrazoline, pyrazolidine, piperidine, piperazine (preferably 1-(2-hydroxyethyl)piperazine), 1-[2-(2-hydroxyethoxy)ethyl]piperazine), morpholine (preferably 4-(2-hydroxyethyl)morpholine), indole, isoindole, 1H-indazole, indoline, quinoline, isoquinoline, cinnoline, quinazoline, quinoxaline, phthalazine, purine, pteridine, carbazole, phenanthridine, acridine, phenazine, 1,10-phenanthroline, adenine, adenosine, guanine, guanosine, uracil, and uridine.

These aromatic amines and heterocyclic amines may have a substituent. Preferable examples of the substituent include a hydroxy group, an amino group, an alkyl group, an alkoxy group, an acyl group, an acyloxy group, an aryl group, an aryloxy group, a nitro group, a cyano group, an ester group, and a lactone group.

Among these examples, as $Rx^1$, a group represented by general formula (Rx-1) or (Rx-2) shown below is preferable.

[Chemical Formula 46.]

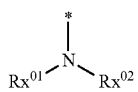

(Rx-1)

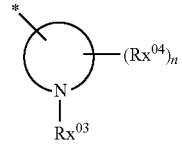

(Rx-2)

In the formula, $Rx^{01}$ to $Rx^{04}$ each independently represents a hydrogen atom, or a linear or branched alkyl group; n represents an integer of 0 to 8; and * represents a balance bond with $Yx^{01}$.

As the linear or branched alkyl group for $Rx^{01}$ to $Rx^{04}$, an alkyl group of 1 to 10 alkyl group is more preferable. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

Among these examples, a methyl group or an ethyl group is preferable.

n represents an integer of 0 to 8, and preferably 2 or 4.

Specific examples of the group represented by general formula (Rx-1) are shown below. In the specific examples, * represents a valence bond.

[Chemical Formula 47.]

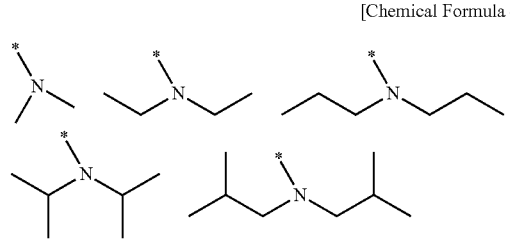

General formula (Rx-2) shows a cyclic amine. As the group represented by general formula (Rx-2), a group represented by general formula (Rx-2-1) shown below is preferable. As the group represented by general formula (Rx-2-1), a group represented by general formula (Rx-2-1-1) is most preferable.

[Chemical Formula 48.]

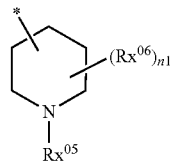

(Rx-2-1)

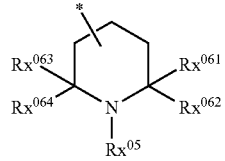

(Rx-2-1-1)

In formulae $Rx^{05}$, $Rx^{06}$, $Rx^{061}$ to $Rx^{064}$ each independently represents a hydrogen atom, or a linear or branched alkyl group; n1 represents an integer of 0 to 8; and * represents a valence bond with $Yx^{01}$.

The linear or branched alkyl group for $Rx^{05}$, $Rx^{06}$, $Rx^{061}$ to $Rx^{064}$ is the same as defined for $Rx^{01}$ to $Rx^{04}$. n1 represents an integer of 0 to 8.

Specific examples of the group represented by general formula (Rx-2) are shown below. In the specific examples, * represents a valence bond.

[Chemical Formula 49.]

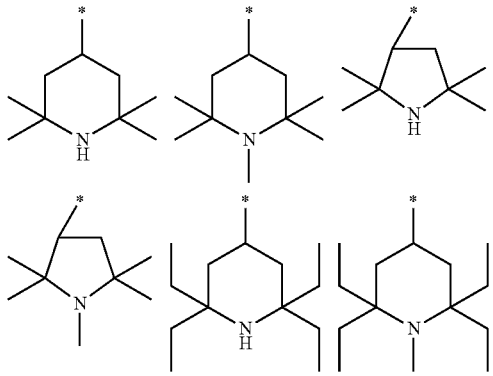

As the structural unit represented by general formula (x0-1), a structural unit represented by any one of general formulae (x0-1-1) to (x0-1-3) shown below is preferable.

[Chemical Formula 50.]

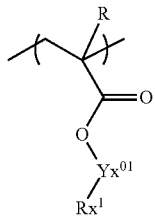 (x0-1-1)

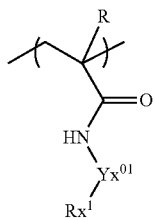 (x0-1-2)

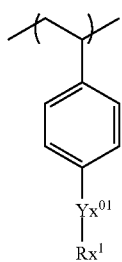 (x0-1-3)

In the formula, R represents a hydrogen atom, an alkyl group of 1 to 5 carbon atoms or a halogenated alkyl group of 1 to 5 carbon atoms; $Yx^{01}$ represents a single bond or a divalent linking group; and Rx' represents a substituent having a nitrogen atom.

In general formulae (x0-1-1) to (x0-1-3), R, $Yx^{01}$ and $Rx^1$ are the same as defined above.

Specific examples of structural unit represented by general formula (x0-1) are shown below. In the specific examples, R is the same as defined above.

[Chemical Formula 51.]

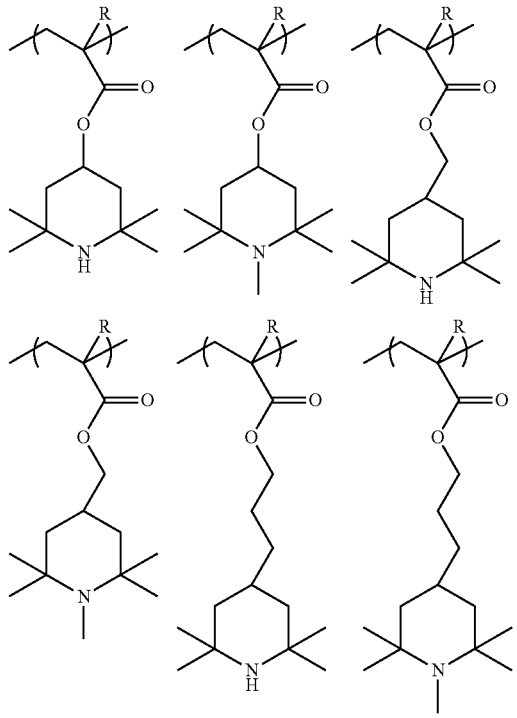

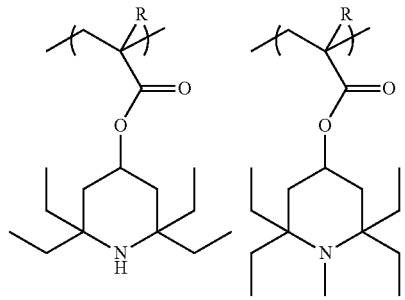

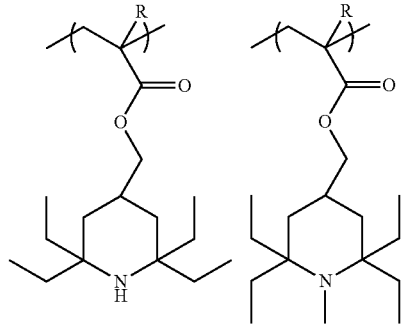

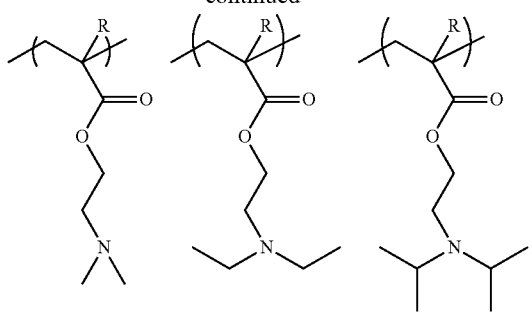
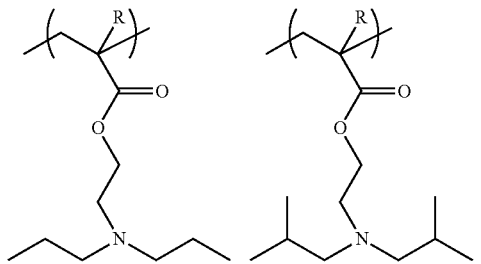

[Chemical Formula 52.]

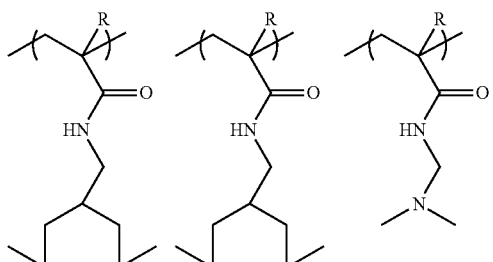

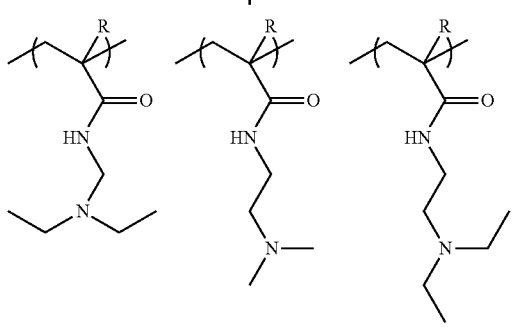

[Chemical Formula 53.]

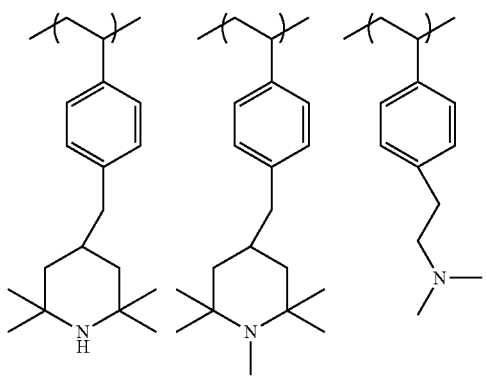

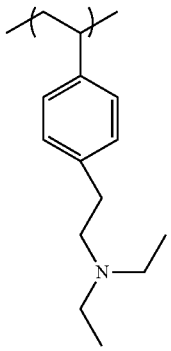

In the basic component, the amount of the structural unit (x0) based on the combined total of all structural units constituting the basic component is preferably 1 to 80 mol %, more preferably 1 to 75 mol %, and still more preferably 1 to 70 mol %.

In the present invention, the basic composition may have one kind of structural unit (x0). Alternatively, a polymeric compound having the structural unit (x0) and another structural unit may be used. Preferably examples of other structural units include a structural unit (a2) containing a lactone-containing cyclic group, or a structural unit (a4) containing an acid non-dissociable cyclic group.

In the present invention, a copolymer containing the structural unit (x0) and the structural unit (a4) containing an acid non-dissociable cyclic group; a copolymer containing the structural unit (x0) and the structural unit (a2) containing a lactone-containing cyclic group; a copolymer containing the structural unit (x0), the structural unit (a2) and the structural unit (a4); or a copolymer containing the structural unit (x0), the structural unit (a2), the structural unit (a3) and the structural unit (a4) is preferable.

Alternatively, in the present invention, a copolymer having the structural unit (x0) and a structural unit (st) (hereafter, referred to as "structural unit (st)") derived from styrene or hydroxystyrene may be used.

By using the structural unit (st), it is presumed that a pattern can be thickened more efficiently.

The term "hydroxystyrene" includes hydroxystyrene and compounds in which the hydrogen atom bonded to the carbon atom on the α-position of hydroxystyrene is substituted with another substituent such as a halogen atom, an alkyl group or a halogenated alkyl group; and derivatives thereof (preferably compounds having the aforementioned substituent bonded to the benzene ring). The number of hydroxy groups bonded to the benzene ring of hydroxystyrene is preferably 1 to 3, and most preferably 1. Here, the α-position (carbon atom on the α-position) of hydroxystyrene refers to the carbon atom having the benzene ring bonded thereto, unless specified otherwise.

A "structural unit derived from hydroxystyrene" refers to a structural unit that is formed by the cleavage of the ethylenic double bond of hydroxystyrene.

Examples of the structural unit (st) include a structural unit (st1) represented by general formula (I) shown below or a structural unit (st2) represented by general formula (II) shown below.

[Chemical Formula 54.]

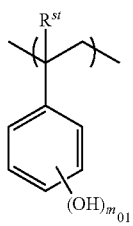
(I)

In the formula, $R^{st}$ represents a hydrogen atom or a methyl group; and $m_{01}$ represents an integer of 1 to 3.

[Chemical Formula 55.]

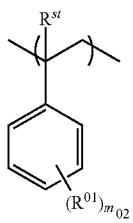
(II)

In the formula, $R^{st}$ represents a hydrogen atom or a methyl group; $R^{01}$ represents an alkyl group of 1 to 5 carbon atoms; and $m_{02}$ represents 0 or an integer of 1 to 3.

In the structural unit (st1) represented by general formula (I), $R^{st}$ represents a hydrogen atom or a methyl group, and is preferably a hydrogen atom.

$m_{01}$ represents an integer of 1 to 3. Among these, $m_{01}$ is preferably 1.

The bonding position of the hydroxy group may be any of o-position, m-position or p-position, but in terms of availability and low cost, m is preferably 1, and the hydroxy group is bonded to the p-position. In the case where $m_{01}$ is 2 or 3, a desired combination of the bonding positions can be used.

In the structural unit (st2) represented by general formula (II), $R^{st}$ represents a hydrogen atom or a methyl group, and is preferably a hydrogen atom.

$R^{01}$ represents a linear or branched alkyl group of 1 to 5 carbon atoms, and examples thereof include a methyl group, an ethyl group, a propyl group, an isopropyl group, an n-butyl group, an isobutyl group, a tert-butyl group, a pentyl group, an isopentyl group, and a neopentyl group. A methyl group or an ethyl group is industrially preferable.

$m_{02}$ represents 0 or an integer of 1 to 3. Among these, $m_{02}$ is preferably 0 or 1, and most preferably 0 from industrial viewpoint.

In the case where $m_{02}$ is 1, the bonding position of R1 may be any of o-position, m-position or p-position. Alternatively, in the case where $m_{02}$ is 2 or 3, a desired combination of the bonding positions can be used.

In the present invention, the amount of the structural units (a2) to (a4) and (st) within the basic component, based on the combined total of all structural units constituting the basic component is preferably 10 to 99 mol %, more preferably 20 to 99 mol %, and still more preferably 25 to 99 mol %.

The polymeric compound (X) can be obtained, for example, by a conventional radical polymerization or the like of the monomers corresponding with each of the structural units, using a radical polymerization initiator such as azobisisobutyronitrile (AIBN) or dimethyl 2,2'-azobis (isobutyrate).

In the present invention, the weight average molecular weight (Mw) (the polystyrene equivalent value determined by gel permeation chromatography) of the polymeric compound (X) is not particularly limited, but is preferably 1,000 to 1,000,000, more preferably 1,500 to 500,000, and most preferably 2,000 to 300,000.

It is presumed that, when the weight average molecular weight of the polymeric compound (X) is within the above-mentioned range, the pattern can be favorably thickened.

As the polymeric compound (X), one kind of compound may be used alone, or two or more kinds of compounds may be used in combination.

The polymeric compound (X) may contain a neutralization group on at least one terminal of the main chain thereof The neutralization group may be contained in at least one terminal of the main chain, or contained in both terminals of the main chain.

In the present invention, a "neutralization group" refers to a group which neutralizes a carboxylic acid, a hydroxy group, a lactone, an acid anhydride, an ester or the like (hereafter, referred to as "carboxylic acid and the like") on the surface of the first resist pattern, and is capable of forming a developing-solution insoluble region which is insoluble in a developing solution used in the developing step described later.

Specific examples of the neutralization group include those which contain a nitrogen atom, and is preferably an amino group or a group containing a structure represented by any one of formulae (x-1) to (x-4) shown below.

[Chemical Formula 56.]

(x-1)

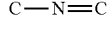
(x-2)

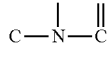
(x-3)

(x-4)

Among the specific structures contained in the polymer used in the present invention, the structure represented by formula (x-1) has 3 carbon atoms bonded to the nitrogen atom via single bonds. In general, tertiary amines can be mentioned as those containing such structure. Further, in the structure represented by formula (x-1), the carbon atoms bonded to the nitrogen atom may be mutually bonded via a hydrocarbon chain to form a ring structure. The ring structure may contain an unsaturated bond between the atoms constituting the ring. Alternatively, the ring structure may have a carbon atom constituting the ring replaced by an oxygen atom or another nitrogen atom to form a hetero ring. Such structure is contained in a polymer obtained by polymerizing N,N-dimethylvinylamine, N,N-dimethylallylamine, N-vinylpyrrolidone and/or N-vinylcaprolactam.

The structure represented by formula (x-2) has one carbon atom bonded to the nitrogen atom via a single bond and the other carbon atom bonded to the nitrogen atom via a double bond. Such structure may be present within a chain carbon atom, or contained in a hetero ring. The hetero ring may contain an unsaturated bond other than the unsaturated bond contained in (x-2). Examples of hetero rings containing such structure include an imidazole ring, an oxazole ring, a pyridine ring and a bipyridine ring. Among these examples, a hetero ring containing an imidazole ring or an oxazole ring is preferable, and a hetero ring containing an imidazole ring is most preferable in terms of coatability and pattern shrinking effect.

In the present invention, for example, it is preferable that the structure of at least one terminal of the main chain of the polymeric compound (X) is represented by general formula (X0)-1.

[Chemical Formula 57.]

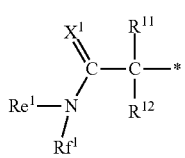

(X0)-1

In general formula (X0)-1, $R^{11}$ to $R^{12}$ each independently represents an alkyl group; $X^1$ represents =O or =N—Ri; $Re^1$, $Rf^1$ and Ri each independently represents a hydrogen atom or an alkyl group; $Re^1$ and $Rf^1$ may be mutually bonded to form a ring; and * represents a valence bond with the main chain of the polymeric compound (X).

The alkyl group for $R^{11}$, $R^{12}$, $Re^1$ and $Rf^1$ may have a substituent. As the substituent, an arbitrary substituent selected from the aforementioned substituent group a can be mentioned. Among these examples, a hydroxy group or a carboxy group is preferable.

The alkyl group for $R^{11}$ and $R^{12}$ preferably has 1 to 8 carbon atoms, more preferably 1 to 4 carbon atoms, and a methyl group is most preferable.

As $Re^1$, $Rf^1$ and Ri, a hydrogen atom or an alkyl group of 1 to 8 carbon atoms is preferable.

The ring formed by $Re^1$ and $Rf^1$ being mutually bonded is preferably 5- or 6-membered.

As the ring formed by $Re^1$ and $Rf^1$ mutually bonded, an imidazoline ring, a pyrrolidine ring, a piperidine ring, a piperazine ring, a morpholine ring or a thiomorpholine ring is preferable.

$X^1$ is preferably =N—Ri.

Specific examples of the terminal structure represented by general formula (X0)-1 are shown below.

[Chemical Formula 58.]

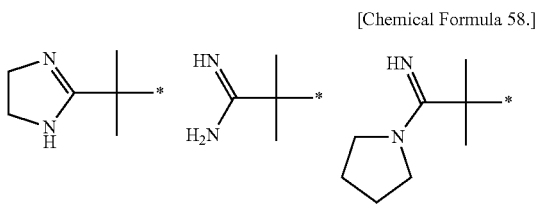

In the present invention, by employing a basic composition containing a polymeric compound (X) having a neutralization group on at least one terminal of the main chain thereof, in the case where a first resist pattern is thickened (shrunk), the amount of pattern shrunk can be increased, as compared to the case where a polymeric compound having a neutralization group on a side chain thereof is employed.

The reason is presumed as follows. In the case where a polymeric compound having a neutralization group on a terminal of a side chain thereof is employed, it is presumed that the neutralization group on the terminal of the side chain thereof reacts on the surface of the first resist pattern, such that the polymeric compound is shrunk and bonded to the surface of the first resist pattern.

In contrast, in the case where a polymeric compound (X) having a neutralization group on a terminal of the main chain thereof is employed, it is presumed that the neutralization group on the terminal of the main chain thereof reacts on the surface of the first resist pattern, such that the polymeric compound is bonded to the surface of the first resist pattern without shrinking of the polymeric compound, and hence, the amount of the pattern shrunk can be increased.

Further, in the case where the polymeric compound (X) has a neutralization group on at least one terminal of the main chain thereof, even when monomers which do not include the aforementioned specific structural unit is used in combination without impairing the scope of the present invention, the thus produced copolymer may be used for the composition for forming a fine pattern according to the present invention. For example, a copolymer containing, as copolymerization units, polyacrylic acid, polymethacrylic acid and/or polyvinylalcohol can be mentioned.

Further, a monomer containing a primary amine structure or a secondary amine structure may be used as a polymerization unit, without impairing the scope of the present invention. In the case where a monomer containing a primary amine structure or a secondary amine structure is used as a polymerization unit, the repeating unit containing a primary amine structure or a secondary amine structure is preferably 40 mol % or less, more preferably 30 mol % or less of the polymerization units constituting the polymer.

In the present invention, in the case where the polymeric compound (X) has a neutralization group, it is preferable that the polymeric compound (X) is polymerized by using an initiator having an amino group or a group containing a structure represented by any one of the aforementioned formulae (x-1) to (x-4). More specifically, it is preferable to use an initiator represented by general formula (I)-1 shown below.

By virtue of employing the initiator represented by general formula (I)-1 shown below, it becomes possible to introduce a neutralization group to at least one terminal of the main chain of the polymeric compound (X).

[Chemical Formula 59.]

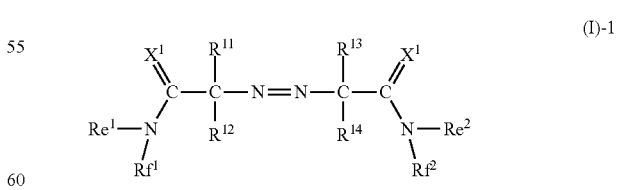

(I)-1

In general formula (I)-1, $R^{11}$ to $R^{14}$ each independently represents an alkyl group; each $X^1$ independently represents =O or =N—Ri; $Re^1$, $Re^2$, $Rf^1$, Re and Ri each independently represents a hydrogen atom or an alkyl group; $Re^1$ and $Rf^1$, $Re^2$ and $Rf^2$, $Re^1$ and Ri, $Re^2$ and Ri may be mutually bonded to form a ring.

In general formula (I)-1,

The alkyl group for $R^{11}$ to $R^{14}$, $Re^1$, $Re^2$, $Rf^1$ and $Rf^2$ may have a substituent. As the substituent, an arbitrary substituent selected from the aforementioned substituent group a can be mentioned. Among these examples, a hydroxy group or a carboxy group is preferable.

The alkyl group for $R^{11}$ and $R^{14}$ preferably has 1 to 8 carbon atoms, more preferably 1 to 4 carbon atoms, and a methyl group is most preferable.

As $Re^1$, $Re^2$, $Rf^1$, $Rf^2$ and Ri, a hydrogen atom or an alkyl group of 1 to 8 carbon atoms is preferable.

The ring formed by $Re^1$ and $Rf^1$, $Re^2$ and $Rf^2$, $Re^1$ and Ri, $Re^2$ and Ri being mutually bonded is preferably 5- or 6-membered.

As the ring formed by $Re^1$ and $Rf^1$, $Re^2$ and $Rf^2$, $Re^1$ and Ri, $Re^2$ and Ri mutually bonded, an imidazoline ring, a pyrrolidine ring, a piperidine ring, a piperazine ring, a morpholine ring or a thiomorpholine ring is preferable.

$X^1$ is preferably =N—Ri.

Specific examples of the initiator represented by general formula (I)-1 are shown below.

[Chemical Formula 60.]

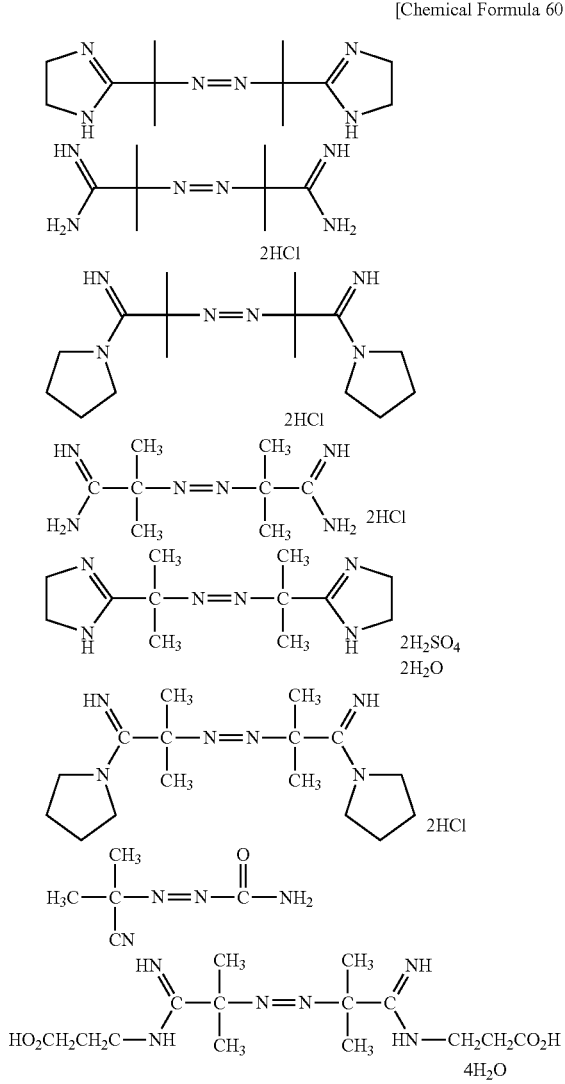

In the case where the polymeric compound (X) has a neutralization group on at least one terminal of the main chain thereof, the dispersity (Mw/Mn) of the polymeric compound (X) is preferably 1.0 to 5.0, more preferably 1.0 to 3.0, and most preferably 1.2 to 1.5.

In the present invention, the polymeric compound (X) contained in the shrink agent composition has a glass transition temperature (hereafter, referred to as "Tg") is preferably 100° C. or higher. A polymeric compound having a high Tg has a structural unit having a structure with low degree of freedom, and hence, such polymeric compound is rigid. Therefore, the polymeric compound (X) contained in the shrink agent composition reacts with the surface of the first resist pattern without the molecular chain thereof getting tangled, thereby contributing to increase in the amount of the pattern shrunk.

Further, in a heating step after forming a shrink agent composition layer, a polymeric compound having a high Tg can suppress the shrink agent composition layer from flowing. As a result, the pattern shape of the first resist pattern can be reliably shrunk.

In the present invention, the glass transition temperature of the polymeric compound (X) is preferably 105° C. or higher, and more preferably 110° C. or higher.

Further, the upper limit of the glass transition temperature of the polymeric compound (X) is not particularly limited, but is preferably 200° C. or lower, more preferably 180° C. or lower, and most preferably 160° C. or lower.

The glass transition temperature of the polymeric compound (X) can be appropriately adjusted depending on the kind of the structural units to be copolymerized.

In the present invention, in the case where the Tg of the polymeric compound (X) is 100° C. or higher, the polymeric compound (X) may have just the structural unit (x0). Alternatively, a polymeric compound having the structural unit (x0) and another structural unit may be used.

As the other structural unit, a structural unit having a cyclic group is preferable. As the structural unit having a cyclic group, the aforementioned structural unit (st) is preferable.

Further, in the case where the Tg of the polymeric compound (X) is 100° C. or higher, the polymeric compound (X) preferably includes a structural unit (x3) having an alicyclic group.

As the structural unit (x3), for example, among the aforementioned structural unit (a2), a structural unit containing a lactone-containing cyclic group, or a structural unit (a4) containing an acid non-dissociable cyclic group may be given as preferable examples.

In the present invention, the dispersity (weight average molecular weight/number average molecular weight) of the polymeric compound (X) is preferably 1.5 or less, more preferably 1.49 or less, and still more preferably 1.48 or less.

In the case where the dispersity of the polymeric compound (X) is within the above-mentioned range (in other words, when the polymeric compound (X) has a narrow dispersity), when the polymeric compound (X) is used in the shrink agent composition, it is presumed that the variation of the molecular weight becomes small, and hence, gaps are less likely to be formed between thickened portions during thickening of a pattern, thereby reliably thickening the pattern.

In the present invention, in order to obtain a polymeric compound (X) with a narrow dispersity, a commercially available product may be used. Alternatively, the polymeric compound may be purified to obtain a narrow dispersity, or the polymeric compound (X) may be synthesized by using a living radical polymerization initiator. In the present invention, it is preferable to obtain a narrow dispersity by purification.

[Obtaining Narrow Dispersity by Purification]

In the case of obtaining a narrow dispersity by purification, for example, a purification method by solvent fractionation may be used.

In the present invention, in the case of obtaining a narrow dispersity by purification, low molecular weight compounds may be removed, or polymeric compounds may be removed. In terms of increasing the amount of portions of the pattern thickened, it is preferable to remove low molecular weight compounds.

As the purification by solvent fractionation, any conventional method may be used, such as a liquid-liquid extraction method in which remaining monomers and oligomer components are removed by washing with water or using an appropriate combination of solvents; a purification method conducted in a liquid state, such as ultrafiltration in which materials having a specific molecular weight or lower are extracted and removed; a reprecipitation method in which the resin solution is dropwise added to a poor solvent to solidify the resin in the poor solvent, thereby removing the remaining monomers; and a purification method conducted in a solid state, such as a method in which a filters resin slurry is washed with a poor solvent.

For example, after finishing radical polymerization reaction, the resin is brought into contact with a solvent in which the acid decomposable resin is hardly soluble or insoluble (poor solvent) in an amount of less than 5 times the volume amount of the reaction liquid, preferably 4.5 to 0.5 times the volume amount of the reaction liquid, more preferably 3 to 0.5 times the volume amount of the reaction liquid, and still more preferably 1 to 0.5 times the volume amount of the reaction liquid, so as to precipitate the resin in the form of solid.

The solvent (precipitation solvent or reprecipitation solvent) usable for precipitation or reprecipitation from the polymer solution may be a poor solvent for the polymer, and depending on the kind of the polymer, examples thereof include hydrocarbons (e.g., aliphatic hydrocarbons such as pentane, hexane, heptane and octane; alicyclic hydrocarbons such as cyclohexane and methylcyclohexane; aromatic hydrocarbons such as benzene, toluene and xylene), halogenated hydrocarbons (e.g., halogenated aliphatic hydrocarbons such as methylene chloride, chloroform and tetrachloromethane; and halogenated aromatic hydrocarbons such as chlorobenzene and dichlorobenzene), nitro compounds (e.g., nitromethane and nitroethane), nitriles (e.g., acetonitrile and benzonitrile), ethers (e.g., chain-like ethers such as diethyl ether, diisopropylether and dimethoxyethane; cyclic ethers, such as tetrahydrofuran and dioxane), ketones (e.g., acetone, methyl ethyl ketone and diisobutyl ketone), esters (e.g., ethyl acetate and butyl acetate), carbonates (e.g., dimethyl carbonate, diethyl carbonate, ethylene carbonate and propylene carbonate), alcohols (e.g., methanol, ethanol, propanol, isopropyl alcohol and butanol), carboxylic acids (e.g., acetic acid). The solvent can be appropriately selected from mixed solvents containing the above-described solvents. Among these examples, as the precipitation solvent or the reprecipitation solvent, a solvent containing at least a hydrocarbon (in particular, an aliphatic hydrocarbon such as hexane) is preferable. In the solvent containing at least a hydrocarbon, the ratio of hydrocarbon (e.g., aliphatic hydrocarbon such as hexane) to the other solvent (e.g., an ester such as ethyl acetate, an alcohol such as methanol or ethanol, or the like) is 10/90 to 99/1 (volume ratio; 25° C.), preferably 30/70 to 98/2 (volume ratio; 25° C.), and more preferably 50/50 to 97/3 (volume ratio; 25° C.).

The amount of the precipitation solvent or the reprecipitation solvent can be appropriately selected taking into consideration of efficiency, yield or the like. However, in general, the amount of the precipitation solvent or the reprecipitation solvent relative to 100 parts by weight of the polymer solution is 100 to 10,000 parts by weight, preferably 200 to 2,000 parts by weight, and more preferably 300 to 1,000 parts by weight.

[Living Radical Polymerization]

Next, the living radical polymerization will be described.

Living radical polymerization is a polymerization reaction in which a termination reaction can be controlled to a certain extent by equilibrium between dormant species and radical growth species, and the molecular weight can be controlled by a reversible exchange reaction. When the exchange reaction is occurring at an extremely high rate as compared to the polymerization reaction, it is considered that a polymer having a narrow molecular weight distribution can be obtained.

In the present invention, a polymeric compound (X) having a narrow dispersity may be synthesized using a living radical polymerization initiator.

Examples of living radical polymerization include a method using a chain-transfer agent such as polysulfide; a method using a radical scavenger such as a cobalt porphyrin complex, a nitroxide compound or the like; and atom transfer radical polymerization using an organic halide as an initiator and a transition metal complex as a catalyst.

As the living radical polymerization initiator, a transition metal complex, an organic halide, and a Lewis acid or an amine may be used.

As the central metal which constitutes the transition metal complex, elements belonging to groups 7 to 11 of the Periodic Table such as iron, copper, nickel, rhodium, ruthenium and rhenium (defined in "Revised 4th edition, Handbook of Chemistry, Fundamentals Part I" edited by The Chemical Society of Japan and published by Maruzen Co., Ltd., Japan (1993)) are preferable. Among these examples, ruthenium and copper are preferable.

Specific examples of transition metal complex having ruthenium as the central metal include dichlorotris(triphenylphosphine)ruthenium, dichlorotris(tributylphosphine)ruthenium, dichloro(cyclooctadiene)ruthenium, dichlorobenzeneruthenium, dichloro-p-cymeneruthenium, dichloronorbomaneruthenium, cis-dichlorobis(2,2'-bipyridine)ruthenium, dichlorotris(1,10-phenanthroline)ruthenium, carbonylchlorohydridotris(triphenylphosphine)ruthenium, chlorocyclopentadienylbis(triphenylphosphine)ruthenium, chloro(pentamethylcyclopentadienyl)bis(triphenylphosphine)ruthenium, and chloroindenylbis(triphenylphosphine)ruthenium. Among these examples, dichlorotris(triphenylphosphine)ruthenium, chloro(pentamethylcyclopentadienyl)bis(triphenylphosphine)ruthenium, and chloroindenylbis(triphenylphosphine)ruthenium are preferable.

The organic halide functions as a polymerization initiator. As such organic halide, an α-halogenocarbonyl compound or an α-halogenocarboxylic acid ester may be used. Among these, an α-halogenocarboxylic acid ester is preferable, and specific examples thereof include ethyl 2-bromo-2-methylpropanoate, 2-hydroxyethyl 2-bromopropionate, and dimethyl 2-chloro-2,4,4-trimethylglutarate.

The Lewis acid or amine functions as an activator. Examples of such Lewis acid include an aluminum trialkoxide, such as aluminum triisopropoxide or aluminum tri(t- butoxide); a bis(substituted aryloxy)alkyl aluminum, such as bis(2,6-di-t-butylphenoxy)methyl aluminum or bis(2,4,6-tri-t-butylphenoxy)methyl aluminum; a tris(substituted aryloxy) aluminum, such as tris(2,6-diphenylphenoxy) aluminum; and a titanium tetraalkoxide, such as titanium tetraisopropoxide, preferably an aluminum trialkoxide, and most preferably aluminum triisopropoxide.

Examples of such amine include an aliphatic primary amine, such as methylamine, ethylamine, propylamine, isopropylamine or butylamine; an aliphatic secondary amine, such as dimethylamine, diethylamine, dipropylamine, diisopropylamine or dibutylamine; an aliphatic tertiary amine, such as trimethylamine, triethylamine, tripropylamine, triisopropylamine or tributylamine; an aliphatic polyamine, such as N,N,N',N'-tetramethylethylenediamine, N,N,N',N'',N''-pentamethyldiethylenetriamine or 1,1,4,7,10,10-hexamethyltriethylenetetramine; an aromatic primary amine, such as aniline or toluidine; an aromatic secondary amine, such as diphenylamine; and an aromatic tertiary amine, such as triphenyamine. Among these examples, an aliphatic amine is preferable, and butylamine, dibutylamine or tributylamine is most preferable.

The ratio of the content of the transition metal complex, the organic halide and the Lewis acid or the amine constituting the polymerization initiator system is not necessarily limited. However, when the ratio of the transition metal complex to the organic halide is too small, the polymerization rate tends to become slow. On the other hand, when the ratio of the transition metal complex to the organic halide is too large, the obtained polymer tends to have a broad molecular weight distribution. Therefore, the transition metal complex:organic halide molar ratio is preferably in the range of 0.05:1 to 1:1. Further, when the ratio of the Lewis acid or the amine to the transition metal complex is too small, the polymerization rate tends to become slow. On the other hand, when the ratio of the Lewis acid or the amine to the transition metal complex is too large, the obtained polymer tends to have a broad molecular weight distribution. Therefore, the organic halide:Lewis acid or amine molar ratio is preferably in the range of 1:1 to 1:10.

In general, the living radical polymerization initiator system may be prepared just before the use thereof by mixing together the transition metal complex, the organic halide and the Lewis acid or the amine as the activator by a conventional method. Alternatively, the transition metal complex, the polymerization initiator and the activator may be separately stored, and separately added to and mixed in the polymerization reaction system so as to function as a living polymerization initiator system.

The above polymerization initiator may be used in combination with a thermal radical initiator or a photoradical initiator. Specific examples of the thermal radical initiator include 2,2-azobis(isobutyronitrile), 2,2'-azobis(2-cyano-2-butane), dimethyl 2,2'-azobisdimethylisobutyrate, 4,4'-azobis(4-cyanovaleric acid), 1,1'-azobis(cyclohexanecarbonitrile), 2-(t-butylazo)-2-cyanopropane, 2,2'-azobis[2-methyl-N-(1,1)-bis(hydroxymethyl)-2-hydroxyethyl]propioneamide, 2,2'-azobis[2-methyl-N-hydroxyethyl]1-propioneamide, 2,2'-azobis(N,N'-dimethyleneisobutylamidine)dihydrochloride, 2,2'-azobis(2-amidinopropane)dihydrochloride, 2,2'-azobis(N,N'-dimethyleneisobutylamine), 2,2'-azobis(2-methyl-N-[1,1-bis(hydroxymethyl)-2-hydroxyethyl]propioneamide), 2,2'-azobis(2-methyl-N-[1,1-bis(hydroxymethyl)ethyl]propioneamide, 2,2'-azobis[2-methyl-N-(2-hydroxyethyl) propioneamide], 2,2-azobis(isobutylamide)dihydrate), 2,2'-azobis(2,2,4-trimethylpentane), 2,2'-azobis(2-methylpropane), t-butylperoxyacetate, t-butylperoxybenzoate, t-butylperoxyoctate, t-butylperoxyneodecanate, t-butylperoxyisobutyrate, t-amylperoxypivalate, t-butylperoxypivalate, diisopropylperoxydicarbonate, dicyclohexylperoxydicarbonate, dicumyl peroxide, dibenzoyl peroxide, dilauroyl peroxide, potassium persulfate, ammonium persulfate, di-tert-butyl hyponitrite and dicumyl hyponitrite.

Examples of the solvent usable in living radical polymerization include a cycloalkane, such as cyclohexane or cycloheptane; a saturated carboxylic acid ester, such as ethyl acetate, n-butyl acetate, isobutyl acetate, methyl propionate, or propylene glycol monomethylether acetate; an alkyl lactone, such as γ-butyrolactone; an ether, such as tetrahydrofuran, dimethoxyethane and diethoxyethane; an alkyl ketone, such as 2-butanone, 2-heptanone or methyl isobutyl ketone; a cycloalkyl ketone, such as cyclohexanone; an alcohol, such as 2-propanol or propylene glycol monomethyl ether; an aromatic, such as toluene, xylene or chlorobenzene; an aprotic polar solvent, such as dimethylformamide, dimethylsulfoxide, dimethylacetamide or N-methyl-2-pyrrolidone; or solventless.

One kind of solvent may be used alone, or a combination of two or more solvents may be used.

The reaction temperature in the above polymerization is generally 40 to 150° C., and preferably 50 to 130° C. The reaction time is generally 1 to 96 hours, and preferably 1 to 48 hours.

In a polymeric compound (X) in which the dispersity has been narrowed by the above method, for example, it is preferable that, in a molecular weight distribution based on the volume, 50% of the integrated values of the molecular weight as viewed from the low molecular weight side is 5,000 to 10,000, based on all integrated values of the molecular weight (100%).

In the present invention, the amount of components having a molecular weight of 1,000 or less within the polymeric compound (X), based on the total area of a pattern obtained by gel permeation chromatography (GPC) is 20% or less in terms of the area of pattern of components having a molecular weight of 1,000 or less, preferably 0 to 10%, and more preferably 0 to 5%.

More specifically, the amount of the components having a molecular weight of 1,000 or less is determined as follows. Using a monodispersed PS (polystyrene) having a molecular weight (Mw) of 1,000 as a standard, a measurement is conducted using RI of GPC. The area of pattern(s) detected on a low molecular weight side of the standard is defined (A), and the area of pattern(s) detected on a high molecular weight side of the standard is defined (B). The value obtained from the formula $[(A)/((A)+(B))]\times 100(\%)$ is defined as the amount of the components having a molecular weight of 1,000 or less.

In the polymeric compound (X), when the amount of components having a molecular weight of 1,000 or less is within the above-mentioned range, the amount of the pattern thickened can be increased.

Further, in the present invention, it is preferable that, in the polymeric compound (X), the amount of components that exhibits a dissolution rate of 5 nm/sec or less in butyl acetate is 20% or less in terms of the area of pattern as measured by gel permeation chromatography, based on the total area of the pattern.

The dissolution rate in butyl acetate refers to the dissolution rate when the polymer is immersed in a butyl acetate solution at 23° C.

When the dissolution rate in butyl acetate is within the above-mentioned range, it is considered that it contributes to reducing defects in the developing step in step (D).

When the polymeric compound (X) has a dispersity of 1.5 or less, it is preferable that the polymeric compound (X) has the structural unit (x0), the structural unit (st), a structural unit (x2) represented by general formula (x2-1), and in addition, the aforementioned structural units (a2) and (a4). The structural unit (x2) will be described later in the third aspect.

The basic composition preferably contains a block copolymer containing a block chain (b1) constituted of the structural unit (x0).

The block copolymer refers to a polymeric compound in which a plurality of partial constituent components (block chains) having the same kind of structural units are repeatedly bonded. As the block chain constituting the block copolymer, 2 kinds of block chains may be used, or 3 or more kinds of block chains may be used.

Block Chain (b1)

The block chain (b1) has a function of thickening a resist prepattern.

In the present invention, the block chain (b1) is a partial constituent component which interacts with a resist prepattern and is capable of forming a developing solution insoluble layer on the surface of the resist prepattern.

The block chain (b1) preferably has a neutralization group. By virtue of the block chain (b1) having a neutralization group, in step C, the block chain (b1) and the resist prepattern are neutralized, and a developing solution insoluble layer is reliably formed on the surface of the resist prepattern.

In the present invention, a "neutralization group" is a group which neutralizes with the resist prepattern to form a developing solution insoluble layer on the surface of the resist prepattern.

In step C, the neutralization group of the block chain (b1) is neutralized with a carboxylic acid, a hydroxy group, a lactone, an acid anhydride, an ester or the like (hereafter, referred to as "carboxylic acid and the like") on the surface of the resist prepattern, and a developing solution insoluble layer is formed on the surface of the resist prepattern.

The neutralization group of the block chain (b1) is appropriately selected taking into consideration of the kind of resist prepattern formed in step A. For example, in the case where step A includes an operation of forming a resist film on a substrate using a resist composition containing a resin component which exhibits decreased solubility in an organic solvent by the action of acid, and an operation of developing the resist film using an organic solvent to form a resist prepattern, the neutralization group of the block chain (b1) is a basic group.

As the basic group, the "substituent having a nitrogen atom" given as an example of $Rx^1$ in the aforementioned general formula (x0-1) is preferable.

The weight average molecular weight (Mw) (the polystyrene equivalent value determined by gel permeation chromatography (GPC)) of the partial constituent component (repeating structure of same kind of structural units) constituting the block chain (b1) is not particularly limited, but is preferably 1,000 to 50,000, more preferably 1,000 to 30,000, and still more preferably 1,000 to 10,000.

Other Block Chain

In the present invention, the block chain other than the block chain (b1) contained in the block copolymer is not particularly limited. For example, a partial constituent component in which the aforementioned structural unit (st), the aforementioned structural unit (a3), the aforementioned structural unit (a4) or a structural unit (a9) represented by general formula (a9-1) shown below is repeatedly bonded may be mentioned.

Partial Constituent Component in which Structural Units Having a Styrene Skeleton are Repeatedly Bonded (Hereafter, Referred to as "Block Chain (b2)") In the present invention, the block copolymer preferably contains a block chain (b2), in addition to the block chain (b1).

By virtue of containing a block chain (b2) in addition to the block chain (b1), the resist prepattern may be more efficiently thickened.

The weight average molecular weight (Mw) (the polystyrene equivalent value determined by gel permeation chromatography (GPC)) of the partial constituent component (repeating structure of same kind of structural units) constituting the block chain (b2) is not particularly limited, but is preferably 1,000 to 200,000, more preferably 1,000 to 100,000, and still more preferably 1,000 to 50,000.

Partial Constituent Component in which Structural Unit (a9) is Repeatedly Bonded (Hereafter, Referred to as "Block Chain (b3)")

In the present invention, the block copolymer may contain a block chain (b3), in addition to the block chain (b1).

The structural unit (a9) is represented by general formula (a9-1) shown below.

[Chemical Formula 61.]

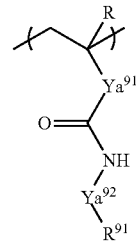

(a9-1)

In the formula, R is the same as defined above; $Ya^{91}$ represents a single bond or a divalent linking group; $R^{91}$ represents a hydrocarbon group optionally having a substituent; and $Ya^{92}$ represents a divalent linking group.

In general formula (a9-1), the divalent linking group for $Ya^{91}$ is the same as defined for the divalent linking group for $Yx^{01}$ in the aforementioned general formula (b1-u1) described later. $Ya^{91}$ is preferably a single bond.

In formula (a9-1), the divalent linking group for $Ya^{92}$, like the divalent linking group for $Ya^{91}$, is the same as defined for the divalent linking group for $Yx^{01}$ in the aforementioned formula (b1-u1) (divalent hydrocarbon group which may have a substituent, a divalent linking group containing a hetero atom).

With respect to the divalent linking group for $Ya^{92}$ in formula (a9-1), as the divalent hydrocarbon group which may have a substituent, a linear or branched aliphatic hydrocarbon group is preferable.

As the linear aliphatic hydrocarbon group, a linear alkylene group is preferable. The linear alkylene group preferably has 1 to 10 carbon atoms, more preferably 1 to 6 carbon atoms, still more preferably 1 to 4 carbon atoms, and most preferably 1 to 3 carbon atoms. Specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable. The branched alkylene group preferably has 3 to 10 carbon atoms, more preferably 3 to 6 carbon atoms, and still more preferably 3 or 4. Specific examples include alkylmethylene groups, such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups, such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups, such as —CH($CH_3$)$CH_2CH_2$—, and —$CH_2$CH($CH_3$)$CH_2$—; and alkyltetramethylene groups, such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

In formula (a9-1), in the case where $Ya^{92}$ represents a divalent linking group containing a hetero atom, examples of the linking group include —O—, —C(=O)—O—, C(=O), —C(=O)—O—, C(=O)—NH—, —NH—, —NH—C(=NH)— (wherein H may be substituted with a substituent such as an alkyl group or an acyl group), —S—, —S(=O)$_2$—, —S(=O)$_2$—O—, C(=S), a group represented by general formula —$Y^{91}$—O—$Y^{92}$—, —$Y^{91}$—O—, —$Y^{91}$—C(=O)—O—, —C(=O)—O—$Y^{91}$, —[$Y^{91}$—C(=O)—O]$_{m'}$—$Y^{92}$— or —$Y^{91}$—O—C(=O)—$Y^{92}$—[in the formulae, $Y^{91}$ and $Y^{92}$ each independently represents a divalent hydrocarbon group which may have a substituent, and O represents an oxygen atom; and m' represents an integer of 0 to 3. Among these examples, —C(=O)— and —C(=S)— are preferable.

In general formula (a9-1), examples of the hydrocarbon group for $R^{91}$ include an alkyl group, a monovalent alicyclic hydrocarbon group, an aryl group and an aralkyl group.

The alkyl group for $R^{91}$ preferably has 1 to 8 carbon atoms, more preferably 1 to 6 carbon atoms, and still more preferably 1 to 4 carbon atoms. The alkyl group may be linear or branched. Specific examples of preferable alkyl groups include a methyl group, an ethyl group, a propyl group, a butyl group, a hexyl group and an octyl group.

The monovalent alicyclic hydrocarbon group for $R^{91}$ preferably has 3 to 20 carbon atoms, and more preferably 3 to 12 carbon atoms. The monovalent alicyclic hydrocarbon group may be polycyclic or monocyclic. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclobutane, cyclopentane and cyclohexane. As the polycyclic alicyclic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aryl group for $R^{91}$ preferably has 6 to 18 carbon atoms, and more preferably 6 to 10 carbon atoms. Specifically, a phenyl group is particularly desirable.

As the aralkyl group for $R^{91}$, an aralkyl group of 7 to 10 carbon atoms is preferable. Examples of aralkyl groups of 7 to 10 carbon atoms include a benzyl group, a phenethyl group, a 1-naphthylmethyl group, a 2-naphthylmethyl group, a 1-naphthylethyl group, a 2-naphthylethyl group.

The hydrocarbon group for $R^{91}$ may have a substituent. Examples of the substituent include a halogen atom, an oxo group (=O), a hydroxy group (—OH), an amino group (—$NH_2$) and —$SO_2$—$NH_2$.

The hydrocarbon group for $R^{91}$ preferably has part or all of the hydrogen atoms within the hydrocarbon group substituted with fluorine, and the hydrocarbon group more preferably has 30 to 100% of the hydrogen atoms substituted with fluorine. Among these, a perfluoroalkyl group in which all of the hydrogen atoms within the alkyl group have been substituted with fluorine atoms is particularly desirable.

Further, part of the carbon atoms constituting the hydrocarbon group for $R^{91}$ may be substituted with a substituent containing a hetero atom. Examples of the substituent containing a hetero atom include —O—, —NH—, —N=, —C(=O)—O—, —S—, —S(=O)$_2$—, and —S(=O)$_2$—O—.

As the hydrocarbon group for $R^{91}$, examples of the hydrocarbon group having a substituent include lactone-containing cyclic groups represented by general formulae (a2-r-1) to (a2-r-7) described later.

Further, as $R^{91}$, examples of the hydrocarbon group having a substituent include —$SO_2$— containing cyclic groups represented by general formulae (a5-r-1) to (a5-r-4) described later; and substituted aryl groups and monocyclic heterocyclic groups represented by chemical formulae shown below.

In the formulae shown below, "*" represents a valence bond with $Ya^{92}$.

[Chemical Formula 62.]

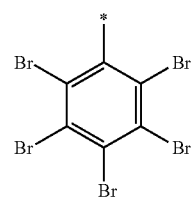

(r-ar-1)

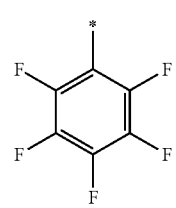

(r-ar-2)

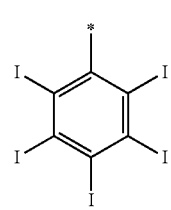

(r-ar-3)

-continued

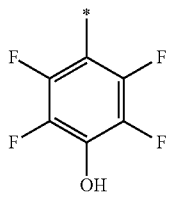
(r-ar-4)

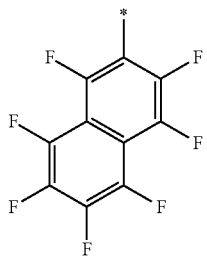
(r-ar-5)

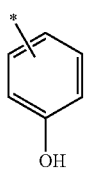
(r-ar-6)

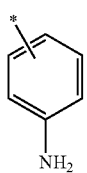
(r-ar-7)

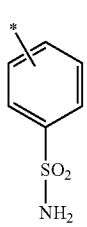
(r-ar-8)

(r-hr-1)

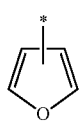
(r-hr-2)

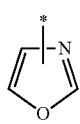
(r-hr-3)

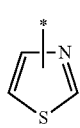
(r-hr-4)

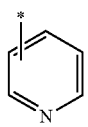
(r-hr-5)

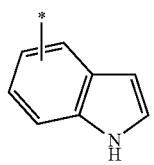
(r-hr-6)

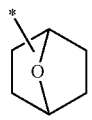
(r-hr-7)

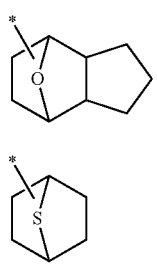
(r-hr-8)

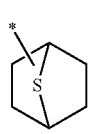
(r-hr-9)

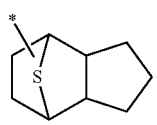
(r-hr-10)

As the structural unit (a9), a structural unit represented by general formula (a9-1-1) shown below is preferable.

[Chemical Formula 63.]

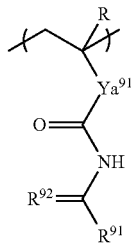
(a 9-1-1)

In the formula, R is the same as defined above; $Ya^{91}$ represents a single bond or a divalent linking group; $R^{91}$ represents a hydrocarbon group optionally having a substituent; and $Ya^{92}$ represents an oxygen atom or a sulfur atom.

In formula (a9-1-1), $Ya^{91}$, $R^{91}$ and R are the same as defined above.

$R^{92}$ represents an oxygen atom or a sulfur atom.

Specific examples of the structural unit (a9) are shown below.

In the following formulae, $R^{\alpha}$ represents a hydrogen atom, a methyl group or a trifluoromethyl group.

[Chemical Formula 64.]
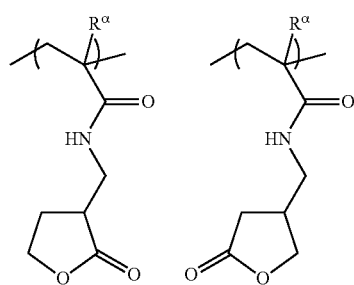
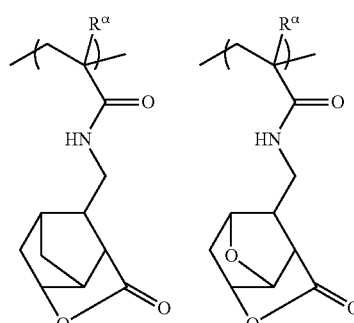
[Chemical Formula 65.]
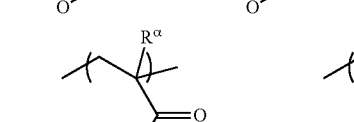
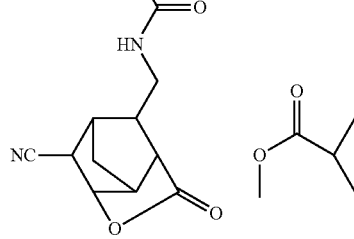
-continued
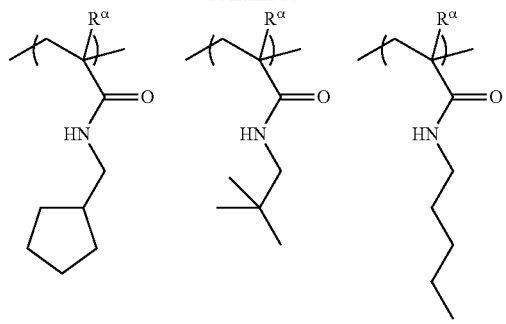
[Chemical Formula 66.]
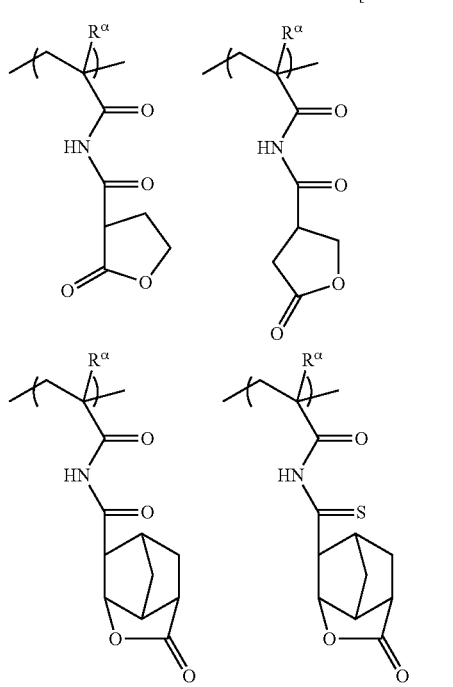

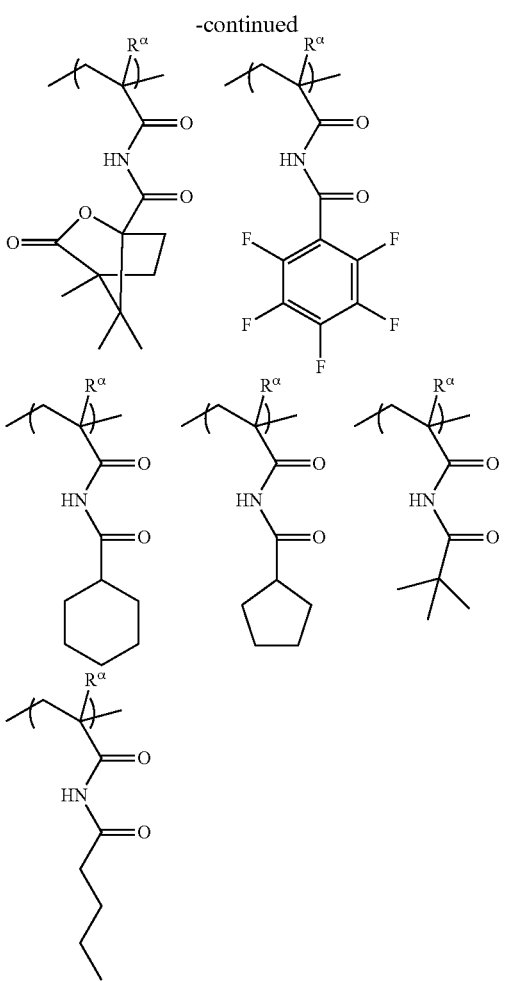

The weight average molecular weight (Mw) (the polystyrene equivalent value determined by gel permeation chromatography (GPC)) of the partial constituent component (repeating structure of same kind of structural units) constituting the block chain (b3) is not particularly limited, but is preferably 1,000 to 200,000, more preferably 1,000 to 100,000, and still more preferably 1,000 to 50,000.

In the present invention, the block copolymer preferably contains a block chain (b1) constituted of the structural unit (x0) and a block chain (b2) which is a partial constituent component in which structural units having a styrene skeleton are repeatedly bonded.

Among these examples, as the block copolymer, it is preferable to contain a partial constituent component in which structural units represented by general formula (x0-1) are repeatedly bonded and a partial constituent component in which structural units (st2) represented by general formula (II) are repeatedly bonded.

The molar ratio of the block chain (b1) to the block chain (b2), structural unit constituting the block chain (b1)/structural unit constituting the block chain (b2) is preferably 1/99 to 50/50, more preferably 1/99 to 30/70, and still more preferably 1/99 to 20/80.

When the molar ratio is within the above-mentioned range, the effect of thickening the resist prepattern can be improved.

In the present invention, the block copolymer preferably contains the block chain (b1) on the terminal of the main chain.

"Contains the block chain (b1) on the terminal of the main chain" may mean that the terminal of the main chain is the block chain (b1), or the terminal of the main chain is a block chain other than the block chain (b1). Among these, the terminal of the main chain is preferably a block chain (b1).

In the case where the terminal of the main chain is another block chain, the block chain (b1) is preferably as close as possible to the terminal of the main chain.

By virtue of containing the block chain (b1) on the terminal of the main chain, even in the case where a low-molecular weight polymer is used as the block copolymer, the effect of thickening the resist prepattern can be satisfactorily achieved (the width of the thickened portion (shrink volume: S.V.) can be increased).

The closer the block chain (b1) is to the terminal of the main chain, the block chain (b1) interacts with the resist prepattern, and other block chains are likely to extend away from the resist prepattern. As a result, a developing solution insoluble layer is reliably formed.

The weight average molecular weight (Mw) (the polystyrene equivalent value determined by gel permeation chromatography) of the block copolymer is not particularly limited, but is preferably 1,000 to 200,000, more preferably 1,000 to 100,000, and still more preferably 1,000 to 50,000. The larger the Mw of the block copolymer, the larger the width (shrink volume: S.V.) of the thickened portion.

The dispersity (weight average molecular weight/number average molecular weight) of the block copolymer is preferably 1.5 or less, more preferably 1.45 or less, still more preferably 1.4 or less, and most preferably 1.3 or less.

In the present invention, in terms of narrowing the dispersity and improving the effect of thickening the resist prepattern, it is preferable to use a block copolymer obtained by living polymerization. Preferable examples of living polymerization include living anion polymerization and living radical polymerization.

In the basic composition, 1 kind of block copolymer may be used, or 2 or more kinds of block copolymers may be used in combination.

In terms of controlling the pattern shape before and after thickening the resist prepattern, a polymer other than the aforementioned block copolymer (hereafter, referred to as "polymer (P2)") may be used in combination.

<<Polymer (P2)>>

Polymer (P2) is not particularly limited, and for example, a polymer which does not function to thicken the resist prepattern (polymer which does not form a developing solution insoluble layer on the surface of the resist prepattern in step C) may be mentioned.

As a preferable example of polymer (P2), a polymer having at least one member selected from the group consisting of the structural unit (a1), the structural unit (a2), the structural unit (a3), the structural unit (a4), the structural unit (st) and the structural unit (a5) represented by the aforementioned general formula (a5-1) may be mentioned.

[Chemical Formula 67.]

(a 5-1)

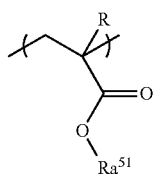

In the formula, R is the same as defined above; $Ra^{51}$ represents a linear or branched alkyl group of 1 to 5 carbon atoms, or a linear or branched fluorinated alkyl group of 1 to 5 carbon atoms.

In the formula (a5-1), R is the same as defined above.

In formula (a5-1), $Ra^{51}$ represents a linear or branched alkyl group of 1 to 5 carbon atoms, or a linear or branched fluorinated alkyl group of 1 to 5 carbon atoms.

Examples of linear or branched alkyl groups of 1 to 5 carbon atoms include a methyl group, an ethyl group, a propyl group, an isopropyl group, an n-butyl group, an isobutyl group, a tert-butyl group, a pentyl group, an isopentyl group and a neopentyl group.

Examples of the fluorinated alkyl group of 1 to 5 carbon atoms include groups in which part or all of the hydrogen atoms within the aforementioned alkyl groups of 1 to 5 carbon atoms have been substituted with fluorine.

Polymer (P2) may be a copolymer or a homopolymer.

In the case where the polymer (P2) is a copolymer, the polymer (P2) preferably has at least one member selected from the group consisting of structural units (a1) to (a5), and more preferably has at least one member selected from the group consisting of structural units (a3) and (a4).

In the case where the polymer (P2) is a homopolymer, the polymer (P2) preferably has a structural unit (a5) or a structural unit (st).

Specifically, as polymer (P2), a copolymer consisting of a structural unit (a3) and a structural unit (a4), a copolymer consisting of a structural unit (a4) and a structural unit (a5), a copolymer consisting of a structural unit (a1) and a structural unit (a3), a copolymer consisting of structural units (a1), (a2) and (a3), a homopolymer consisting of a structural unit (a5), or a homopolymer consisting of a structural unit (st) is preferable.

In the case where polymer (P2) is a copolymer, the amounts of the structural units (a1) to (a5) and (st) within the polymer (P2) is not particularly limited, and may be appropriately adjusted within the range of 1 to 99 mol %, based on the total of all structural units constituting the polymer (P2).

The polymer (P2) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

The weight average molecular weight (Mw) (the polystyrene equivalent value determined by gel permeation chromatography) of the polymer (P2) is not particularly limited, but is preferably 1,000 to 1,000,000, more preferably 1,500 to 500,000, and most preferably 2,000 to 300,000.

When the weight average molecular weight of the polymer (P2) is within the above-mentioned range, the pattern can be favorably thickened.

In the basic composition, 1 kind of polymer (P2) may be used, or 2 or more kinds of polymers (P2) may be used in combination.

In the basic composition, the weight ratio of the block copolymer to the polymer (P2), block copolymer/polymer (P2) is preferably 1/99 to 99/1, more preferably 5/95 to 95/5, and still more preferably 10/90 to 90/10.

Figure 6:
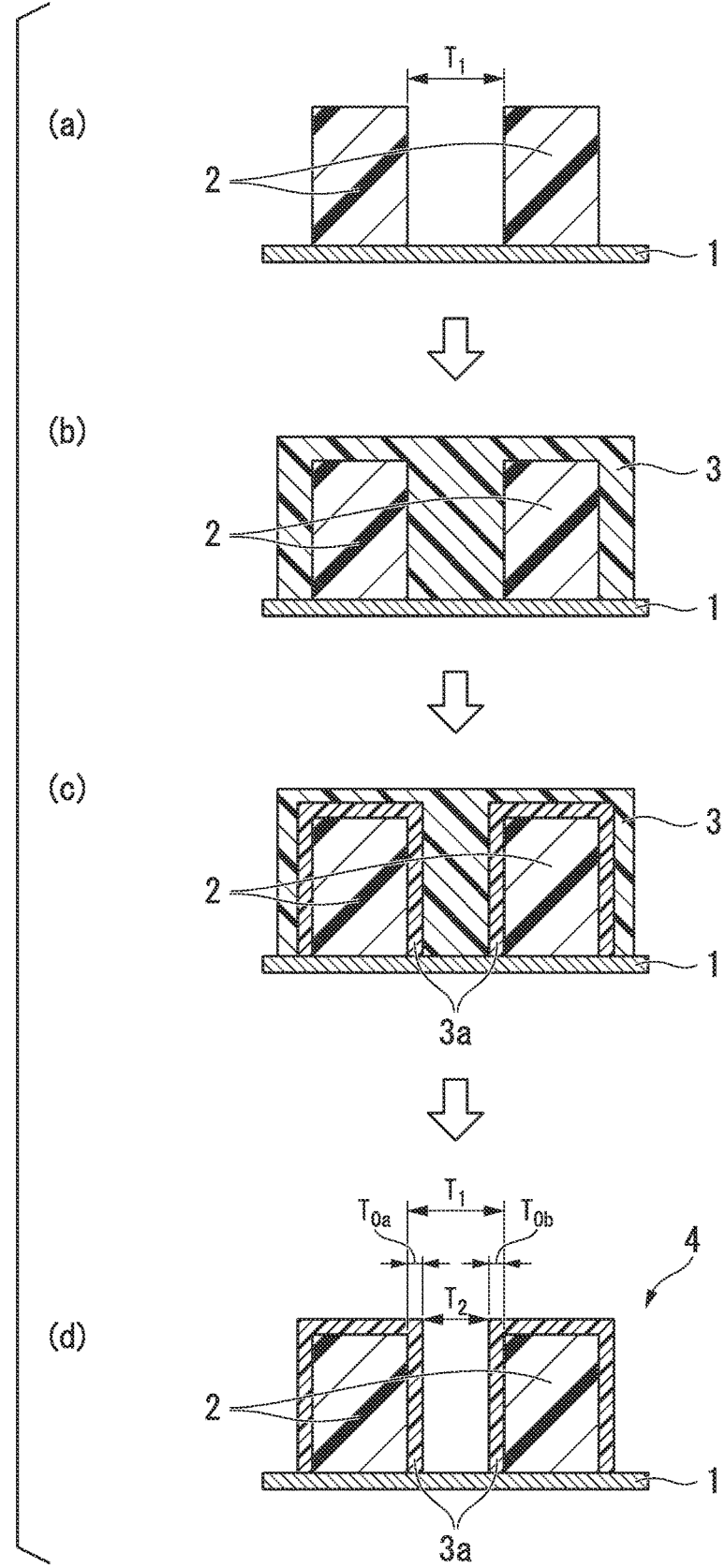
FIG. 6 is a schematic diagram showing an example of one embodiment of the method of forming a resist pattern according to the present invention.

FIG. 6 is a schematic diagram showing an example of one embodiment of the method of forming a resist pattern according to the present invention in the case where the basic composition includes a block copolymer containing a block chain (b1) constituted of the aforementioned structural unit (x0). The figure shows the sequential steps of thickening a hole pattern.

Firstly, on a substrate 1, a resist prepattern 2 is formed using a resist composition (step A; FIG. 6(a)). In the resist prepattern 2, the diameter of the hole is $T_1$.

Subsequently, on the substrate 1 having the resist prepattern 2 formed, a polymer composition for pattern thickening (basic composition) is applied to cover the resist prepattern 2, so as to form a polymer film 3 (step B; FIG. 6(b)). Thereafter, a developing solution insoluble layer 3a (thickened portion) is formed on the surface of the resist prepattern 2 (step C; FIG. 6(c)).

Next, the resist prepattern 2 having the developing solution insoluble layer 3a formed on the surface thereof and the polymer film 3 covering the resist prepattern 2 are developed. As a result, in the present embodiment, the resist prepattern 2 is thickened in the direction of the height of the hole and the radial direction of the hole, such that a fine resist pattern 4 having a hole diameter smaller than that of the resist prepattern 2 is formed (step D; FIG. 6(d)).

In FIG. 6(d), the resist pattern 4 is a hole pattern constituted of the resist prepattern 2 and the developing solution insoluble layer 3a. In the resist pattern 4, the resist prepattern 2 is thickened, and the hole diameter is decreased from $T_1$ to $T_2$ ($T_2 < T_1$). The width of the thickened portion in the hole diameter direction (shrink volume: S.V.) is $T_0$ (i.e., $T_1 - T_0 = T_2$, $T_0 = T_{0a} + T_{0b}$).

The basic composition preferably contains a polymer (P1) which exhibits a function of thickening the first resist pattern in step C by itself and has a structural unit (x0) represented by the aforementioned general formula (x0-1), and a polymer (P2) which does not exhibit a function of thickening the resist prepattern in step C by itself.

The basic composition preferably contains a polymer (P1) which exhibits a function of thickening the first resist pattern in step C by itself and has a structural unit (x0) represented by the aforementioned general formula (x0-1), and a polymer (P2) which does not exhibit a function of thickening the resist prepattern in step C by itself.

<Polymer (P1)>

The polymer (P1) is not particularly limited as long as it has a structural unit (x0) represented by the aforementioned general formula (x0-1), and exhibits a function of thickening the resist prepattern in step C by itself. Specifically, the polymer (P1) is a polymer which is capable of forming a developing solution insoluble layer on the surface of the resist prepattern in step C by itself.

Polymer (P1) has a neutralization group (organic group having a nitrogen atom for $Rx^1$ in the aforementioned general formula (x0-1)). In step C, the polymer (P1) having the neutralization group neutralizes with the resist prepattern and bonded thereto, so as to form a developing solution insoluble layer on the surface of the resist prepattern.

In the present specification and claims, a "neutralization group" is a group which neutralizes with the resist prepattern and bonded thereto to form a developing solution insoluble layer on the surface of the resist prepattern.

Specifically, in step C, the neutralization group neutralizes with and bonded to a carboxylic acid, a hydroxy group, a lactone, an acid anhydride, an ester or the like (hereafter, referred to as "carboxylic acid and the like") on the surface of the resist prepattern, so as to form a developing solution insoluble layer on the surface of the resist prepattern.

In the polymer (P1), the amount of the structural unit (x0) based on the combined total of all structural units constituting the polymer (P1) is preferably 1 to 80 mol %, more preferably 1 to 75 mol %, still more preferably 1 to 70 mol %, and most preferably 1 to 10 mol %.

In the present embodiment, the polymer (P1) may have one kind of structural unit (x0). Alternatively, a polymeric compound having the structural unit (x0) and another structural unit may be used. Preferable examples of other structural unit include at least one structural unit selected from the group consisting of the aforementioned structural units (a3), (a4), the structural unit (a9) represented by the aforementioned general formula (a9-1), and a structural unit containing a styrene skeleton (e.g., structural unit (st)).

In the present embodiment, as the polymer (P1), a copolymer of the structural unit (x0) and a structural unit containing a styrene skeleton; a copolymer of the structural unit (x0), the aforementioned structural unit (a3) and the aforementioned structural unit (a4); a copolymer of the structural unit (x0), the aforementioned structural unit (a2) and the aforementioned structural unit (a4); or a copolymer of the aforementioned structural unit (x0), aforementioned structural unit (a9) and a structural unit containing a styrene skeleton is preferable.

In the polymer (P1), the amount of the structural units (a3), (a4), (a9) and (st) based on the combined total of all structural units constituting the polymer (P1) is preferably 10 to 99 mol %, more preferably 20 to 99 mol %, still more preferably 25 to 99 mol %, and most preferably 90 to 99 mol %.

The polymer (P1) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the present embodiment, the weight average molecular weight (Mw) (the polystyrene equivalent value determined by gel permeation chromatography) of the polymer (P1) is not particularly limited, but is preferably 1,000 to 1,000,000, more preferably 1,500 to 500,000, and most preferably 2,000 to 300,000.

It is presumed that, when the weight average molecular weight of the polymer (P1) is within the above-mentioned range, the pattern can be favorably thickened.

As polymer (P1), 1 kind of polymer may be used, or 2 or more kinds of polymers may be used in combination.

<Polymer (P2)>

The polymer (P2) is not particularly limited as long as it does not exhibit a function of thickening the resist prepattern in step C by itself. Specifically, the polymer (P2) is a polymer which is incapable of forming a developing solution insoluble layer on the surface of the resist prepattern in step C by itself.

As a preferable example of polymer (P2), a polymer having at least one member selected from the group consisting of the structural units (a1), (a2), (a3), (a4), (st) and the structural unit (a5) represented by the aforementioned general formula (a5-1) may be mentioned.

The glass transition temperature of the polymer (P2) is preferably at least as high as the glass transition temperature of the polymer (P1).

By virtue of the polymer (P2) having a glass temperature at least as high as the glass transition temperature of the polymer (P1), particularly in the case of forming a hole pattern, the amount of change in the aspect ratio of the hole (oval) before and after shrinking may be reduced.

Polymer (P2) may be a copolymer or a homopolymer.

In the case where the polymer (P2) is a copolymer, the polymer (P2) preferably has at least one structural unit selected from the group consisting of structural units (a1) to (a5), and more preferably has at least one structural unit selected from the group consisting of structural units (a3) and (a4).

In the case where the polymer (P2) is a homopolymer, the polymer (P2) preferably has a structural unit (a5) or (st).

Specifically, as polymer (P2), a copolymer consisting of structural units (a3) and (a4), a copolymer consisting of structural units (a4) and (a5), a copolymer consisting of structural units (a1) and (a3), a copolymer consisting of structural units (a1), (a2) and (a3), a homopolymer consisting of a structural unit (a5), or a homopolymer consisting of a structural unit (st) is preferable.

In the present embodiment, in the case where polymer (P2) is a copolymer, the amounts of the structural units (a1) to (a5) and (st) within the polymer (P2) is not particularly limited, and may be appropriately adjusted within the range of 1 to 99 mol %, based on the total of all structural units constituting the polymer (P2).

The polymer (P2) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the present embodiment, the weight average molecular weight (Mw) (the polystyrene equivalent value determined by gel permeation chromatography) of the polymer (P2) is not particularly limited, but is preferably 1,000 to 1,000,000, more preferably 1,500 to 500,000, and most preferably 2,000 to 300,000.

It is presumed that, when the weight average molecular weight of the polymer (P2) is within the above-mentioned range, the pattern can be favorably thickened.

As polymer (P2), 1 kind of polymer may be used, or 2 or more kinds of polymers may be used in combination.

In the polymer composition for thickening a pattern, the weight ratio of the polymer (P1) to the polymer (P2), polymer (P1)/polymer (P2) is preferably 1/9 to 9/1, more preferably 1/9 to 5/5, and still more preferably 1/9 to 2/8.

In the case where the basic composition contains the polymer (P1) and the polymer (P2), the resist prepattern may be shrunk 5 to 30%, in particular, 8 to 20%. Therefore, in the present embodiment, even in the case where an exposure treatment is conducted using a low aperture number (low NA) exposure apparatus, it is expected that a fine pattern can be formed.

Further, in the case where the basic composition contains the polymer (P1) and the polymer (P2), particularly when a hole pattern is formed, a satisfactory shrink ratio can be achieved, and the change in the aspect ratio of the hole (oval) before and after shrinking can be reduced.

[Solvent]

The solvent contained in the basic composition may be water or an organic solvent. The solvent is not particularly limited as long as it does not dissolve the first resist pattern, and may be appropriately selected depending on the basic composition material and resist composition to be used. In the present invention, it is preferable to use an organic solvent. When water is used as the solvent, pure water is preferable. Alternatively, when an organic solvent is used, a ketone solvent, an ester solvent, an alcohol solvent, an amide solvent or an ether solvent may be used alone, or a mixed solvent of two or more of these solvents may be used.

Among these example, in terms of not dissolving the first resist pattern, it is preferable to use an ester solvent, and in particular, butyl acetate.

The total solid content of the basic composition (total weight excluding the solvent) is preferably 0.1 to 20% by weight, more preferably 1 to 15% by weight, and most preferably 1 to 13% by weight.

In the step of applying the basic composition, any method capable of applying the basic composition to the first resist pattern may be used. The basic composition is applied by a conventional method such as a spin-coat method, a pray method, a roller coat method or an immersion method, preferably a spin-coat method.

[Step C]

The present invention includes a step C in which the base within the basic composition and the first resist pattern are neutralized, so as to form a developing solution insoluble layer on the surface of the first resist pattern.

More specifically, as shown in FIG. 1(c), a developing solution insoluble region 2a is formed on the surface of the first resist pattern 2.

In step C, after applying the basic composition, it is preferable to heat the first resist pattern covered with the basic composition. In this manner, insoluble, remaining solvent can be removed. Further, the base within the basic composition and a carboxylic acid, a hydroxy group, a lactone, an acid anhydride, an ester or the like (hereafter, referred to as "carboxylic acid and the like") on the surface of the first resist pattern are neutralized, so as to form a developing solution insoluble region.

More specifically, the surface of the first resist pattern 2 has carboxylic acid and the like generated on the surface thereof by deprotection. When the first resist pattern is covered with the basic composition, the basic composition comes into contact with the first resist pattern, and the carboxylic acid and the like on the surface of the first resist pattern are neutralized with the base within the basic composition. As a result, it is presumed that a developing solution insoluble region which is insoluble in the developing solution used in the developing in the later step D is formed.

In step C, it is presumed that, remaining solvent can be removed by heating, and the neutralization reaction may be reliably proceeded on the surface of the first resist pattern.

The heating temperature and heating time can be appropriately selected depending on the kind of resist materials to be used, the kind of the basic composition and the shrinking ratio of the resist pattern. The heating temperature is preferably 0° C. to 200° C., more preferably 50° C. to 170° C. The heating time is preferably 30 to 300 seconds, more preferably 50 to 120 seconds, and most preferably 50 to 80 seconds.

In the present invention, after the step B, it is preferable to conduct a step C' in which an acidic composition is applied to cover the layer of the basic composition, so as to form an acidic layer.

Figure 2:
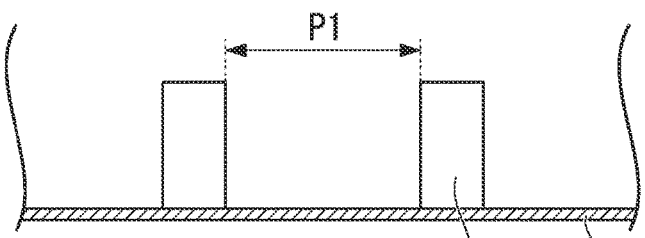
FIG. 2 is a diagram showing one example of schematic steps of the method of forming a resist pattern according to the present invention.
Figure 2:
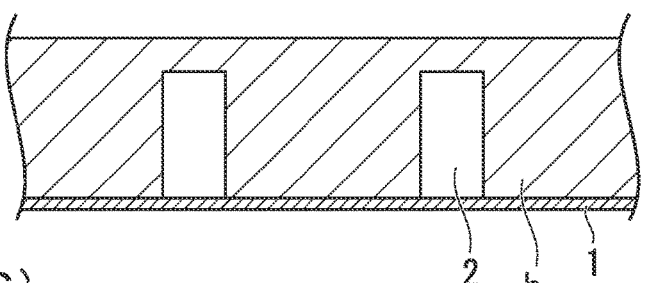
Figure 2:
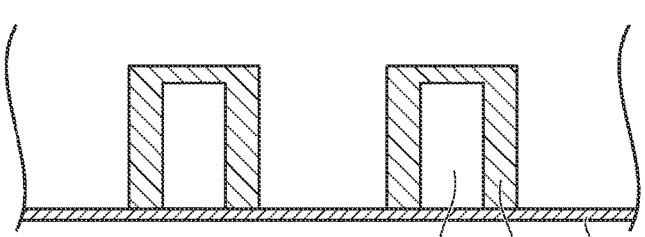
Figure 2:
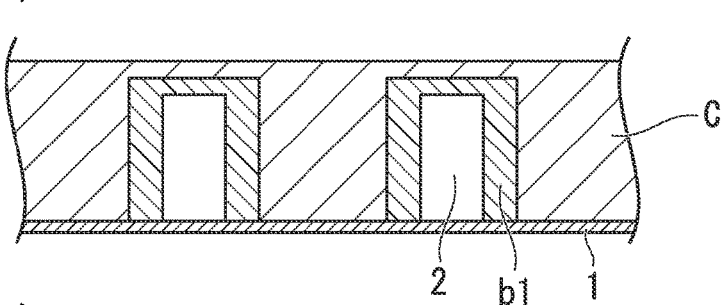
Figure 2:
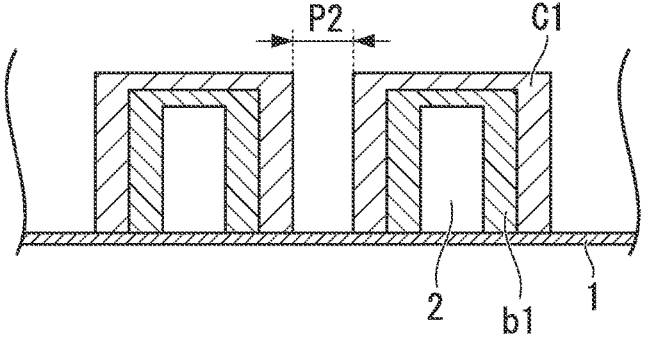

FIG. 2 is a diagram showing one example of schematic steps of the method of forming a resist pattern according to the present invention in the case where step C' is conducted.

Firstly, in step A, a resist composition is applied to a substrate, so as to form a resist pattern. Specifically, as shown in FIG. 2(A), a resist pattern 2 is formed on a substrate 1.

In step B, a basic composition is applied to cover the resist pattern formed in step A, so as to form a basic layer b1. More specifically, as shown in FIG. 2(B), a basic composition is applied to cover the resist pattern 2, so as to form a basic composition layer b.

On the surface of the resist pattern 2, a carboxylic acid, a hydroxy group, a lactone, an acid anhydride, an ester or the like (hereafter, referred to as "carboxylic acid and the like") are present. Therefore, by applying the basic composition to cover the resist pattern 2, a neutralization reaction between the carboxylic acid and the like and the basic composition proceeds, and the surface of the resist pattern 2 is thickened.

In step B, after applying the basic composition, by developing, unreacted, excess basic composition is removed. As shown in FIG. 2(C), a basic layer b1 is formed on the surface of the resist pattern 2, and a thickened pattern is formed.

[Step C']

In step C', an acidic composition is applied to cover the basic layer b1 obtained in step B, so as to form an acidic layer c1. By applying the acidic composition to cover the basic layer b1, the neutralization reaction between the acid and the base proceeds, and the basic layer b1 is thickened.

The basic layer b1 is a layer in which a neutralization reaction proceeds with the resist pattern to have the resist pattern thickened. However, it is considered that excess base which does not contribute to the neutralization reaction with the resist pattern is present. It is considered that, by a neutralization reaction of the excess base with acid within the acidic composition, the basic layer b1 is thickened.

More specifically, as shown in FIG. 2(D), an acidic composition is applied to cover the basic layer b1, so as to form an acidic composition layer C. Thereafter, by developing, unreacted, excess acidic composition may be removed, and an acidic layer c1 is formed as shown in FIG. 2(E). The explanation about the developing treatment in step C' is the same as the explanation of the developing treatment in step B. In the present invention, in terms of efficiently removing the acidic composition, it is preferable to use an organic solvent developing treatment also in step C'.

<Acidic Composition>

The acidic composition used in the present invention will be described. In the present invention, the acidic composition preferably contains a polyhydroxystyrene resin, an acrylic resin or a novolak resin.

[Polyhydroxystyrene Resin]

Examples of hydroxystyrene compound constituting the polyhydroxystyrene resin include p-hydroxystyrene, α-methylhydroxystyrene, and α-ethylhydroxystyrene. In the present invention, it is preferable to use p-hydroxystyrene.

Further, the polyhydroxystyrene resin may be a copolymer with a styrene resin. Examples of styrene compound constituting the styrene resin include styrene, chlorostyrene, chloromethylstyrene, vinyltoluene, α-methylstyrene.

The weight average molecular weight of the polyhydroxystyrene resin is preferably 1,000 to 50,000.

[Acrylic Resin]

As the acrylic resin, it is preferable to include a structural unit derived from a polymerizable compound having an ether bond, and a structural unit derived from a polymerizable compound having a carboxy group.

Examples of the polymerizable compound having an ether bond include (meth)acrylic acid derivatives having an ether bond and an ester bond, such as 2-methoxyethyl (meth)acrylate, methoxytriethyleneglycol (meth)acrylate, 3-methoxybutyl (meth)acrylate, ethylcarbitol (meth)acrylate, phenoxypolyethyleneglycol (meth)acrylate, methoxypolypropyleneglycol (meth)acrylate, tetrahydrofurfuryl (meth)acrylate. The polymerizable compound having an ether bond is preferably 2-methoxyethyl acrylate or methoxytriethyleneglycol acrylate. These polymerizable compounds may be used alone, or in a combination of two or more.

Examples of the polymerizable compound having a carboxy group include monocarboxylic acids, such as acrylic acid, methacrylic acid and crotonic acid; dicarboxylic acids, such as maleic acid, fumaric acid and itaconic acid; and compounds having a carboxy group and an ester bond, such as 2-methacryloyloxyethyl succinate, 2-methacryloyloxyethyl maleate, 2-methacryloyloxyethyl phthalate and 2-methacryloyloxyethyl hexahydrophthalate. The polymerizable compound having a carboxy group is preferably acrylic acid or methacrylic acid. These polymerizable compounds may be used alone, or in a combination of two or more.

Further, the acrylic resin may be a copolymer with a styrene resin. Examples of styrene compound constituting the styrene resin include styrene, chlorostyrene, chloromethylstyrene, vinyltoluene, α-methylstyrene.

The weight average molecular weight of the acrylic resin is preferably 1,000 to 800,000.

[Novolak Resin]

The novolak resin is obtainable, for example, by subjecting an aromatic compound having a phenolic hydroxy group (hereafter, referred to simply as "phenols") and aldehydes to addition condensation in the presence of an acid catalyst.

Examples of phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-methylphenol, p-phenylphenol, resorcinol, hydroquinone, hydroquinone monomethyl ether, pyrogallol, phloroglucinol, hydroxydiphenyl, bisphenol A, gallic acid, gallic acid esters, α-naphthol, and β-naphthol.

Examples of aldehydes include formaldehyde, furfural, benzaldehyde, nitrobenzaldehyde, and acetaldehyde.

The catalyst for the addition condensation reaction is not particularly limited. Examples of acid catalyst include hydrochloric acid, nitric acid, sulfuric acid, formic acid, oxalic acid, and acetic acid.

The weight average molecular weight of the novolak resin is preferably 1,000 to 50,000.

[Solvent]

The solvent contained in the acidic composition may be water or an organic solvent. The solvent is not particularly limited as long as it does not dissolve the basic layer, and may be appropriately selected depending on the acidic composition material and resist composition to be used. In the present invention, it is preferable to use an organic solvent.

When water is used as the solvent, pure water is preferable. Alternatively, when an organic solvent is used, a ketone solvent, an ester solvent, an alcohol solvent, an amide solvent or an ether solvent may be used alone, or a mixed solvent of two or more of these solvents may be used.

In the present invention, among the above examples, it is preferable to use a volatile organic solvent. By virtue of the acidic composition containing an organic solvent, the solvent can be rapidly dried after applying the acidic composition. By rapidly drying the solvent, the heat treatment step after applying the acidic composition (bake treatment) may be omitted.

In the method of forming a resist pattern according to the present invention, by including steps A to C', for example, in the case where the resist pattern formed in step A is a contact hole pattern, the hole diameter can be reduced, and in the case of a line and space pattern, the space width can be reduced, and hence, a finer pattern can be formed.

More specifically, for example, by conducting step B and step C', the pattern width P1 of the resist pattern shown in FIG. 2 can be reduced to P2 shown in FIG. 2(E).

[Step B1]

Further, the method of forming a resist pattern according to the present invention preferably further includes, after step C', step B1 in which a basic composition is applied to cover the acidic layer c1, so as to form a basic layer b2.

Figure 3:
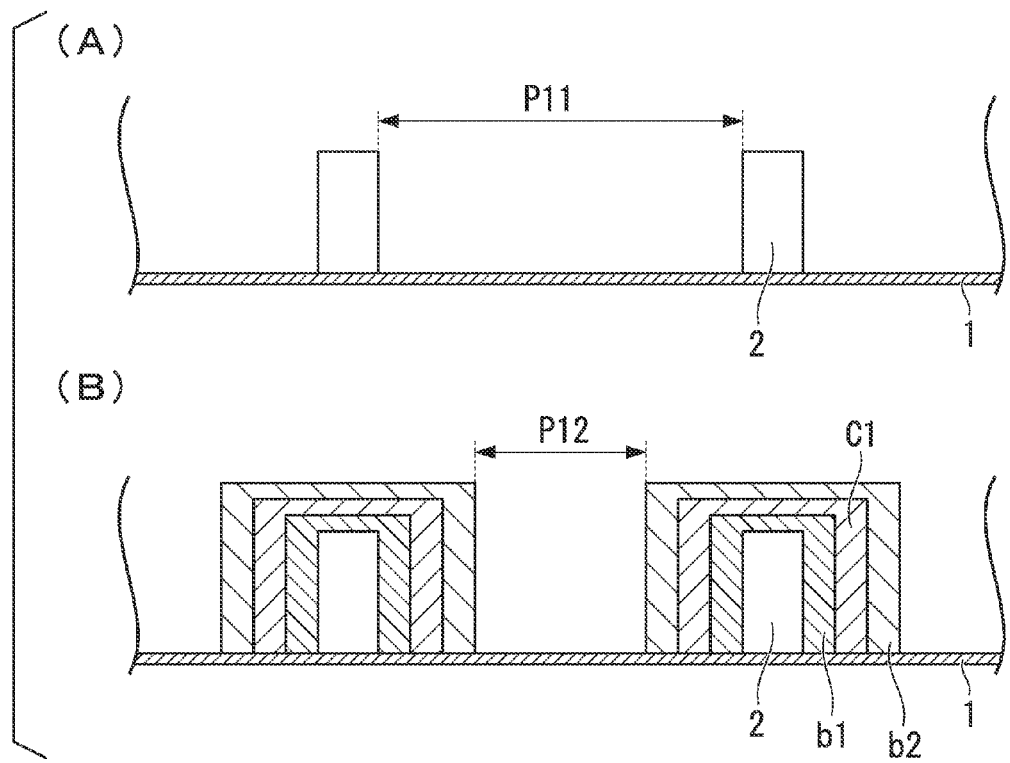
FIG. 3 is a diagram showing one example of schematic steps of the method of forming a resist pattern according to the present invention.

More specifically, as shown in FIG. 3(B), it is preferable to form a basic layer b1 on the surface of the resist pattern 2 formed in step A, form an acidic layer c1 on the surface of the basic layer b1, and apply a basic composition to cover the acidic layer c1, so as to form a basic layer b2. In this manner, the pattern width P11 of the resist pattern shown in FIG. 3(A) can be reduced to P12 as shown in FIG. 3(B).

The explanation of the basic composition used in step B1 is the same as the explanation of the basic composition described above in relation to step B.

[Step C1]

Further, the method of forming a resist pattern according to the present invention preferably further includes, after step B1, step C1 in which an acidic composition is applied to cover the basic layer b2, so as to form an acidic layer c2.

Figure 4:
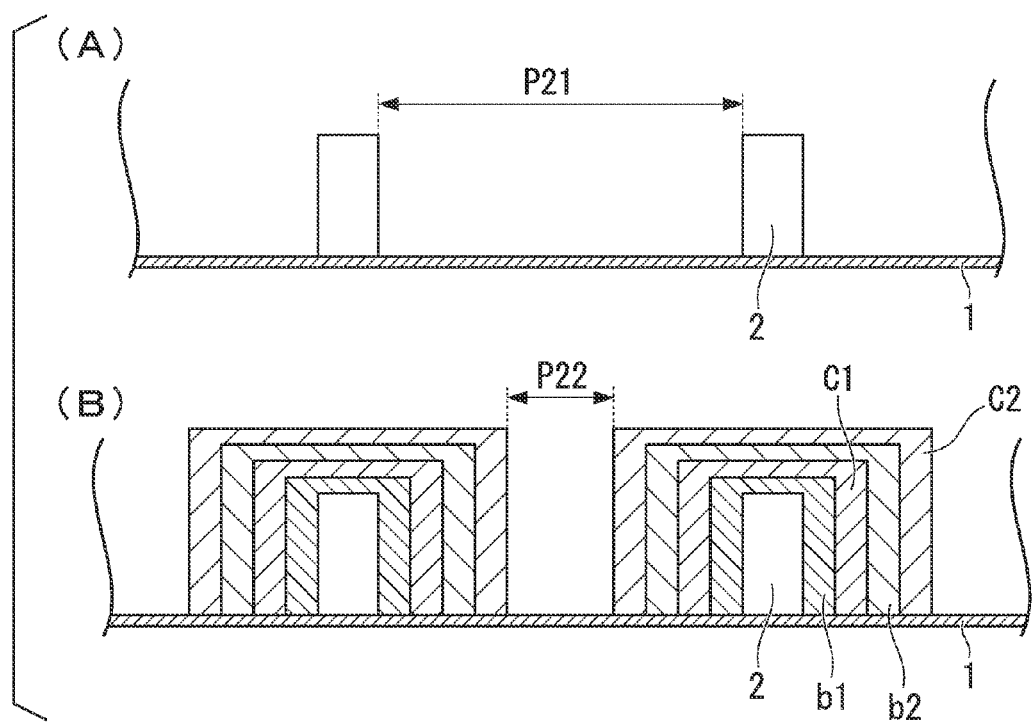
FIG. 4 is a diagram showing one example of schematic steps of the method of forming a resist pattern according to the present invention.

More specifically, as shown in FIG. 4(B), it is preferable to form a basic layer b1 on the surface of the resist pattern 2 formed in step A, form an acidic layer c1 on the surface of the basic layer b1, form a basic layer b2 on the surface of the acidic layer c1, and apply an acidic composition to cover the basic layer b2, so as to form an acidic layer c2. In this manner, the pattern width P21 of the resist pattern shown in FIG. 4(A) can be reduced to P22 as shown in FIG. 4(B).

The explanation of the acidic composition used in step C1 is the same as the explanation of the acidic composition described above in relation to step C.

[Optional Steps: Step $B_{n+1}$ and $C_{n+1}$]

In the present invention, in addition to step B1 and step C1, a step of applying a basic composition to cover the acidic layer, so as to form a basic layer, and a step of applying an acidic composition to cover the basic layer, so as to form an acidic layer, may be conducted a plurality of times.

Figure 5:
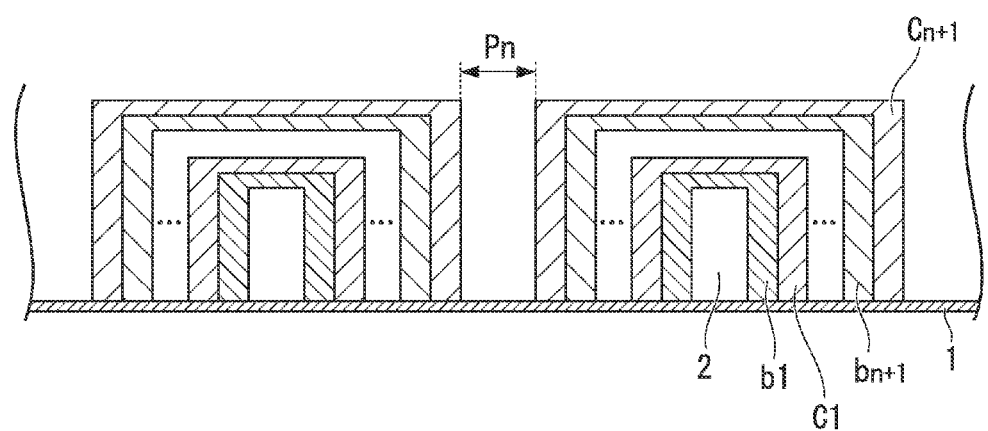
FIG. 5 is a diagram showing one example of schematic steps of the method of forming a resist pattern according to the present invention.

For example, step B and step C' may be conducted n times (n is a natural number) to form basic layer $b_{n+1}$ and acidic layer $c_{n+1}$, so as to obtained a desired shrunk pattern Pn as shown in FIG. 5. The repeating number n of step B and step C' may be appropriately adjusted, depending on the size of the desired shrunk pattern.

[Step D]

The present invention includes a step D in which the covered first resist pattern is developed.

By step D, excess basic composition in step C and unreacted basic composition are removed.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

In the present embodiment, the developing treatment may be either an alkali developing process or a solvent developing process, but in terms of efficiency of removing the basic composition, a solvent developing process is preferable.

By step D, as shown in FIG. 1(d), on the surface of the first resist pattern 2, a thickened pattern is formed by the formation of the developing solution insoluble region 2a. In this manner, in the case of a hole pattern, a shrunk pattern in which the hole diameter is reduced is formed, and in the case of a line and space pattern, a shrunk pattern in which the space width is reduced is formed.

According to the present invention, the first resist pattern can be reduced 5 to 30%, and more preferably reduced 8 to 20%.

[Second Aspect]

A second aspect of the present invention is a method of forming a resist pattern, including: step A in which a first resist pattern is formed on a substrate, step B in which a basic composition is applied to cover the first resist pattern, step C in which a base contained in the basic composition and the first resist pattern are neutralized to form a developing solution insoluble region on a surface of the first resist pattern, and step D in which the covered first resist pattern is developed, the basic composition containing a basic component, and the basic component containing a polymeric compound having a neutralization group in at least one terminal of the main chain thereof.

The explanation of step A, step B, step C and step D in the second aspect is the same as defined for the first aspect. Further, the explanation of the basic composition and the polymeric compound (X) in the second aspect is the same as defined for the basic composition and the polymeric compound (X) in the first aspect.

<<Shrink Agent Composition>>

Further, according to the second aspect, there can be provided a shrink agent composition usable for covering a resist pattern to thicken the resist pattern, the shrink agent composition containing a basic component, and the basic component including a basic composition containing a polymeric compound (X) having a neutralization group in at least one terminal of the main chain thereof.

The explanation of the polymeric compound (X) contained in the shrink agent composition according to the second aspect is the same as the explanation of the polymeric compound (X) in the first aspect.

[Third Aspect]

A third aspect of the present invention is a method of forming a resist pattern in which a first resist pattern is thickened to form a pattern, the method including: a step A in which a first resist pattern is formed on a substrate; a step B in which a shrink agent composition is applied to the substrate having the first resist pattern formed thereon to form a shrink agent layer; a step C in which a developing solution insoluble region is formed on a surface of the first resist pattern having the shrink agent composition covered thereon obtained in step B; and a step D in which the developing solution insoluble region formed in step C is removed, the developing solution insoluble region formed in step C is a contacted portion of the first resist pattern with the shrink agent layer, the shrink agent composition containing a polymeric compound (X), and the glass transition temperature of the polymeric compound (X) being 100° C. or higher.

The explanation of step A, step B, step C and step D in the third aspect is the same as defined for the first aspect.

Further, the explanation of the shrink agent composition in the third aspect is the same as defined for the basic composition in the first aspect.

In the third aspect, instead of the polymeric compound (X), a cross-linkable polymeric compound (hereafter, referred to as "polymeric compound (XC)") may be used.

[Polymeric Compound (XC)]

The polymeric compound (XC) is preferably a polymeric compound having a glass transition temperature of 100° C. or higher and a structural unit (x2) represented by general formula (x2-1) shown below.

[Chemical Formula 68.]

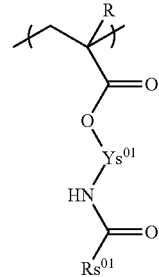

(x2-1)

In the formulae, R represents a hydrogen atom, an alkyl group of 1 to 5 carbon atoms or a halogenated alkyl group of 1 to 5 carbon atoms; $Ys^{01}$ represents a single bond or a divalent linking group;

and $Rs^{01}$ represents a residual group of an isocyanate protective agent.

In general formula (x2-1), R is the same as defined for R in the aforementioned general formula (x1-1).

$Ys^{01}$ represents a single bond or a divalent linking group. The divalent linking group for $Ys^{01}$ is the same as defined for the divalent linking group for $Ya^{21}$ in general formula (a2-1) described later. Among the divalent linking groups for $Ya^{21}$ in general formula (a2-1) described later, a divalent hydrocarbon group which may have a substituent is preferable, and a linear or branched aliphatic hydrocarbon group of 1 to 10 carbon atoms is more preferable.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

In general formula (x2-1), $Rs^{01}$ represents a residual group of an isocyanate protective agent.

Examples of the protective agent include phenolic protective agents, such as phenol, cresol, xylenol, ethylphenol, o-isopropylphenol, a butylphenol, such as p-tert-butylphenol, p-tert-octylphenol, nonylphenol, dinonylphenol, styrenated phenol, oxybenzoate, thymol, p-naphthol, p-nitrophenol, and p-chlorophenol; alcoholic protective agents, such as methanol, ethanol, propanol, butanol, ethylene glycol, methyl cellosolve, butyl cellosolve, methyl carbitol, benzyl alcohol, phenyl cellosolve, furfuryl alcohol, and cyclohexanol; active methylene protective agents, such as dimethyl malonate, diethyl malonate, methyl acetoacetate, ethyl acetoacetate, acetylacetone; mercaptan protective agents, such as butyl mercaptan, thiophenol, and tert-dodecyl mercaptan; amine protective agents, such as diphenylamine, phenylnaphthylamine, aniline, and carbazole; acid amide protective agents, such as acetanilide, acetaniside, acetic acid amide, and benzamide; lactam protective agents, such as ε-caprolactam, δ-valerolactam, γ-butyrolactam, β-propiolactam; acid imide protective agents, such as succinimide and maleimide; imidazole protective agents, such as imidazole, 2-methylimidazole, and 2-ethylimidazole; pyrazole protective agents, such as pyrazole, 3, 5-dimethyl-1H-pyrazole; urea protective agents, such as urea, thiourea, and ethyleneurea; carbamate protective agents, such as phenyl N-phenylcarbamate, and 2-oxazolidine; imine protective agents, such as ethyleneimine, polyethyleneimine, and propan-2-imine; oxime protective agents, such as formaldoxime, acetaldoxime, acetoxime, methyl ethyl ketoxime, methyl isobutyl ketoxime, and cyclohexanone oxime; and hydrogen sulfite protective agents, such as sodium hydrogen sulfite and potassium hydrogen sulfite. These block agents may be used alone, or in a combination of two or more.

Among these examples, phenolic protective agents, lactam protective agents, alcoholic protective agents, oxime protective agents, pyrazole protective agents and imine protective agents are preferable, and nonylphenol, styrenated phenol, oxybenzoate, acetoxime, methyl ethyl ketoxime, ε-caprolactam, pyrazole, 3, 5-dimethyl-1H-pyrazole, and propan-2-imine are most preferable.

"Residual group of an isocyanate protective agent" refers to a group in which a hydrogen atom has been removed from the above protective agent.

The protective group protects an isocyanate group which is highly reactive. However, by heating to a temperature of the dissociation temperature or higher, the protective group leaves to generate an isocyanate group. As a result, a cross-linked structure is formed with the resist pattern, so as to thicken the pattern.

As the residual group of the isocyanate protective group for $Rs^{01}$, more specifically, a nitrogen-containing cyclic group may be given as a preferable example.

Examples of the nitrogen-containing cyclic group for $Rs'''$ include groups represented by any one of (bc-r-1) to (bc-r-8) shown below.

[Chemical Formula 69.]

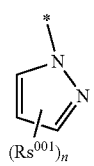

(bc-r-1)

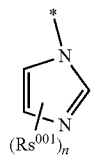

(bc-r-2)

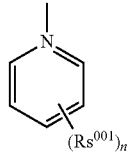

(bc-r-3)

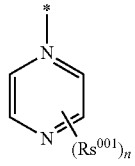

(bc-r-4)

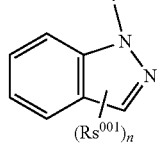

(bc-r-5)

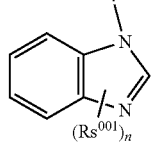

(bc-r-6)

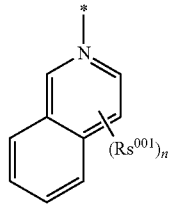

(bc-r-7)

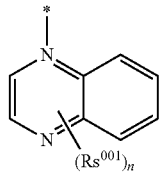

(bc-r-8)

In the formulae, $Rs^{001}$ represents an alkyl group of 1 to 5 carbon atoms; n represents an integer of 0 to 3; and * represents a valence bond.

Examples of the alkyl group of 1 to 5 carbon atoms for $Rs^{001}$ include a methyl group, an ethyl group, a propyl group, a butyl group, and a pentyl group, and a methyl group or an ethyl group is preferable.

Specific examples of structural units represented by general formula (x2-1) are shown below. In the specific examples, R represents a hydrogen atom, an alkyl group of 1 to 5 carbon atoms or a halogenated alkyl group of 1 to 5 carbon atoms.

[Chemical Formula 70.]

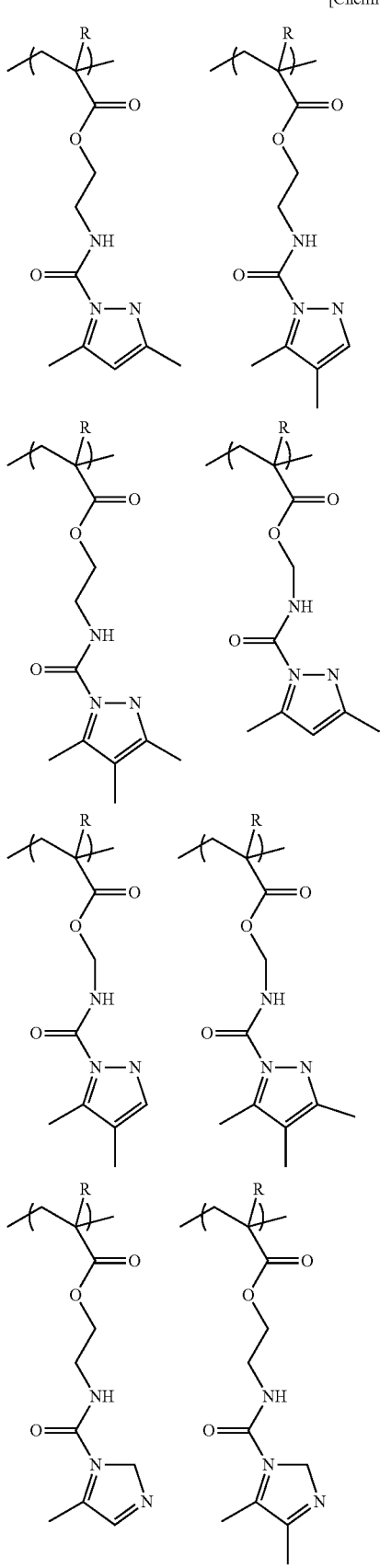

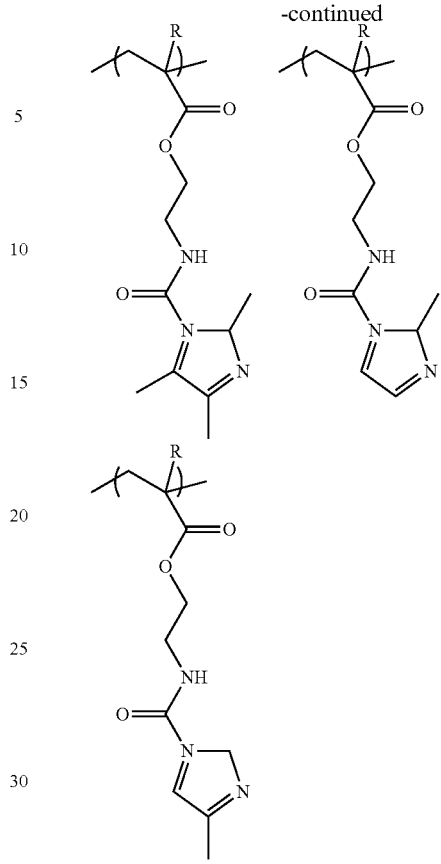

In the present invention, when the resist pattern covered with the shrink agent composition containing the polymeric compound (XC) is heated to a dissociation temperature or higher, the protective group within the structural unit (x2) in the polymeric compound (XC) is eliminated, an isocyanate group is formed. The isocyanate group reacts with a hydroxy group, a lactone, an acid anhydride, an ester or the like (hereafter, referred to as "hydroxy group and the like") on the surface of the resist pattern, and the cross-linking reaction proceeds.

The reaction formula (BC)-1 below shows the protective group being eliminated by heating, and the generated isocyanate group reacting with a primary hydroxy group. The reaction formula (BC)-1 below merely shows the protective group being eliminated by heating, and the generated isocyanate group reacting with a primary hydroxy group, and by no means limit the interpretation of the present invention.

[Chemical Formula 71.]

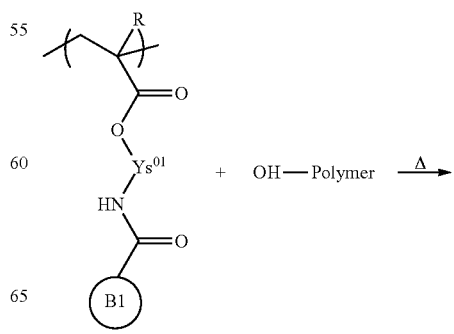

[Chemical Formula 72.]

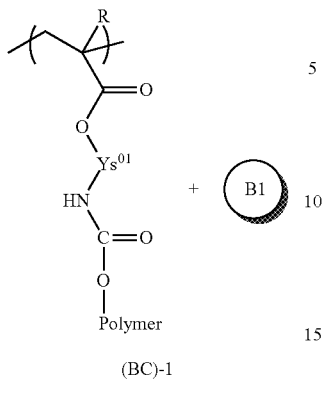

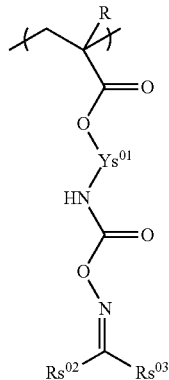

(BC)-1

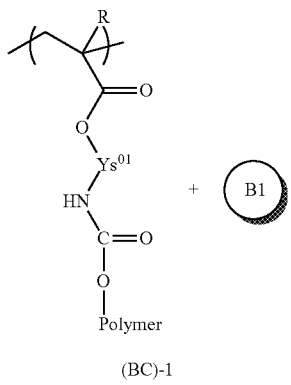

(BC)-1

In the formulae, R represents a hydrogen atom, an alkyl group of 1 to 5 carbon atoms or a halogenated alkyl group of 1 to 5 carbon atoms; $Ys^{01}$ represents a divalent group; B1 represents a residual group of an isocyanate protective agent; and A represents heat.

In the reaction formula (BC)-1, R and $Ys^{01}$ are the same as defined above. In the reaction formula (BC)-1, B1 represents a residual group of an isocyanate protective agent. In the present invention, as B1, the same residual groups of an isocyanate protective agent as those described above for $Rs^{01}$ may be given as examples.

In the present invention, when the resist pattern covered with the shrink agent composition containing the polymeric compound (XC) is heated to a dissociation temperature or higher, the resist pattern can be thickened, so as to recover the pattern.

The reason is as follows. In the case of forming a solvent developing negative-tone pattern as the pattern to be thickened, hydrophilic groups become present on the surface of the resist pattern.

Therefore, when protective groups are eliminated by heating, the generated isocyanate groups react with acid groups and the like, and the cross-linking reaction proceeds to form cross linked structures, so as to thicken the pattern.

In the present invention, the polymeric compound (XC) may have a structural unit represented by general formula (X2)-2 shown below.

(x2-2)

In the formulae, R represents a hydrogen atom, an alkyl group of 1 to 5 carbon atoms or a halogenated alkyl group of 1 to 5 carbon atoms; $Ys^{01}$ represents a divalent linking group; $Rs^{02}$ and $Rs^{03}$ each independently represents a group selected from a methyl group, an ethyl group, an n-propyl group, an n-butyl group and an n-pentyl group.

In (x2)-2, R and $Ys^{01}$ are the same as defined above.

$Rs^{02}$ and $Rs^{03}$ each independently represents a group selected from a methyl group, an ethyl group, an n-propyl group, an n-butyl group and an n-pentyl group, and a methyl group or an ethyl group is preferable. Specific examples of compounds represented by general formula (x2)-2 are shown below. In the specific examples, R represents a hydrogen atom, an alkyl group of 1 to 5 carbon atoms or a halogenated alkyl group of 1 to 5 carbon atoms.

[Chemical Formula 73.]

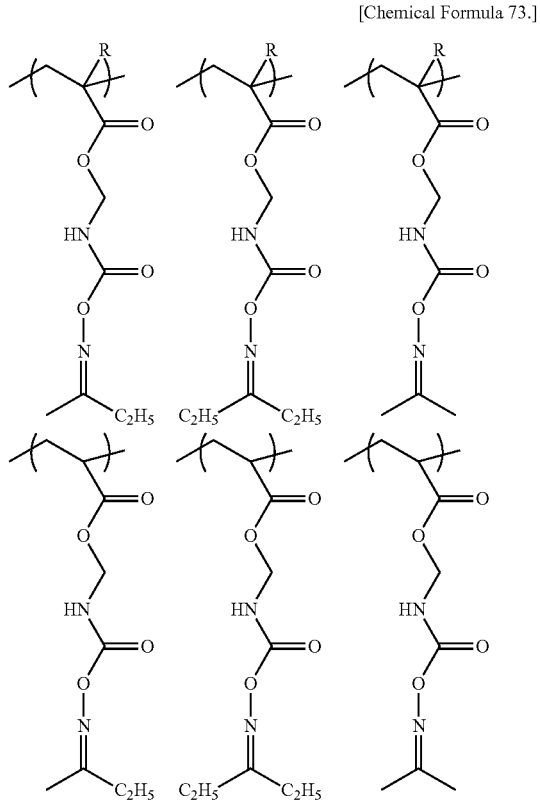

-continued

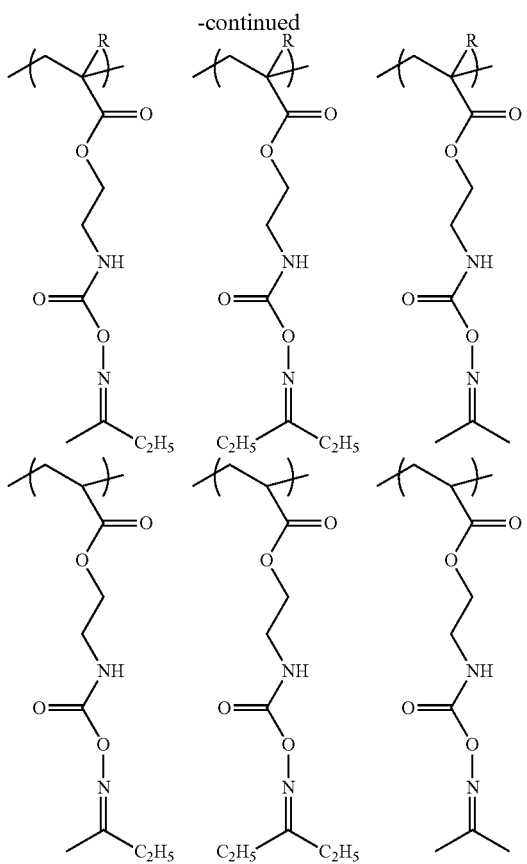

The structural unit (x2) may be derived from a commercially available compound. Examples of commercially available compounds include Karenz MOI-BM (registered trademark) and Karenz MOI-BP (registered trademark) manufactured by Showa Denko.

The amount of the structural unit (x2) may be appropriately selected depending on the solvent, and the kind and amount of other resin(s). In general, the amount of the structural unit (x2) based on the total solid content of the cross-linking composition is preferably 1 to 100% by weight, more preferably 5 to 90% by weight, and most preferably 10 to 85% by weight.

In the present invention, the polymeric compound (XC) may include only the structural unit (x2). Alternatively, a polymeric compound having the structural unit (x2) and another structural unit may be used. As the other structural unit, a structural unit (x3) having a cyclic group is preferable.

Preferable examples of the structural unit (x3) include the aforementioned structural unit (a1) containing an acid decomposable group that exhibits increased polarity by the action of acid, a structural unit (a2) containing a lactone-containing cyclic group or an —$SO_2$— containing cyclic group, a structural unit (a4) containing an acid non-dissociable cyclic group, and the aforementioned structural unit (st) derived from styrene.

In the present invention, it is preferable to use a copolymer of the structural unit (x2) and a structural unit (a4) containing an acid non-dissociable cyclic group; a copolymer of the structural unit (x2) and a structural unit (a1) containing an acid decomposable group that exhibits increased polarity by the action of acid; or a copolymer of the structural unit (x2) and a structural unit (a2) containing a lactone-containing cyclic group. Among these examples, it is particularly desirable to use a copolymer of the structural unit (x2) and a structural unit (a4) containing an acid non-dissociable cyclic group.

In this case, the amount of the structural units (a1), (a2), (a4) and (st) within the cross-linking composition, based on the combined total of all structural units constituting the cross-linking composition is preferably 20 to 90 mol %, more preferably 20 to 85 mol %, and still more preferably 30 to 80 mol %.

The polymeric compound (XC) can be obtained, for example, by a conventional radical polymerization or the like of the monomers corresponding with each of the structural units, using a radical polymerization initiator such as azobisisobutyronitrile (AIBN) or dimethyl 2,2'-azobis (isobutyrate).

In the present invention, the weight average molecular weight (Mw) (the polystyrene equivalent value determined by gel permeation chromatography) of the polymeric compound (XC) is not particularly limited, but is preferably 1,000 to 1,000,000, more preferably 1,000 to 10,000,000, more preferably 1,500 to 500,000, and most preferably 2,000 to 300,000.

As the polymeric compound (XC), one kind of compound may be used alone, or two or more kinds of compounds may be used in combination.

<Shrink Agent Composition>

Further, according to the second aspect, there can be provided a shrink agent composition usable for covering a resist pattern to thicken the resist pattern, the shrink agent composition containing a polymeric compound (X) having a glass transition temperature of 100° C. or higher.

The explanation of the polymeric compound (X) contained in the shrink agent composition according to the second aspect is the same as the explanation of the polymeric compound (X) in the first aspect.

[Fourth Aspect]

A fourth aspect of the present invention is a method of forming a resist pattern, including: a step A in which a first resist pattern is formed on a substrate; a step B in which a shrink agent composition is applied to the first resist pattern; a step C in which a developing solution insoluble region is formed on a surface of the first resist pattern having the shrink agent composition covered thereon obtained in step B; and a step D in which the covered first resist pattern is developed, the shrink agent composition containing a polymeric compound (X), and the polymeric compound (X) having a dispersity (weight average molecular weight/number average molecular weight) of 1.5 or less.

The explanation of step A, step B, step C and step D in the fourth aspect is the same as defined for the first aspect. Further, the explanation of the shrink agent composition and the polymeric compound (X) in the fourth aspect is the same as defined for the basic composition and the polymeric compound (X) in the first aspect.

Further, according to the fourth aspect, there can be provided a shrink agent composition usable for covering a resist pattern to thicken the resist pattern, the shrink agent composition containing a polymeric compound (X), the polymeric compound (X) having a dispersity (weight average molecular weight/number average molecular weight) of 1.5 or less.

Furthermore, according to the fourth aspect, there can be provided a method of producing the shrink agent composition of the fourth aspect, the method including a step of purifying by reprecipitation.

[Fifth Aspect]

A fifth aspect of the present invention is a method of forming a resist pattern, including: step A in which a resist pattern is formed on a substrate; a step B in which a basic composition is applied to cover the resist pattern, so as to form a basic layer b1; and a step C' in which an acidic composition is applied to cover the basic layer b1, so as to form an acidic layer c1.

The explanation of step A, step B and step C' in the fifth aspect is the same as defined for the first aspect. Further, the explanation of the basic composition in the second aspect is the same as defined for the basic composition in the first aspect.

[Sixth Aspect]

A sixth aspect of the present invention is a method of forming a resist pattern in which a resist prepattern is thickened to form a pattern, the method including: a step A in which a resist prepattern is formed on a substrate; a step B in which a pattern thickening polymer composition is applied to the substrate having the resist prepattern formed thereon to cover the resist prepattern, so as to form a polymer film; a step C in which a developing solution insoluble layer is formed on a surface of the resist prepattern; and a step D in which the resist prepattern having the developing solution insoluble layer formed on the surface thereof and the polymer film covering the resist prepattern is developed, so as to form a resist pattern in which the resist prepattern is thickened, the pattern thickening polymer composition including a block copolymer containing a block chain (b1) which has a function of thickening the resist prepattern.

The explanation of step A, step B, step C and step D in the sixth aspect is the same as defined for the first aspect. Further, the explanation of the pattern thickening polymer composition and the block copolymer in the sixth aspect is the same as defined for the basic composition and the block copolymer in the first aspect.

Further, according to the sixth aspect, there can be provided a pattern thickening polymer composition for thickening a resist prepattern, the pattern thickening polymer composition including a block copolymer containing a block chain (b1) which has a function of thickening a resist prepattern.

[Seventh Aspect]

A seventh aspect of the present invention is a method of forming a resist pattern in which a resist prepattern is thickened to form a pattern, the method including: a step A in which a resist prepattern is formed on a substrate; a step B in which a pattern thickening polymer composition is applied to the substrate having the resist prepattern formed thereon to cover the resist prepattern, so as to form a polymer film; a step C in which a developing solution insoluble layer is formed on a surface of the resist prepattern; and a step D in which the resist prepattern having the developing solution insoluble layer formed and the polymer film covering the resist prepattern is developed, so as to form a resist pattern in which the resist prepattern is thickened, the pattern thickening polymer composition including a polymer (P1) having a function of thickening the resist prepattern by itself in the step C and a polymer (P2) which does not have a function of thickening the resist prepattern by itself in the step C.

The explanation of step A, step B, step C and step D in the seventh aspect is the same as defined for the first aspect. Further, the explanation of the pattern thickening polymer composition, the polymer (P1) and the polymer (P2) in the seventh aspect is the same as defined for the basic composition, the polymer (P1) and the polymer (P2) in the first aspect.

Further, according to the seventh aspect, there can be provided a pattern thickening polymer composition for thickening a resist prepattern, the pattern thickening polymer composition including a polymer (P1) having a function of thickening the resist prepattern by itself and a polymer (P2) which does not have a function of thickening the resist prepattern by itself.

EXAMPLES

The present invention will be described more specifically with reference to the following examples, although the scope of the present invention is by no way limited by these examples.

[First Aspect]

[Step (A)]

<Production of Resist Composition>

100 Parts by weight of a polymeric compound (A)-1 shown below, 6 parts by weight of a compound (B)-1 shown below, 3 parts by weight of a compound (D)-1 shown below, 1.5 parts by weight of a polymeric compound (F)-1 shown below, 100 parts by weight of γ-butyrolactone and 4,000 parts by weight of a solvent (a mixed solvent having PGMEA/PGME/cyclohexanone weight ratio of 45/30/25) were mixed together to prepare a resist composition.

[Chemical Formula 74.]

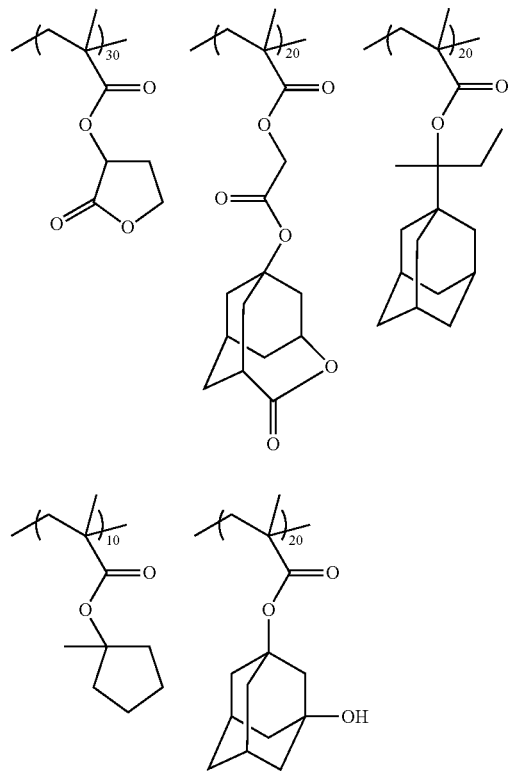

(A)-1

-continued

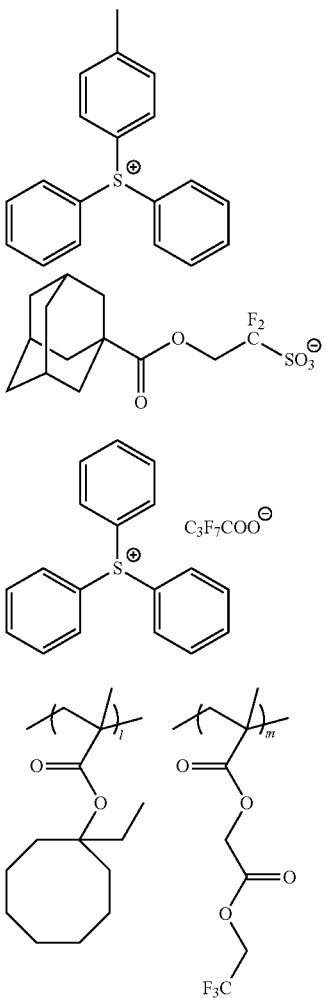

Molar ratio: l/m = 77/23,
Mw = 23,100, Mw/Mn = 1.78

<Formation of Resist Pattern>

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 85 nm.

Then, the resist composition was applied to the film using a spinner, and was then prebaked (PAB) on a hot plate at a bake temperature of 105° C. for 60 seconds and dried, thereby forming a resist film having a film thickness of 85 nm.

Subsequently, the resist film was selectively irradiated with an ArF excimer laser (193 nm) through a mask pattern (6% half tone), using an exposure apparatus NSRX609B (manufactured by Nikon Corporation, NA=1.07 Annular).

Then, a solvent development was conducted for 13 seconds using butyl acetate.

Thereafter, a post exposure bake treatment was conducted at 80° C. (PEB(° C.)) for 60 seconds.

As a result, the following hole pattern (hereafter, referred to as "first resist pattern") was formed.

Target 1: 75 nm mask/110 nm pitch/60 nm CH
Target 2: 155 nm mask/300 nm pitch/60 nm CH

[Step (B)]

<Preparation of Basic Composition>

[Polymer Synthesis Example]

In a separable flask equipped with a thermometer, a reflux tube and a nitrogen feeding pipe, 10.00 g (58.77 mmol) of the compound 1 and 13.24 g (58.77 mmol) of the compound 2 were dissolved in 34.86 g of methyl ethyl ketone (MEK). Then, 11.17 mmol of dimethyl 2,2'-azobis(isobutyrate) (V-601) as a polymerization initiator was added and dissolved in the resulting solution to obtain a dripping solution.

The dripping solution was dropwise added to 12.33 g of MEK heated to 80° C. in a nitrogen atmosphere over 4 hours. Thereafter, the reaction solution was heated for 1 hour while stirring, and then cooled to room temperature.

The obtained reaction polymer solution was dropwise added to an excess amount of n-heptane to precipitate a polymer. Thereafter, the precipitated white powder was separated by filtration, followed by washing with n-heptane, and then drying, thereby obtaining 16.97 g of a polymeric compound 1 as an objective compound. The reaction formula is shown below.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 7,700, and the dispersity was 2.68.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m=50.5/49.5.

[Chemical Formula 75.]

In the same manner as described above, polymeric compounds 2 to 12 were synthesized with the monomer blend shown below. Each of the synthesized polymeric compounds 1A to 12A was dissolved in butyl acetate, so as to prepare basic compositions 1A to 12A. The concentration of the polymeric compound was 1.6%.

TABLE 1

| Polymeric compound | Monomer blend | Compositional ratio | Mw | Mw/Mn |
|---|---|---|---|---|
| 1A | M1/M2 | 50.5/49.5 | 7,700 | 2.68 |
| 2A | M1/M2 | 50.5/49.5 | 16,100 | 2.45 |
| 3A | M1/M2 | 50.2/49.8 | 24,000 | 2.23 |
| 4A | M3/M2 | 51.0/49.0 | 8,200 | 2.26 |
| 5A | M3/M2 | 50.9/49.1 | 51,200 | 2.83 |
| 6A | M3/M2 | 50.6/49.4 | 82,300 | 2.92 |
| 7A | M1/M3/M2 | 31.0/63.7/5.3 | 22,200 | 2.21 |
| 8A | M1/M3/M2 | 30.6/50.9/18.5 | 37,700 | 3.12 |
| 9A | M1/M3/M2 | 49.8/44.1/6.1 | 26,100 | 2.61 |
| 10A | M4/M3/M2 | 50.1/44.4/5.5 | 24,200 | 2.19 |
| 11A | M6/M5/M3/M2 | 20.3/10.1/64.8/4.9 | 21,300 | 1.97 |
| 12A | M7/M2 | 94.6/5.4 | 25,600 | 1.88 |

In the table above, the symbols denoting the monomers (M1 to M7) refer to the monomers having the chemical structures shown below.

[Chemical Formula 76.]

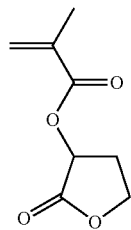

M1

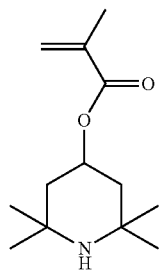

M2

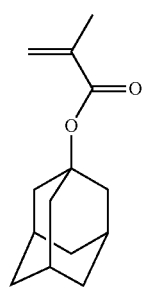

M3

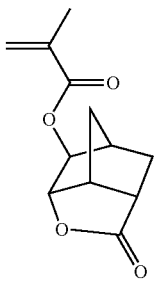

M4

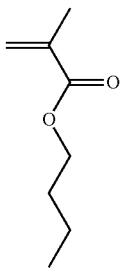

M5

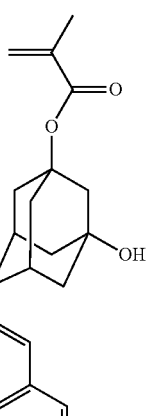

M6

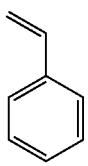

M7

<Application of Basic Compound>

Each of the above basic compositions 1A to 12A was applied using a spinner, so as to cover the above obtained first resist pattern. The examples using basic compositions 1A to 12A were referred to as Examples 1A to 12A, respectively.

The coating film thickness of the basic composition was 60 nm.

[Step C]

The first resist pattern covered with the basic composition obtained in the above step B was heated, so as to neutralize the base within the basic composition with the first resist pattern. The heating temperature at this time is indicated under "Shrink bake (° C.)" in the table below. The heating time was 60 seconds.

[Step D]

After the above step C, a solvent development was conducted for 13 seconds using butyl acetate, so as to remove the unreacted portion of the basic composition. In this manner, the first resist pattern was thickened, and a shrunk pattern in which the hole diameter was reduced was formed.

With respect to the pattern obtained above, the pattern size was evaluated by the method described below.

[Evaluation of Pattern Size]

100 portions in the above pattern were observed from the upper side thereof using a lengthwise measuring scanning electron microscope (SEM) (product name: S-9380, manufactured by Hitachi High-Technologies Corporation; acceleration voltage: 300V), and each line width (nm) was measured. The results are shown in Tables 2 to 5 below under "C.D. (nm)".

The evaluation results of the pattern size are shown in the tables below. In the tables, the "C.D. (nm)" of the first resist pattern is also shown, and the hole diameter at each bake temperature is shown. Further, the difference in the hole diameter between the first pattern and the formed pattern is indicated in Tables 2 to 5 below under "S.V. (nm)".

Furthermore, the shrinkage ratio (%) based on the first resist pattern is shown in Tables 2 to 5 below.

TABLE 2

| 110 nm pitch | First resist pattern | Example 1A | | |
|---|---|---|---|---|
| Dose (mJ/cm²) | | 33 | | |
| Shrink bake (° C.) | — | 100 | 130 | 160 |
| C.D. (nm) | 59.4 | 52.6 | 51.1 | 52.2 |
| S.V. (nm) | — | 6.8 | 8.3 | 7.2 |
| Shrinkage ratio (%) | — | 88.6 | 86.0 | 87.9 |

TABLE 2

| 110 nm pitch | First resist pattern | Example 2A | | |
|---|---|---|---|---|
| Dose (mJ/cm²) | | 33 | | |
| Shrink bake (° C.) | — | 100 | 130 | 160 |
| C.D. (nm) | 59.4 | 50.2 | 50.4 | 49.7 |
| S.V. (nm) | — | 9.2 | 9.0 | 9.7 |

TABLE 2-continued

| 110 nm pitch | First resist pattern | Example 2A | | |
|---|---|---|---|---|
| Shrinkage ratio (%) | — | 84.5 | 84.8 | 83.7 |

TABLE 4

| 300 nm pitch | First resist pattern | Example 1A | | |
|---|---|---|---|---|
| Dose (mJ/cm²) | | 38 | | |
| Shrink bake (° C.) | — | 100 | 130 | 160 |
| C.D. (nm) | 60.4 | 55.2 | 51.1 | 52.0 |
| S.V. (nm) | — | 5.2 | 9.3 | 8.4 |
| Shrinkage ratio (%) | — | 91.2 | 84.6 | 86.0 |

TABLE 5

| 300 nm pitch | First resist pattern | Example 2A | | |
|---|---|---|---|---|
| Dose (mJ/cm²) | | 38 | | |
| Shrink bake (° C.) | — | 100 | 130 | 160 |
| C.D. (nm) | 60.4 | 50.5 | 54.0 | 48.4 |
| S.V. (nm) | — | 9.9 | 6.4 | 12 |
| Shrinkage ratio (%) | — | 83.6 | 89.4 | 80.1 |

Further, in Examples 3A to 19A shown in Table 6 below, steps A to D were conducted in the same manner as described above, and the patterns were evaluated. The neutralization reaction in step C was conducted at a heating temperature shown in Table 6. In Example 10A, neutralization was conducted without heating.

TABLE 6

| | Basic composition | Shrink Bake (° C.) | Dose (mJ/cm²) | S.V. (nm) 75M/110 P | S.V. (nm) 155M/300 P | I-D Bias*(nm) | Scum |
|---|---|---|---|---|---|---|---|
| Example 3A | 1 A | 100 | 33 | 6.8 | 5.1 | −1.7 | ○ |
| Example 4A | 1 A | 130 | 33 | 8.3 | 9.3 | 1 | ○ |
| Example 5A | 1 A | 160 | 33 | 7.2 | 6.3 | −0.9 | ○ |
| Example 6A | 4 A | 100 | 33 | 9.3 | 9.9 | 0.6 | ○ |
| Example 7A | 4 A | 130 | 33 | 9 | 8.4 | −0.6 | ○ |
| Example 8A | 4 A | 160 | 33 | 9.8 | 11.9 | 1.9 | ○ |
| Example 9A | 2 A | 100 | 33 | 7.9 | 8.3 | 0.4 | ○ |
| Example 10A | 2 A | No heating | 33 | 5.8 | 6.7 | 0.9 | ○ |
| Example 11A | 3 A | 100 | 33 | 8.4 | 8.8 | 0.4 | ○ |
| Example 12A | 5 A | 100 | 33 | 12.1 | 10.1 | −2 | ○ |

TABLE 6-continued

|  | Basic composition | Shrink Bake (° C.) | Dose (mJ/cm²) | S.V. (nm) 75M/110 P | S.V. (nm) 155M/300 P | I-D Bias*(nm) | Scum |
|---|---|---|---|---|---|---|---|
| Example 13A | 6 A | 100 | 33 | 12.8 | 10.3 | −2.5 | o |
| Example 14A | 7 A | 100 | 33 | 13.4 | 15 | 1.6 | o |
| Example 15A | 8 A | 100 | 33 | 13.4 | 15.4 | 2 | o |
| Example 16A | 9 A | 100 | 33 | 17.4 | 20 | 2.6 | o |
| Example 17A | 10 A | 100 | 33 | 15.3 | 16.5 | 1.2 | o |
| Example 18A | 11 A | 100 | 33 | 16.2 | 17.5 | 1.3 | o |
| Example 19A | 12 A | 100 | 33 | 18.1 | 18.3 | 0.2 | o |

In Table 6, "S.V. (nm) 75M/110P" indicates the difference in the hole diameter between a 110 pitch pattern and the first resist pattern, and "S.V. (nm) 75M/300P" indicates the difference in the hole diameter between a 300 pitch pattern and the first resist pattern. Further, "I-D Bias*(nm)" indicates the difference between "S.V. (nm) 75M/110P" and "S.V. (nm) 75M/300P".

[Evaluation of Scums]

The shape of the above obtained pattern was observed with a lengthwise measuring SEM and a cross-sectional measuring SEM, and evaluation was made with the following criteria.

(Criteria)

o: No scum was generated after developing x: Scums were generated after developing As seen from the results shown above, in Examples 1A to 19A in which a basic composition was applied and a developing solution insoluble region was formed, the pattern could be satisfactorily shrunk.

Further, even in the case where heating was not conducted during neutralization as in Example 10A, the pattern could be satisfactorily shrunk.

[Second Aspect]

[Step (A)]

<Production of Resist Composition>

100 Parts by weight of a polymeric compound (A)-1 shown below, 6.18 parts by weight of a compound (B)-1 shown below, 3.94 parts by weight of a compound (B)-2 shown below, 3.02 parts by weight of a compound (D)-1 shown below, 3 parts by weight of a polymeric compound (F)-1 shown below, 100 parts by weight of γ-butyrolactone and 4,000 parts by weight of a solvent (a mixed solvent having PGMEA/PGME/cyclohexanone weight ratio of 45/30/25) were mixed together to prepare a resist composition.

[Chemical Formula 77.]

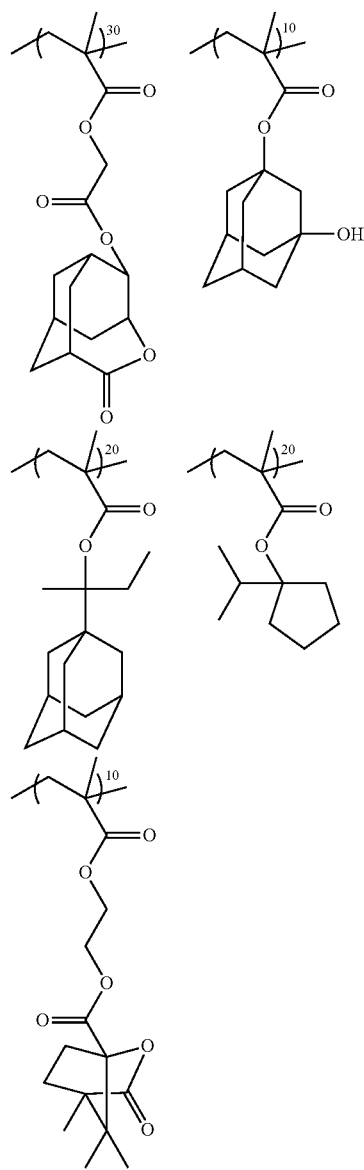

(A)-2

-continued (B)-2

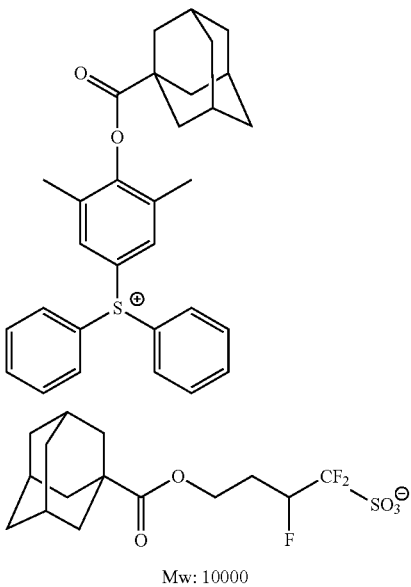

Mw: 10000

[Chemical Formula 78.]

(D)-2

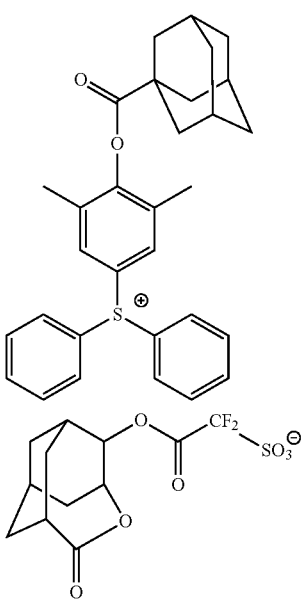

-continued (F)-2

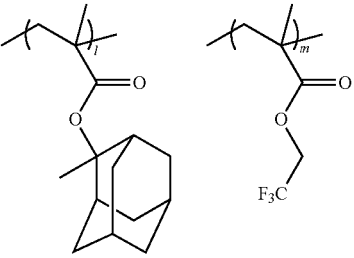

(molar ration: l/m = 50/50); Mw = 15,000

<Formation of Resist Pattern>

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Then, the resist composition was applied to the film using a spinner, and was then prebaked (PAB) on a hot plate at a bake temperature of 110° C. for 60 seconds and dried, thereby forming a resist film having a film thickness of 120 nm.

Subsequently, the resist film was selectively irradiated with an ArF excimer laser (193 nm) through a mask pattern (6% half tone), using an exposure apparatus NSRX609B (manufactured by Nikon Corporation, NA=1.07 Annular).

Then, a solvent development was conducted for 13 seconds using butyl acetate.

Thereafter, a post exposure bake treatment was conducted at 85° C. (PEB(° C.)) for 60 seconds.

As a result, the following hole pattern (hereafter, referred to as "resist pattern") was formed.

Target 1: 75 nm mask/110 nm pitch/60 nm CH

Target 2: 155 nm mask/300 nm pitch/60 nm CH

[Step (B)]

<Synthesis of Basic Polymer 1B>

To a separable flask equipped with a thermometer, a reflux tube and a nitrogen feeding pipe, 37.50 g of propyleneglycol monomethylether acetate (PM)/ethyl lactate (EL)=50/50 wt % was added, and heated to 80° C.

Then, 75.00 g (720.12 mmol) of the monomer M7 below was dissolved in 75.00 g of PM/EL=50/50 wt %, and a solution containing 0.133 g (0.53 mmol) of an initiator 1 shown below was dropwise added as a base-containing initiator in a nitrogen atmosphere over 3 hours. Thereafter, the reaction solution was heated for 4 hour while stirring, and then cooled to room temperature.

The obtained reaction polymer solution was dropwise added to an excess amount of methanol to precipitate a polymer. Thereafter, the precipitated white powder was washed with methanol in an excess amount, followed by washing with pure water in an excess amount and drying, thereby obtaining 10.95 g of a basic polymer 1B as an objective compound (yield: 14.6%).

With respect to the basic polymer 1B, the weight average molecular weight (Mw) and the dispersity (Mw/Mn) were determined by the polystyrene equivalent value as measured by gel permeation chromatography (GPC). As a result, it was found that the weight average molecular weight was 710,000, and the dispersity was 1.46.

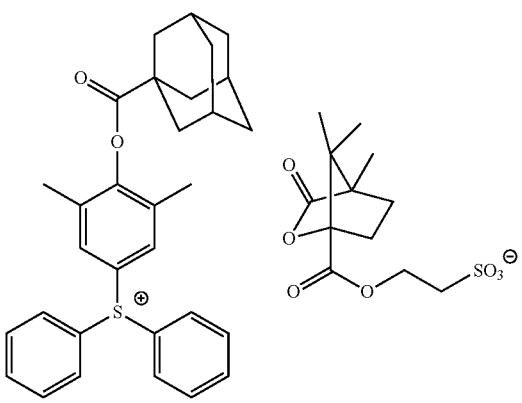

Further, by carbon 13 nuclear magnetic resonance spectroscopy (600 MHz_$^{13}$C-NMR), it was confirmed that the polymer was h-Poly-St (styrene ratio of the polymer: 100%).

The synthesis scheme of the basic polymer 1B is shown below.

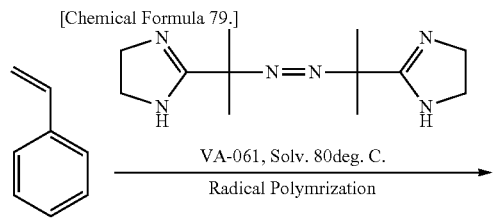

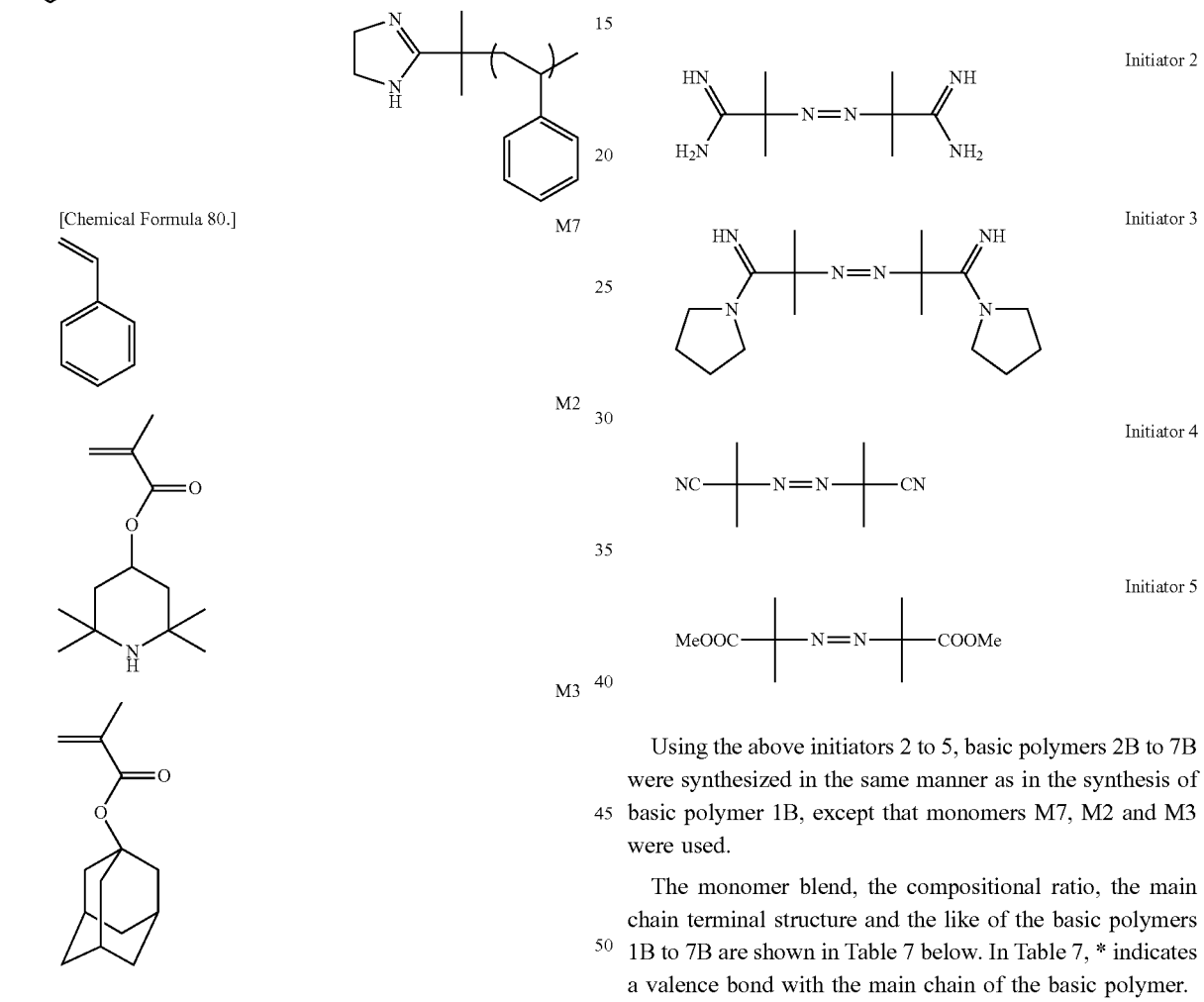

Using the above initiators 2 to 5, basic polymers 2B to 7B were synthesized in the same manner as in the synthesis of basic polymer 1B, except that monomers M7, M2 and M3 were used.

The monomer blend, the compositional ratio, the main chain terminal structure and the like of the basic polymers 1B to 7B are shown in Table 7 below. In Table 7, * indicates a valence bond with the main chain of the basic polymer.

TABLE 7

| Basic polymer | Monomer blend and compositional ratio | Structure of main chain terminal | Mw | Mw/Mn |
|---|---|---|---|---|
| 1B | | | 71000 | 1.46 |

TABLE 7-continued

| Basic polymer | Monomer blend and compositional ratio | Structure of main chain terminal | Mw | Mw/Mn |
|---|---|---|---|---|
| 2B | [styrene]₁₀₀ | HN, H₂N (amidine) | 77600 | 1.44 |
| 3B | [styrene]₁₀₀ | HN, pyrrolidinyl amidine | 75700 | 1.41 |
| 4B | [adamantyl acrylate]₁₀₀ | imidazoline | 44100 | 1.48 |
| 5B | [styrene]₁₀₀ | NC— | 72400 | 1.51 |
| 6B | [styrene]₁₀₀ | MeOOC— | 89500 | 1.48 |
| 7B | [styrene]₉₅ / [2,2,6,6-tetramethylpiperidinyl acrylate]₅ | MeOOC— | 90100 | 1.67 |

<Application of Basic Compound>

Each of the synthesized basic polymers 1B to 7B was dissolved in butyl acetate, so as to prepare basic compositions 1B to 7B. The concentration of each of the basic polymers 1B to 7B was 1.5 parts by weight.

Each of the above basic compositions 1B to 7B was applied using a spinner, so as to cover the above obtained resist pattern.

The coating film thickness of the basic composition was 60 nm.

[Step C]

The resist pattern covered with the basic composition was heated at 80° C. for 60 seconds, so as to react the basic composition and the resist pattern.

[Step D]

After step C, a solvent development was conducted for 13 seconds using butyl acetate. In this manner, the first resist pattern was thickened, and a shrunk pattern in which the hole diameter was reduced was formed.

TABLE 8

|  | Basic polymer | S.V.(nm) 75M/110P | S.V.(nm) 155M/300P | I-D Bias (nm) |
| --- | --- | --- | --- | --- |
| Example 1B | 1B | 10.9 | 12.2 | 1.3 |
| Example 2B | 2B | 10.5 | 11.8 | 1.4 |
| Example 3B | 3B | 10.5 | 11.9 | 1.4 |
| Example 4B | 4B | 13.1 | 14.5 | 1.4 |
| Comparative Example 1B | 5B | Could not shrink | Could not shrink | — |
| Comparative Example 2B | 6B | Could not shrink | Could not shrink | — |
| Reference Example 1B | 7B | 14.9 | 17.9 | 3.0 |

In Table 8, "S.V. (nm) 75M/110P" indicates the difference in the hole diameter between a 110 pitch pattern and the first resist pattern, and "S.V. (nm) 155M/300P" indicates the difference in the hole diameter between a 300 pitch pattern and the first resist pattern. Further, "I-D Bias (nm)" indicates the difference between "S.V. (nm) 75M/110P" and "SN. (nm) 155M/300P".

As shown in Table 8, by applying a basic polymer containing a basic terminal, the difference in the hole diameter between the first resist pattern and the obtained pattern was large, and hence, the pattern could be satisfactorily shrunk.

[Third Aspect]
<Production of Resist Composition>
A resist composition was prepared in the same manner as in the second aspect.
<Preparation of Shrink Agent Composition>
[Polymer Synthesis Example]

In a separable flask equipped with a thermometer, a reflux tube and a nitrogen feeding pipe, 10.00 g (96.02 mmol) of a compound 7 below and 21.64 g (96.02 mmol) of a compound 2 below were dissolved in 47.45 g of methyl ethyl ketone (MEK). Then, 0.929 g (2.10 mmol %, based on all monomers) of dimethyl 2,2'-azobis(isobutyrate) (V-601) as a polymerization initiator was added and dissolved in the resulting solution to obtain a dripping solution.

The dripping solution was dropwise added to 16.78 g of methyl ethyl ketone (MEK) heated to 87° C. in a nitrogen atmosphere over 4 hours. Thereafter, the reaction solution was heated for 1 hour while stirring, and then cooled to room temperature.

The obtained reaction polymer solution was dropwise added to excess mixed solvent of MeOH:water (7:3) to precipitate the polymer, and the precipitated white powder was separated by filtration. The separated powder was washed with a mixed solvent of MeOH:water (7:3) and dried, so as to obtain 4.59 g of a polymer 1C as an objective compound (yield: 14.5%). The reaction formula is shown below.

With respect to the polymer 1C, the weight average molecular weight (Mw) and the dispersity (Mw/Mn) were determined by the polystyrene equivalent value as measured by gel permeation chromatography (GPC). As a result, it was found that the weight average molecular weight was 7,700, and the dispersity was 2.68.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was 1/m=50.5/49.5.

[Chemical Formula 82.]

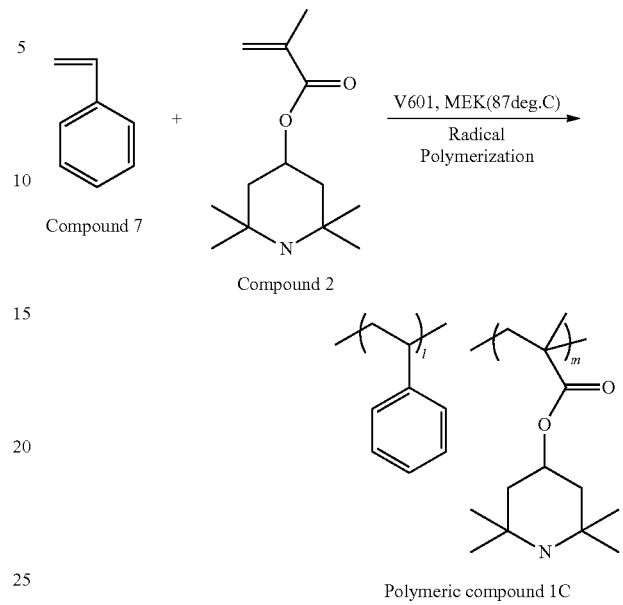

In the same manner as described above, polymers 2C to 7C were synthesized with the monomer blend shown in Table 9 below. The polymer Tg of the polymers 1C to 7C are shown in Table 9.

TABLE 9

| Polymer | Monomer blend | Compositional ratio | Polymer Tg (° C.) | Mw |
| --- | --- | --- | --- | --- |
| 1C | M7/M2 | 50/50 | 116 | 50000 |
| 2C | M3/M2 | 50/50 | 130 | 50000 |
| 3C | M3/M7/M2 | 25/25/50 | 144.3 | 50000 |
| 4C | M7/M2/M8 | 25/50/25 | 122 | 50000 |
| 5C | M7/M2/M9 | 25/50/25 | 118.3 | 50000 |
| 6C | M2/M5 | 50/50 | 70.2 | 50000 |
| 7C | M2/M5 | 20/80 | 41.3 | 50000 |

In Table 9 above, the symbols (M3, M7, M2, M5, M8, M9) refer to compounds having the chemical structures shown below.

[Chemical Formula 83.]

M3

-continued

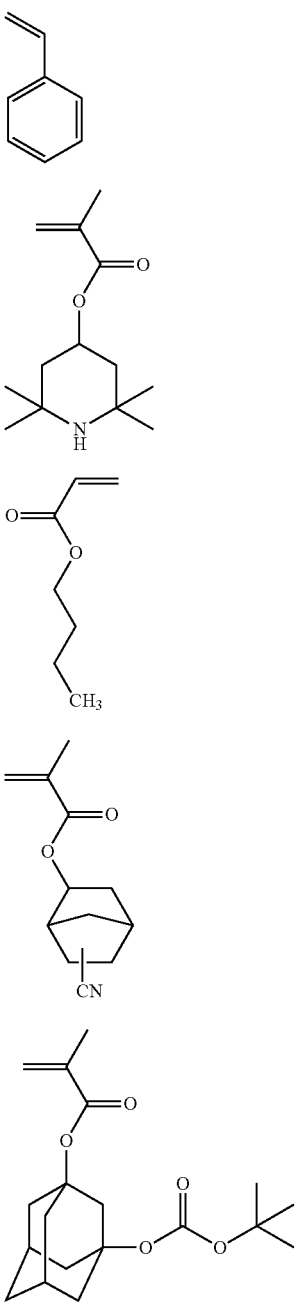

M7
M2
M5
M8
M9

As shown in Table 10, each of the synthesized polymers 1C to 7C was dissolved in butyl acetate, so as to prepare shrink agent compositions 1C to 7C. The concentration of each of the polymers 1C to 7C was 1.6 parts by weight.

TABLE 10

| Shrink agent composition | Polymer | Solvent |
|---|---|---|
| 1C | 1C [1.6] | Butyl acetate [100] |
| 2C | 2C [1.6] | Butyl acetate [100] |
| 3C | 3C [1.6] | Butyl acetate [100] |

TABLE 10-continued

| Shrink agent composition | Polymer | Solvent |
|---|---|---|
| 4C | 4C [1.6] | Butyl acetate [100] |
| 5C | 5C [1.6] | Butyl acetate [100] |
| 6C | 6C [1.6] | Butyl acetate [100] |
| 7C | 7C [1.6] | Butyl acetate [100] |

<Formation of Resist Pattern>

[Step (A)]

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Then, the resist composition was applied to the film using a spinner, and was then prebaked (PAB) on a hot plate at a bake temperature of 110° C. for 60 seconds and dried, thereby forming a resist film having a film thickness of 120 nm.

Subsequently, the resist film was selectively irradiated with an ArF excimer laser (193 nm) through a mask pattern (6% half tone), using an exposure apparatus NSRX609B (manufactured by Nikon Corporation, NA=1.07 Annular).

Then, a solvent development was conducted for 13 seconds using butyl acetate.

Thereafter, a post exposure bake treatment was conducted at 85° C. (PEB(° C.)) for 60 seconds.

As a result, the following hole pattern (hereafter, referred to as "first resist pattern") was formed.

Target X: 55 nm mask/110 nm pitch/55 CH
Target Y: 165 nm mask/330 nm pitch/138 CH

[Step (B)]

Each of the shrink agent compositions 1C to 7C was applied using a spinner, so as to cover the above obtained first resist pattern. As shown in Table 11, the examples using shrink agent compositions 1C to 5C were referred to as Examples 1C to 5C, respectively, and the examples using shrink agent compositions 6C and 7C were referred to as Comparative Examples 1C and 2C, respectively.

The coating film thickness of the shrink agent composition was 60 nm.

[Step C]

The first resist pattern covered with the shrink agent composition obtained in the above step B was heated at 80° C. for 60 seconds, so as to react the shrink agent composition with the first resist pattern. In this manner, a developing solution insoluble region was formed on the inner wall surface of the holes of the first resist pattern.

[Step D]

After the above step C, a solvent development was conducted for 13 seconds using butyl acetate, so as to remove the unreacted portion of the shrink agent composition. In this manner, the first resist pattern was thickened, and a shrunk pattern in which the holes were reduced was formed.

With respect to the shrunk patterns formed by the steps A to D above, the following evaluations were conducted.

[Evaluation of Pattern Size]

Each shrunk pattern was observed from the upper side thereof using a lengthwise measuring scanning electron microscope (SEM) (acceleration voltage: 500V, product name: CG5000, manufactured by Hitachi High-Technologies), and the hole minor axis (X) and the hole major axis (Y) were measured.

With respect to each shrunk pattern, the difference in the hole minor axis between the first resist pattern and the obtained pattern, and the difference in the hole major axis between the first resist pattern and the obtained pattern are respectively indicated under "X-S.V. (nm)" and "Y-S.V. (nm)" in Table 11 below.

Further, the change in the aspect ratio of the hole (oval) before and after shrinking was determined as (Y-S.V.)/(X-S.V.). The results are shown in Table 4 below under "Y/X".

The closer the "Y/X" to 1, the smaller the change in the aspect ratio of the hole cross-section by the pattern shrinking.

TABLE 11

|  | X-S.V.(nm) | Y-S.V.(nm) | Y/X |
|---|---|---|---|
| Example 10 | 11 | 15.4 | 1.4 |
| Example 2C | 12.8 | 16.6 | 1.3 |
| Example 3C | 18.3 | 21.9 | 1.2 |
| Example 4C | 12 | 15.6 | 1.3 |
| Example 5C | 12.2 | 15.9 | 1.3 |
| Comparative Example 10 | 8 | 15.2 | 1.9 |
| Comparative Example 2C | 6 | 12.6 | 2.1 |

As seen from the results shown above, by the method of forming a resist pattern according to the present invention, the difference in the hole diameter between the first resist pattern and the obtained pattern was large, and the Y/X value was close to 1.0. Thus, by the method of forming a resist pattern according to the present invention, the pattern shape of the first resist pattern could be shrunk reliably and in a satisfactory amount.

[Fourth Aspect]

A resist composition was prepared in the same manner as in the first aspect. Using the prepared resist composition, a hole pattern (sometimes referred to as "resist pattern") was formed in the same manner as in the first aspect.

[Step (A)]
<Preparation of Shrink Agent Composition>
[Polymer Synthesis Example]

In a separable flask equipped with a thermometer, a reflux tube and a nitrogen feeding pipe, 10.00 g (58.77 mmol) of the compound 1 and 13.24 g (58.77 mmol) of the compound 2 were dissolved in 34.86 g of methyl ethyl ketone (MEK). Then, 11.17 mmol of dimethyl 2,2'-azobis(isobutyrate) (V-601) as a polymerization initiator was added and dissolved in the resulting solution to obtain a dripping solution.

The dripping solution was dropwise added to 12.33 g of MEK heated to 80° C. in a nitrogen atmosphere over 4 hours. Thereafter, the reaction solution was heated for 1 hour while stirring, and then cooled to room temperature.

The obtained reaction polymer solution was dropwise added to an excess amount of n-heptane to precipitate a polymer. Thereafter, the precipitated white powder was separated by filtration, followed by washing with n-heptane, and then drying, thereby obtaining 16.97 g of a polymeric compound 1D as an objective compound. The reaction formula is shown below.

With respect to the polymeric compound 1D, the weight average molecular weight (Mw) and the dispersity (Mw/Mn) were determined by the polystyrene equivalent value as measured by gel permeation chromatography (GPC). As a result, it was found that the weight average molecular weight was 7,700, and the dispersity was 2.68.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m=50.5/49.5.

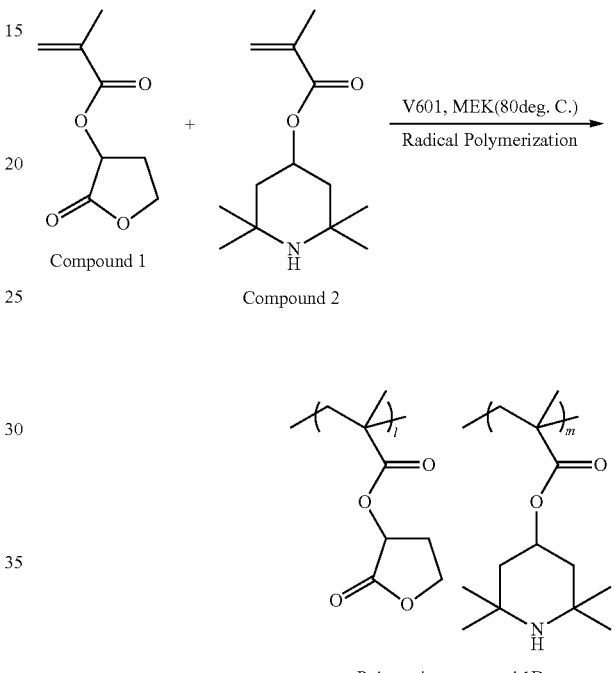

[Chemical Formula 84.]

In the same manner as described above, polymeric compounds 2D to 7D were synthesized with the monomer blend shown below. Each of the synthesized polymeric compounds 1D to 7D was dissolved in butyl acetate, so as to prepare basic compositions 1D to 7D. The concentration of each of the polymers 1D to 7D was 1.6 parts by weight.

TABLE 12

| Polymeric compound | Monomer blend | Compositional ratio | Mw | Mw/Mn |
|---|---|---|---|---|
| 1D | M1/M2 | 50.4/49.6 | 52300 | 2.11 |
| 2D | M1/M2 | 50.3/49.5 | 63000 | 1.45 |
| 3D | M1/M2 | 50.7/49.3 | 62500 | 2.15 |
| 4D | M4/M3/M2 | 40.5/54.3/5.2 | 55700 | 2.05 |
| 5D | M4/M3/M2 | 40.1/54.8/5.1 | 67300 | 1.47 |
| 6D | M7/M2 | 90.1/9.9 | 90100 | 1.92 |
| 7D | M7/M2 | 90.5/9.5 | 115000 | 1.38 |

In the table above, the symbols denoting the monomers (M1 to M4, M7) refer to the monomers having the chemical structures shown below.

[Chemical Formula 85.]

M1 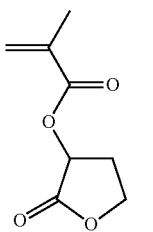

M2 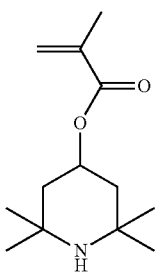

M3 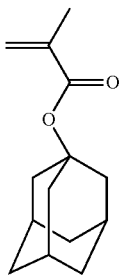

M4 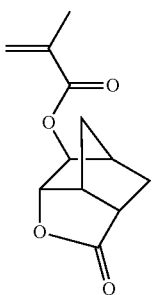

M7 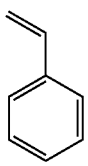

<Application of Shrink Agent Composition>

Each of the above shrink agent compositions 1D to 7D was applied using a spinner, so as to cover the above obtained resist pattern.

The coating film thickness of the shrink agent composition was 60 nm. The correspondence of the Examples and the shrink agent compositions are shown in Table 13.

TABLE 13

| Example 1D | Shrink agent composition 2D |
| Example 2D | Shrink agent composition 5D |
| Example 3D | Shrink agent composition 7D |

TABLE 13-continued

| Comparative Example 1D | Shrink agent composition 1D |
| Comparative Example 2D | Shrink agent composition 3D |
| Comparative Example 3D | Shrink agent composition 4D |
| Comparative Example 4D | Shrink agent composition 6D |

[Step (B)]

The resist pattern covered with the shrink agent composition obtained in the above step A was heated, so as to react the shrink agent composition with the resist pattern. The heating temperature at this time is indicated under "Shrink bake (° C.)" in Table 14 below. The heating time was 60 seconds.

[Step C]

After the above step B, a solvent development was conducted for 13 seconds using butyl acetate, so as to remove the unreacted portion of the shrink agent composition. In this manner, the resist pattern was thickened, and a shrunk pattern in which the holes were shrunk was formed.

In Table 14, "S.V. (nm) 75M/110P" indicates the difference in the hole diameter between a 110 pitch pattern and the first resist pattern, and "S.V. (nm) 155M/300P" indicates the difference in the hole diameter between a 300 pitch pattern and the first resist pattern. Further, "I-D Bias (nm)" indicates the difference between "S.V. (nm) 75M/110P" and "S.V. (nm) 155M/300P".

[Evaluation of Scums]

The shape of the above obtained shrunk pattern was observed with a lengthwise measuring SEM and a cross-sectional measuring SEM, and evaluation was made with the following criteria.

(Criteria)
o: No scum was generated after developing
x: Scums were generated after developing

TABLE 14

| | Shrink Bake (° C.) | Dose (mJ/cm²) | S.V. (nm) 75M/ 110 P | S.V. (nm) 155M/ 300 P | I-D Bias (nm) | Scum |
| --- | --- | --- | --- | --- | --- | --- |
| Example 1D | 100 | 33 | 12.1 | 13.0 | 0.9 | o |
| Example 2D | 100 | 33 | 17.5 | 18.1 | 0.6 | o |
| Example 3D | 100 | 33 | 19.2 | 20.0 | 0.8 | o |
| Comparative Example 1D | 100 | 33 | 10.4 | 11.6 | 1.2 | o |
| Comparative Example 2D | 100 | 33 | 10.9 | 12.0 | 1.1 | o |
| Comparative Example 3D | 100 | 33 | 15.9 | 16.8 | 0.9 | o |
| Comparative Example 4D | 100 | 33 | 17.2 | 18.5 | 1.3 | o |

As seen from the results shown above, in the case where a polymeric compound having a dispersity of 1.5 or less is used as the shrink agent composition, the S.V. improved.

[Fifth Aspect]

A resist composition was prepared in the same manner as in the first aspect.

<Preparation of Basic Composition>

Polymeric compound (XN)-1 below was dissolved in butyl acetate, so as to obtain a basic composition 1E. The concentration of the polymeric compound (XN)-1 was 1.6 parts by weight.

[Chemical Formula 86.]

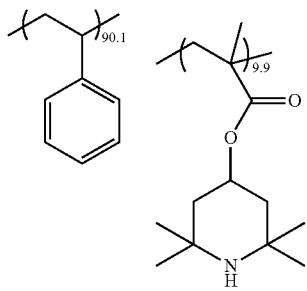

(XN)-1

Mw = 90100
Mw/Mn = 1.92

<Preparation of Acidic Composition>

Polymeric compound (XA)-1 below was dissolved in butyl acetate, so as to obtain an acidic composition 1.

Further, polymeric compound (XA)-2 below was dissolved in butyl acetate, so as to obtain an acidic composition 2. The concentration of the polymeric compounds (XN)-1 and (XN)-2 was 1.6 parts by weight.

[Chemical Formula 87.]

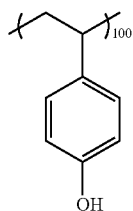

(XA)-1

Mw = 15000, Mw/Mn = 1.10

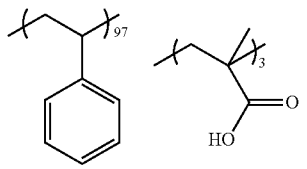

(XA)-2

Mw = 41200, Mw/Mn = 1.85

[Step (A)]
<Formation of Resist Pattern>

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Then, the resist composition was applied to the film using a spinner, and was then prebaked (PAB) on a hot plate at a bake temperature of 105° C. for 60 seconds and dried, thereby forming a resist film having a film thickness of 85 nm.

Subsequently, the resist film was selectively irradiated with an ArF excimer laser (193 nm) through a mask pattern (6% half tone), using an exposure apparatus NSRX609B (manufactured by Nikon Corporation, NA=1.07 Annular).

Thereafter, a post exposure bake treatment was conducted at 80° C. for 60 seconds.

Then, a solvent development was conducted for 13 seconds using butyl acetate.

As a result, the following hole pattern (hereafter, referred to as "resist pattern") was formed.

Target 1: 75 nm mask/110 nm pitch/60 nm CH

[Step (B)]

In examples 1E to 3E, the above basic composition 1E was applied using a spinner, so as to cover the resist pattern obtained in step A.

The coating film thickness of the basic composition 1 was 60 nm.

In Comparative Examples 1E and 2E, acidic compounds 1 and 2 were applied.

Thereafter, a solvent development was conducted for 13 seconds using butyl acetate, so as to remove the unreacted portion of the basic composition, and form a basic layer (sometimes referred to as "first layer").

[Step C']

In Examples 1E to 3E, acidic composition 1 or 2 was applied to cover the first layer obtained in step B.

In Example 1E, acidic composition 1 was applied, and in Examples 2E and 3E, acidic compositions 1 and 2 were applied.

The coating film thickness of the acidic composition 1 was 60 nm.

Thereafter, a solvent development was conducted for 13 seconds using butyl acetate, so as to remove the unreacted portion of the acidic composition, and form a basic layer (sometimes referred to as "second layer").

In Examples 1E and 2E, after step C, post bake was conducted at 80° C. for 60 seconds.

[Step B1]

Further, in Example 3E, basic compound 1E was applied to cover the second layer obtained in the above step C'.

Thereafter, a solvent development was conducted for 13 seconds using butyl acetate, so as to remove the unreacted portion of the basic composition, and form a basic layer 2 (sometimes referred to as "third layer").

In Example 1E, after step B1, post bake was conducted at 80° C. for 60 seconds.

TABLE 15

| | Dose (mJ/cm$^2$) | First layer | Second layer | Third layer | S.V.(nm) 75M/ 110P |
|---|---|---|---|---|---|
| Reference Example 1E | 33 | Basic composition 1E | — | — | 10.8 |
| Example 1E | 33 | Basic composition 1E | Acidic composition 1 | — | 16.7 |
| Example 2E | 33 | Basic composition 1E | Acidic composition 2 | — | 13.5 |
| Example 3E | 33 | Basic composition 1E | Acidic composition 2 | Basic composition 1E | 16.7 |
| Comparative Example 1E | 33 | Acidic composition 1 | — | — | 0 |
| Comparative Example 2E | 33 | Acidic composition 2 | — | — | 0 |

In Table 15, "S.V. (nm) 75M/110P" indicates the difference in the hole diameter between the resist pattern and the pattern with a pitch of 110.

As seen from the results shown above, in Examples 1E and 2E in which a first layer (basic layer) and a second layer (acidic layer) were formed on the surface of the resist pattern, the hole diameter of the resist pattern could be largely reduced.

Further, in Example 3E in which a third layer was formed, the hole diameter could be reduced even more.

[Sixth Aspect]

<Production of Resist Composition>

The components shown in Table 1 were mixed together and dissolved to obtain a chemically amplified resist composition.

TABLE 16

|  | Component (A) | Component (B) | Component (D) | Component (E) | Component (S) |
|---|---|---|---|---|---|
| Chemically amplified resist composition | (A)-1 [100] | (B)-1 [6.0] | (D)-1 [3.0] | (F)-1 [1.50] | (S)-1 [100] (S)-2 [4000] |

In Table 16, the reference characters indicate the following. Further, the values in brackets [ ] indicate the amount (in terms of parts by weight) of the component added.

(A)-3: Polymeric compound represented by chemical formula (A)-3 shown below. The weight average molecular weight (Mw) and the dispersity (Mw/Mn) in terms of the polystyrene equivalent value measured by gel permeation chromatography (GPC) were 9,000 and 1.56, respectively. The composition of the copolymer (ratio (molar ratio) of the respective structural units within the structural formula) as determined by $^{13}$C-NMR was 1/m/n/o/p=30/20/20/10/20.

[Chemical Formula 88.]

(A)-3

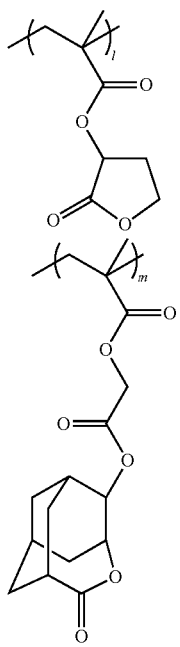

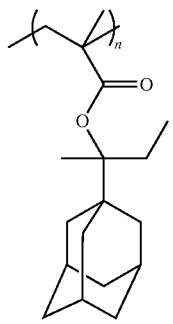

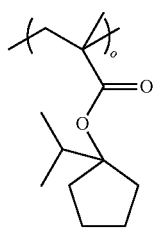

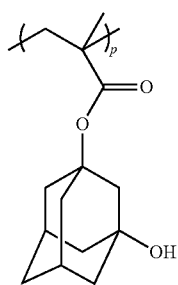

(B)-1: Acid generator consisting of a compound represented by chemical formula (B)-1 above (D)-1: Acid diffusion control agent consisting of a compound represented by chemical formula (D)-1 above (F)-1: Fluorine-containing polymeric compound represented by formula (F)-1 above (S)-1: γ-butyrolactone (S)-2: a mixed solvent of propylene glycol monomethyl ether acetate/propylene glycol monomethyl ether/cyclohexanone=45/30/25 (weight ratio)

<Preparation of Pattern Thickening Polymer Composition>

Copolymers (P)-1 to (P)-19 shown in Table 17 were synthesized by a conventional polymerization method.

Copolymers (P)-1 to (P)-6 were random copolymers in which the arrangement of monomer M7 and monomer M2 were random.

Copolymers (P)-7 to (P)-19 were block copolymers in which a partial constituent component having structural units derived from monomer M7 repeatedly bonded (block chain (b2)) is bonded to a partial constituent component having structural units derived from monomer M2 repeatedly bonded (block chain (b1)).

With respect to the obtained copolymers, the weight average molecular weight and the dispersity (Mw/Mn) determined by the polystyrene equivalent value as measured by GPC are shown in Table 17.

TABLE 17

| Co-polymer | Structure | Polymerization method | Monomer blend ratio [Molar ratio] | Weight average molecular weight (Mw) | Dispersity (Mw/Mn) |
|---|---|---|---|---|---|
| (P)-1 | Random | Radical polymerization | M7/M2 = 99/1 | 23000 | 1.80 |
| (P)-2 | Random | Radical polymerization | M7/M2 = 95/5 | 24000 | 1.35 |
| (P)-3 | Random | Radical polymerization | M7/M2 = 95/5 | 32000 | 1.88 |
| (P)-4 | Random | Radical polymerization | M7/M2 = 95/5 | 63000 | 1.51 |
| (P)-5 | Random | Radical polymerization | M7/M2 = 95/5 | 90000 | 1.78 |
| (P)-6 | Random | Radical polymerization | M7/M2 = 90/10 | 24000 | 1.70 |
| (P)-7 | Block | Living anion polymerization | M7/M2 = 99/1 | 23000 | 1.20 |
| (P)-8 | Block | Living anion polymerization | M7/M2 = 99/1 | 30000 | 1.19 |
| (P)-9 | Block | Living anion polymerization | M7/M2 = 99/1 | 40000 | 1.16 |
| (P)-10 | Block | Living anion polymerization | M7/M2 = 95/5 | 24000 | 1.01 |
| (P)-11 | Block | Living anion polymerization | M7/M2 = 95/5 | 32000 | 1.07 |
| (P)-12 | Block | Living anion polymerization | M7/M2 = 95/5 | 40000 | 1.09 |
| (P)-13 | Block | Living anion polymerization | M7/M2 = 95/5 | 48000 | 1.06 |
| (P)-14 | Block | Living anion polymerization | M7/M2 = 90/10 | 20000 | 1.03 |
| (P)-15 | Block | Living anion polymerization | M7/M2 = 90/10 | 32000 | 1.02 |
| (P)-16 | Block | Living anion polymerization | M7/M2 = 80/20 | 32000 | 1.02 |
| (P)-17 | Block | Living radical polymerization | M7/M2 = 95/5 | 24000 | 1.30 |
| (P)-18 | Block | Living radical polymerization | M7/M2 = 95/5 | 36000 | 1.34 |
| (P)-19 | Block | Living radical polymerization | M7/M2 = 95/5 | 48000 | 1.39 |

In Table 17, the symbols denoting the monomers (M7 and M2) refer to the monomers having the chemical structures shown below.

[Chemical Formula 89.]

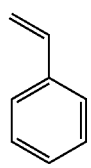
M7

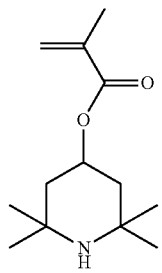
M2

100 Parts by weight of each of the obtained copolymers (P)-1 to (P)-19 was dissolved in 6,500 parts by weight of butyl acetate, so as to obtain a pattern thickening polymer composition.

<Formation of Resist Pattern>

(Comparative Examples 1F to 6F, Examples 1F to 16F)

By the sequence of following steps A, B, C and D, a resist pattern in which a resist prepattern has been thickened was formed.

[Step (A)]

An organic anti-reflection film composition (product name: ARC-29A, manufactured by Brewer Science Ltd.) was applied to a 12-inch silicon wafer using a spinner, and the composition was then baked on a hot plate at 205° C. for 60 seconds, so as to form an organic anti-reflection film having a film thickness of 89 nm, to produce a substrate.

Then, the chemically amplified resist composition was applied to the organic anti-reflection film using a spinner, and was then prebaked (PAB) on a hot plate at a bake temperature of 105° C. for 60 seconds and dried, thereby forming a resist film having a film thickness of 85 nm.

Subsequently, the resist film was selectively irradiated with an ArF excimer laser (193 nm) through each mask pattern (6% half tone) with the following targets (1) to (3), using an exposure apparatus NSRX609B (manufactured by Nikon Corporation, NA=1.07 Annular).

Target (1): Dense CH 110 nm pitch/60 nm CH
Target (2): Iso CH 300 nm pitch/60 nm CH
Target (3): Oval-X 55 nm/Oval-Y 138 nm, Y-CD/X-CD=2.5

Then, a post exposure bake (PEB) treatment was conducted at 80° C. for 60 seconds.

Then, a solvent development was conducted for 13 seconds using butyl acetate.

As a result, a hole pattern was formed as a resist prepattern.

[Step (B)]

To the substrate having the resist prepattern formed thereon was applied the above obtained pattern thickening polymer composition using a spinner to cover the resist prepattern, so as to form a polymer film. The coating film thickness of the polymer film was 60 nm.

[Step C]

After step B, the resist prepattern and the polymer film covering the resist prepattern were heated at a heating temperature indicated in Tables 18 and 19 for 60 seconds.

[Step D]

After step C, a solvent development was conducted for 13 seconds using butyl acetate.

In this manner, a fine hole pattern in which the resist prepattern has been thickened and the hole diameter has been reduced was formed.

<Evaluation of width of thickened portion (shrink volume: S.V.)>

With respect to each hole pattern formed above, the width of the thickened portion (shrink volume: S.V.), which corresponds to "$T_{0a}+T_{0b}(=T_0)$" in FIG. 6(d), was evaluated by the following method.

Each resist pattern and each hole pattern after step D was observed from the upper side of the patterns using a lengthwise measuring scanning electron microscope (SEM) (acceleration voltage: 500V, product name: CG5000, manufactured by Hitachi High-Technologies). With respect to patterns of targets (1) and (2), the hole diameter was measured. With respect to the pattern of target (3), the hole minor axis and the hole major axis were measured.

With respect to the shrink volume of the pattern of target (1), the difference in the hole diameter between the resist prepattern and the hole pattern after step D is indicated in Tables 18 and 19 under "Dense CH".

With respect to the shrink volume of the pattern of target (2), the difference in the hole diameter between the resist prepattern and the hole pattern after step D is indicated in Tables 3 and 4 under "Iso CH".

With respect to the shrink volume of the pattern of target (3), the difference in the hole minor axis between the resist prepattern and the hole pattern after step D is indicated in Tables 18 and 19 under "Oval-X", and the difference in the hole major axis between the resist prepattern and the hole pattern after step D is indicated in Tables 18 and 19 under "Oval-Y".

Further the change in the aspect ratio of the hole (oval) before and after thickening the resist prepattern was determined as (Oval-Y)/(Oval-X). The results are shown in Tables 3 and 4 below under "Y/X". The closer the "Y/X" to 1, the smaller the change in the aspect ratio of the hole cross-section by the thickening of the resist prepattern.

TABLE 18

| | Pattern thickening polymer composition Copolymer | Step C Heating temperature (° C.) | Shrink volume (nm) | | | | |
|---|---|---|---|---|---|---|---|
| | | | Dense CH | Iso CH | Oval-X | Oval-Y | Y/X |
| Comparative Example 1F | (P)-1 | 150 | 7.4 | 9.2 | 7.7 | 7.9 | 1.03 |
| Comparative Example 2F | (P)-2 | 150 | 12.5 | 14.1 | 13.9 | 14.7 | 1.06 |
| Comparative Example 3F | (P)-3 | 150 | 10.9 | 12.7 | 11.2 | 11.4 | 1.02 |
| Comparative Example 4F | (P)-4 | 150 | 10.7 | 12.5 | 11.0 | 11.1 | 1.01 |
| Comparative Example 5F | (P)-5 | 150 | 17.0 | 18.6 | 16.6 | 21.1 | 1.27 |
| Comparative Example 6F | (P)-6 | 150 | 9.8 | 11.1 | 10.4 | 11.3 | 1.09 |

TABLE 19

| | Pattern thickening polymer composition Copolymer | Step C Heating temperature (° C.) | Shrink volume (nm) | | | | |
|---|---|---|---|---|---|---|---|
| | | | Dense CH | Iso CH | Oval-X | Oval-Y | Y/X |
| Ex. 1F | (P)-7 | 150 | 14.8 | 16.0 | 14.7 | 18.0 | 1.22 |
| Ex. 2F | (P)-8 | 150 | 15.2 | 16.4 | 15.4 | 19.1 | 1.24 |
| Ex 3F | (P)-9 | 150 | 15.9 | 17.2 | 16.5 | 20.6 | 1.25 |
| Ex. 4F | (P)-10 | 80 | 18.8 | 19.7 | 18.2 | 20.7 | 1.14 |
| Ex. 5F | (P)-10 | 100 | 19.2 | 20.2 | 18.4 | 21.1 | 1.15 |
| Ex. 6F | (P)-10 | 130 | 19.4 | 20.4 | 19.0 | 22.4 | 1.18 |
| Ex. 7F | (P)-10 | 150 | 20.8 | 21.9 | 20.1 | 25.6 | 1.27 |
| Ex. 8F | (P)-11 | 150 | 27.4 | 28.4 | 25.0 | 34.6 | 1.38 |
| Ex. 9F | (P)-12 | 150 | 30.2 | 32.4 | 27.6 | 43.1 | 1.56 |
| Ex. 10F | (P)-13 | 150 | 30.3 | 33.3 | 27.9 | 44.4 | 1.59 |
| Ex. 11F | (P)-14 | 150 | 18.7 | 19.9 | 18.5 | 23.8 | 1.29 |
| Ex. 12F | (P)-15 | 150 | 24.2 | 25.5 | 22.8 | 30.7 | 1.35 |
| Ex. 13F | (P)-16 | 150 | 21.1 | 22.2 | 20.3 | 26.9 | 1.33 |
| Ex. 14F | (P)-17 | 150 | 16.1 | 17.4 | 16.3 | 20.7 | 1.27 |
| Ex. 15F | (P)-18 | 150 | 18.7 | 19.8 | 18.5 | 24.5 | 1.32 |
| Ex. 16F | (P)-19 | 150 | 25.5 | 26.8 | 25.0 | 34.1 | 1.36 |

As seen from the results shown in Tables 18 and 19, according to Examples 1F to 16F which applied the present invention, the values of the shrink volume are small as compared to Comparative Examples 1F to 6F, and hence, it was confirmed that a hole pattern with a smaller hole diameter was formed.

Therefore, it was found that, by the method of forming a resist pattern according to the present invention, a finer pattern can be formed simply.

From a comparison between Example 7F and Comparative Example 5F (the heating temperature is the same), it can be confirmed that, by using a block copolymer, even in the case of a low-molecular weight polymer, the effect of thickening a resist prepattern can be improved.

[Seventh Aspect]

[Step (A)]

<Production of Resist Composition>

100 Parts by weight of a polymeric compound (A)-4 shown below, 8.7 parts by weight of a compound (B)-4 shown below, 1.11 parts by weight of a compound (B)-5 shown below, 4.55 parts by weight of a compound (D)-2 shown below, 0.1 part by weight of salicylic acid, 1.5 parts by weight of a polymeric compound (F)-1 shown below, 100 parts by weight of γ-butyrolactone and 3,200 parts by weight of a solvent (a mixed solvent having PGMEA/PGME/cyclohexanone weight ratio of 45/30/25) were mixed together to prepare a resist composition.

[Chemical Formula 90.]

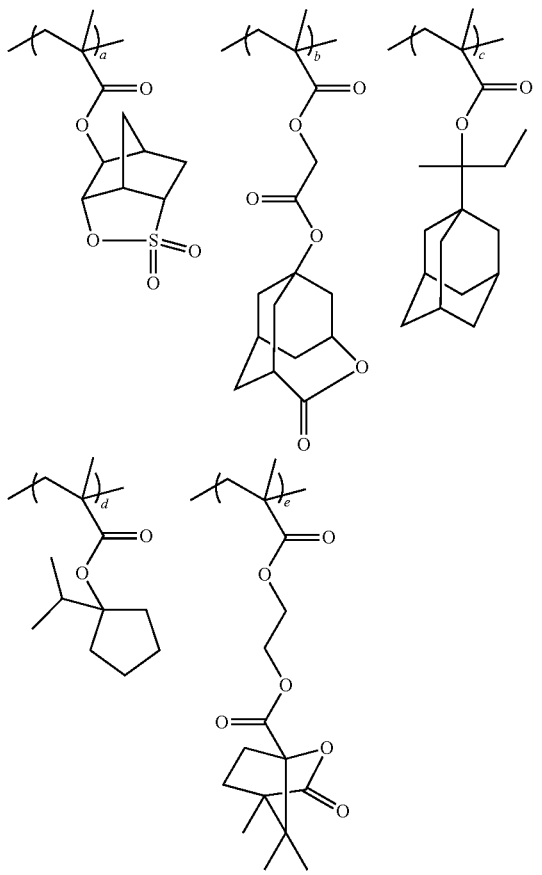

(A)-4

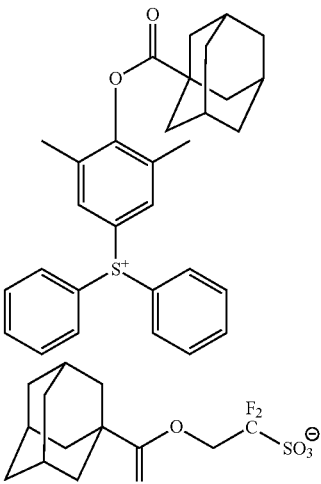

(B)-4

(Molar ratio: a/b/c/d/e = 20/20/20/30/10, Mw = 9000, Mw/Mn = 1.60)

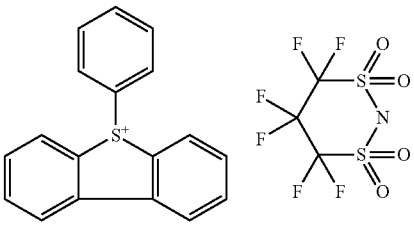

(B)-5

<Formation of Resist Pattern>

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Then, the resist composition was applied to the film using a spinner, and was then prebaked (PAB) on a hot plate at a bake temperature of 90° C. for 60 seconds and dried, thereby forming a resist film having a film thickness of 90 nm.

Subsequently, the resist film was selectively irradiated with an ArF excimer laser (193 nm) through a mask pattern (6% half tone), using an exposure apparatus NSRX609B (manufactured by Nikon Corporation, NA=1.07 Annular).

Then, a solvent development was conducted for 13 seconds using butyl acetate.

Thereafter, a post exposure bake treatment was conducted at 80° C. (PEB(° C.)) for 60 seconds.

As a result, the following hole pattern (hereafter, referred to as "resist prepattern") was formed.

Target X: 65 nm mask/110 nm pitch/55 nm CH
Target Y: 174 nm mask/330 nm pitch/140 nm CH

[Step (B)]

<Preparation of Pattern Thickening Polymer Composition>

[Polymer Synthesis Example: Synthesis of Polymer (P1)]

To a separable flask equipped with a thermometer, a reflux tube and a nitrogen feeding pipe, 97.06 g of propyleneglycol monomethylether acetate (PM) was added, and heated to 80° C.

Further, 180.00 g (1728.28 mmol) of a compound 7 (M7) and 14.12 g (62.68 mmol) of a compound 2 (M2) were dissolved in 194.12 g of PM, and 0.305 g (0.07 mmol % based on all monomers) of dimethyl 2,2'-azobis(isobutyrate) (V-601) as a polymerization initiator was added thereto, so as to obtain a dripping solution. The dripping solution was dropwise added in a nitrogen atmosphere over 4 hours. Thereafter, the reaction solution was heated for 1 hour while stirring, and then cooled to room temperature.

The obtained reaction polymer solution was dropwise added to an excess amount of methanol to precipitate a polymer. Thereafter, the precipitated white powder was washed with methanol in an excess amount, followed by washing with pure water in an excess amount and drying, thereby obtaining 24.84 g of a polymer (P1)-1 as an objective compound (yield: 12.8%).

With respect to the polymer, the weight average molecular weight (Mw) and the dispersity (Mw/Mn) were determined by the polystyrene equivalent value as measured by gel permeation chromatography (GPC). As a result, it was found that the weight average molecular weight was 90,100, and the dispersity was 1.50.

Further, as a result of an analysis by carbon 13 nuclear magnetic resonance spectroscopy (600 MHz $^{13}$C-NMR), it was found that the composition of the copolymer (ratio (molar ratio) of the respective structural units within the structural formula) was 1/m=94/6.

[Chemical Formula 91.]

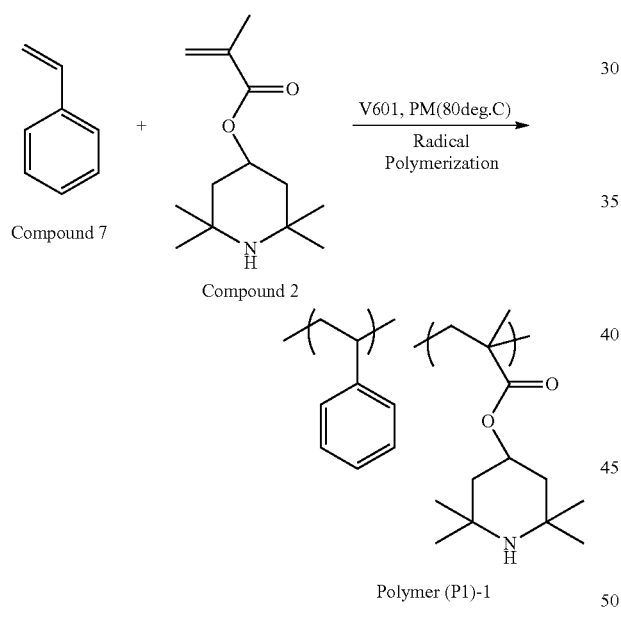

In the same manner as described above, polymers (P1)-2 and (P1)-3 were synthesized with the monomer blend shown in Table 20 below.

TABLE 20

| Polymer (P1) | Monomer blend | Compositional ratio | Mw | Mw/Mn |
|---|---|---|---|---|
| (P1)-1 | M7/M2 | 94/6 | 90100 | 1.50 |
| (P1)-2 | M7/M2 | 93/7 | 17000 | 2.08 |
| (P1)-3 | M3/M8/M2 | 49/45/6 | 35000 | 2.01 |
| (P1)-4 | M7/M10/M2 | 72/23/5 | 27400 | 1.39 |

In the table above, the symbols denoting the monomers (M1 to M5) refer to the monomers having the chemical structures shown below.

[Chemical Formula 92.]

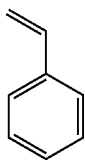
M7

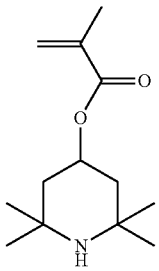
M2

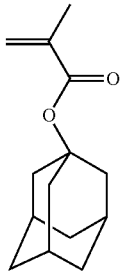
M3

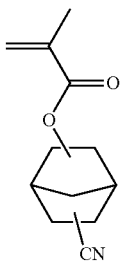
M8

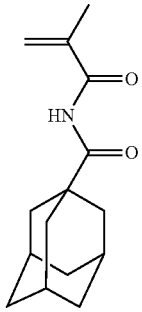
M10

[Polymer Synthesis Example: synthesis of polymer (P2)]

To a separable flask equipped with a thermometer, a reflux tube and a nitrogen feeding pipe, 109.42 g of methyl ethyl ketone (MEK) was added, and heated to 87° C. Further, 50.00 g (226.95 mmol) of a compound 3 (M3) and 22.94 g (111.78 mmol) of a compound 8 (M8) were dissolved in 109.42 g of MEK, and 1.732 g (2.22 mmol % based on all monomers) of dimethyl 2,2'-azobis(isobutyrate) (V-601) as a polymerization initiator was added thereto, so as to obtain a dripping solution. The dripping solution was dropwise added in a nitrogen atmosphere over 4 hours. Thereafter, the reaction solution was heated for 1 hour while stirring, and then cooled to room temperature.

The obtained reaction polymer solution was dropwise added to an excess amount of methanol to precipitate a polymer. Thereafter, the precipitated white powder was washed with methanol/MEK in an excess amount, followed by washing with pure water in an excess amount and drying, thereby obtaining 62.88 g of a polymer (P2)-1 as an objective compound (yield: 86.2%).

With respect to the polymer, the weight average molecular weight (Mw) and the dispersity (Mw/Mn) were determined by the polystyrene equivalent value as measured by gel permeation chromatography (GPC). As a result, it was found that the weight average molecular weight was 159,000, and the dispersity was 1.40.

Further, as a result of an analysis by carbon 13 nuclear magnetic resonance spectroscopy (600 MHz $^{13}$C-NMR), it was found that the composition of the copolymer (ratio (molar ratio) of the respective structural units within the structural formula) was 1/m=68/32.

[Chemical Formula 93.]

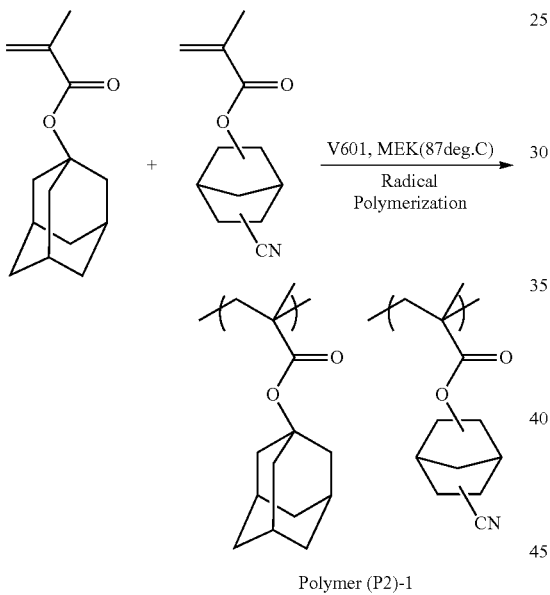

Polymer (P2)-1

In the same manner as described above, polymers (P2)-2 to (P2)-7 were synthesized with the monomer blend shown in Table 21 below.

TABLE 21

| Polymer (P1) | Monomer blend | Compositional ratio | Mw | Mw/Mn |
|---|---|---|---|---|
| (P2)-1 | M3/M8 | 68/32 | 15900 | 1.40 |
| (P2)-2 | M11 | 100 | 2000 | 1.07 |
| (P2)-3 | M12/M3 | 49/51 | 16900 | 1.67 |
| (P2)-4 | M13/M6 | 60/40 | 14800 | 1.59 |
| (P2)-5 | M14/M8 | 66/34 | 10400 | 1.78 |
| (P2)-6 | M7 | 100 | 19300 | 1.02 |
| (P2)-7 | M1/M15/M6 | 41/49/10 | 6800 | 1.72 |

In the table above, the symbols denoting the monomers (M7, M3, M8, M11, M12, M13, M6, M14, M1, M15) refer to the monomers having the chemical structures shown below.

[Chemical Formula 94.]

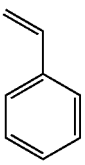
M7

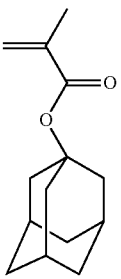
M3

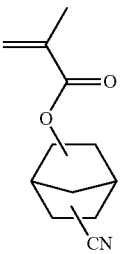
M8

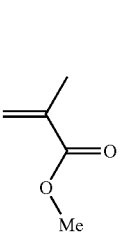
M11

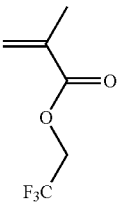
M12

M13

M6

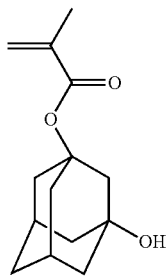

M14

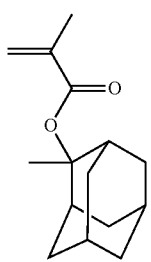

M1

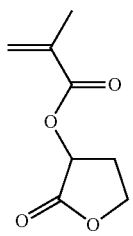

M15

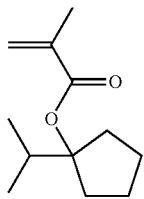

The synthesized polymer (P1) and/or polymer (P2) was dissolved in butyl acetate with the composition shown in Table 22 below, so as to prepare pattern thickening polymer compositions (Sh)-1 to (Sh)-22. The concentration of the polymer in terms of the total of polymer (P1) and polymer (P2) was 1.8%.

In Table 22, the values in brackets [ ] indicate the amount (in terms of parts by weight) of the component added.

TABLE 22

| Pattern thickening polymer composition | Polymer (P1) | Polymer (P2) |
| --- | --- | --- |
| (Sh)-1 | (P1)-1 [90] | (P2)-1 [10] |
| (Sh)-2 | (P1)-1 [50] | (P2)-1 [50] |
| (Sh)-3 | (P1)-1 [10] | (P2)-1 [90] |
| (Sh)-4 | (P1)-1 [90] | (P2)-2 [10] |
| (Sh)-5 | (P1)-1 [50] | (P2)-2 [50] |
| (Sh)-6 | (P1)-1 [10] | (P2)-2 [90] |

TABLE 22-continued

| Pattern thickening polymer composition | Polymer (P1) | Polymer (P2) |
| --- | --- | --- |
| (Sh)-7 | (P1)-1 [50] | (P2)-3 [50] |
| (Sh)-8 | (P1)-1 [10] | (P2)-4 [90] |
| (Sh)-9 | (P1)-1 [10] | (P2)-5 [90] |
| (Sh)-10 | (P1)-1 [80] | (P2)-6 [20] |
| (Sh)-11 | (P1)-1 [90] | (P2)-7 [10] |
| (Sh)-12 | (P1)-3 [10] | (P2)-2 [90] |
| (Sh)-13 | (P1)-4 [90] | (P2)-1 [10] |
| (Sh)-14 | (P1)-4 [50] | (P2)-1 [50] |
| (Sh)-15 | (P1)-4 [10] | (P2)-1 [90] |
| (Sh)-16 | (P1)-1 [100] | — |
| (Sh)-17 | — | (P2)-1 [100] |
| (Sh)-18 | — | (P2)-2 [100] |
| (Sh)-19 | (P1)-1 [90] (P1)-2 [10] | — |
| (Sh)-20 | (P1)-3 [100] | — |
| (Sh)-21 | (P1)-4 [100] | — |
| (Sh)-22 | (P1)-2 [100] | — |

<Application of Pattern Thickening Polymer Composition>

In each of the examples, comparative examples and reference examples, the pattern thickening polymer composition shown in Table 23 was applied to cover the resist prepattern obtained above.

The coating film thickness of the pattern thickening polymer composition was 60 nm.

[Step C]

The first resist pattern covered with the pattern thickening polymer composition obtained in the above step B was heated, so as to neutralize the base within the pattern thickening polymer composition with the first resist pattern. The heating temperature at this time is indicated under "Shrink bake (° C.)" in Table 23 below. The heating time was 60 seconds.

[Step D]

After the above step C, a solvent development was conducted for 13 seconds using butyl acetate, so as to remove the unreacted portion of the pattern thickening polymer composition. In this manner, the resist prepattern was thickened, and a shrunk pattern in which the holes were shrunk was formed.

With respect to the pattern obtained above, the pattern size was evaluated by the method described below.

[Evaluation of Pattern Size]

Each resist prepattern and hole pattern was observed from the upper side thereof using a lengthwise measuring scanning electron microscope (SEM) (acceleration voltage: a500V, product name: CG5000, manufactured by Hitachi High-Technologies), and the hole minor axis and the hole major axis were measured.

With respect to each hole pattern, the difference in the hole minor axis between the resist prepattern and the hole pattern, and the difference in the hole major axis between the resist prepattern and the hole pattern are respectively indicated under "X-S.V. (nm)" and "Y-S.V. (nm)" in Table 23 below.

Further, the change in the aspect ratio of the hole (oval) before and after shrinking was determined as (Y-S.V.)/(X-S.V.). The results are shown in Table 23 below under "Y/X".

The closer the "Y/X" to 1, the smaller the change in the aspect ratio of the hole cross-section by the pattern shrinking.

TABLE 23

| | Polymer | Shrink bake (° C.) | X-S.V. (nm) | Y-S.V. (nm) | Y/X |
|---|---|---|---|---|---|
| Ex. 1G | (Sh)-1 | 80 | 10.6 | 12.2 | 1.15 |
| Ex. 2G | (Sh)-2 | 80 | 11.9 | 11.9 | 1.00 |
| Ex. 3G | (Sh)-3 | 80 | 12.4 | 10.1 | 0.82 |
| Ex. 4G | (Sh)-1 | 150 | 14.8 | 21.1 | 1.42 |
| Ex. 5G | (Sh)-2 | 150 | 14.8 | 18.0 | 1.22 |
| Ex. 6G | (Sh)-3 | 150 | 14.6 | 13.9 | 0.95 |
| Ex. 7G | (Sh)-4 | 80 | 10.5 | 12.5 | 1.19 |
| Ex. 8G | (Sh)-5 | 80 | 10.3 | 11.5 | 1.12 |
| Ex. 9G | (Sh)-6 | 80 | 10.4 | 10.8 | 1.04 |
| Ex. 10G | (Sh)-4 | 150 | 13.8 | 19.8 | 1.43 |
| Ex. 11G | (Sh)-5 | 150 | 13.0 | 18.0 | 1.38 |
| Ex. 12G | (Sh)-6 | 150 | 12.1 | 14.3 | 1.19 |
| Ex. 13G | (Sh)-7 | 80 | 10.9 | 12.1 | 1.11 |
| Ex. 14G | (Sh)-8 | 80 | 11.5 | 13.3 | 1.16 |
| Ex. 15G | (Sh)-9 | 80 | 12.2 | 10.6 | 0.87 |
| Ex. 16G | (Sh)-10 | 80 | 11.5 | 13.3 | 1.16 |
| Ex. 17G | (Sh)-11 | 80 | 10.1 | 12.0 | 1.19 |
| Ex. 18G | (Sh)-12 | 150 | 13.8 | 11.8 | 0.86 |
| Ex. 19G | (Sh)-13 | 80 | 13.2 | 10.6 | 0.80 |
| Ex. 20G | (Sh)-14 | 80 | 13.0 | 10.2 | 0.79 |
| Ex. 21G | (Sh)-15 | 80 | 12.1 | 9.2 | 0.76 |
| Comp. Ex. 1G | (Sh)-16 | 80 | 10.6 | 13.3 | 1.25 |
| Comp. Ex. 2G | (Sh)-16 | 150 | 14.5 | 21.0 | 1.44 |
| Comp. Ex. 3G | (Sh)-17 | 80 | — | — | — |
| Comp. Ex. 4G | (Sh)-18 | 80 | — | — | — |
| Comp. Ex. 5G | (Sh)-19 | 150 | 6.7 | 9.4 | 1.40 |
| Ref. Ex. 1G | (Sh)-20 | 150 | 13.5 | 12.2 | 0.93 |
| Ref. Ex. 2G | (Sh)-21 | 150 | 13.3 | 11.2 | 0.85 |
| Ref. Ex. 3G | (Sh)-22 | 150 | 6.1 | 8.6 | 1.41 |

As seen from the results shown above, in Examples 1G to 20G in which a pattern thickening polymer composition containing polymer (P1) and polymer (P2) was applied and a developing solution insoluble region was formed by heating, it was confirmed that the pattern was satisfactorily shrunk, and the change in the aspect ratio of the hole (oval) by the pattern shrinking could be reduced.

From the results of Examples 1G to 12G, it was confirmed that, by increasing the amount of the polymer (P2) within the pattern thickening polymer composition, Y/X can be decreased.

From a comparison of Examples 1G to 3G with Examples 4G to 6G, and a comparison of Examples 7G to 9G with Examples 10G to 12G$_5$ it was confirmed that, by raising the heating temperature in step C, the shrinkage ratio increases.

In Reference Example 1G, it was confirmed that, despite that a pattern thickening polymer composition containing no polymer (P2) was used, the pattern could be satisfactorily shrunk, and the change in the aspect ratio of the hole (oval) by the pattern shrinking could be reduced. However, in Example 18G which used a pattern thickening polymer composition containing the same polymer (P1), the change in the aspect ratio of the hole (oval) by the pattern shrinking could be further reduced, as compared to Reference Example 1.

Similarly, in Reference Example 2G, it was confirmed that, despite that a pattern thickening polymer composition containing no polymer (P2) was used, the pattern could be satisfactorily shrunk, and the change in the aspect ratio of the hole (oval) by the pattern shrinking could be reduced. However, in Examples 19G to 21G which used a pattern thickening polymer composition containing the same polymer (P1), the change in the aspect ratio of the hole (oval) by the pattern shrinking could be further reduced, as compared to Reference Example 2.

On the other hand, in Comparative Example 1 which used a pattern thickening polymer composition containing no polymer (P2), Y/X was large as compared to Examples 1G to 3G, 7G to 9G and 13G to 20G in which pattern shrinking was conducted under the same temperature conditions.

Similarly, in Comparative Example 2 which used a pattern thickening polymer composition containing no polymer (P2), Y/X was large as compared to Examples 4G to 6G and 10G to 12G in which pattern shrinking was conducted under the same temperature conditions.

In Comparative Examples 3G and 4G which used a pattern thickening polymer composition containing no polymer (P1), the resist prepattern could not be shrunk.

In Comparative Example 5 which used a pattern thickening polymer composition containing 2 kinds of polymer (P1) and no polymer (P2), the change in the aspect ratio of the hole (oval) by the pattern shrinking was not largely affected, as compared to Reference Example 2 which used a pattern thickening polymer composition containing 1 kind of the same polymer (P1) and no polymer (P2). Further, in Comparative Example 5G, the shrinkage ratio was small, as compared to Examples 4G to 6G and 10G to 12G in which pattern shrinking was conducted under the same temperature conditions.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern, comprising:
    applying a resist composition to a substrate to form a resist film;
    exposing the resist film;
    developing the exposed resist film to form a first resist pattern on the substrate;
    applying a basic composition to cover the first resist pattern,
    neutralizing a base contained in the basic composition and the first resist pattern to form a developing solution insoluble region on a surface of the first resist pattern; and
    developing the covered first resist pattern,
    the basic composition comprising a basic component, and the basic component comprising a block copolymer containing a block chain (b1) comprising a structural unit (x0) represented by general formula (x0-1) shown below and a block chain (b2) having a styrene skeleton, wherein the molar ratio of the structural unit comprising the block chain (b1)/structural unit comprising the block chain (b2)=1/99 to less than 10/90:

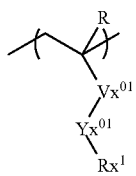

(x0-1)

wherein R represents a hydrogen atom, an alkyl group of 1 to 5 carbon atoms or a halogenated alkyl group of 1 to 5 carbon atoms; $Vx^{01}$ represents a divalent hydrocarbon group having an ether bond or an amide bond, a divalent aromatic hydrocarbon group, or a single bond; $Yx^{01}$ represents a single bond or a divalent linking group; and Rx' represents a substituent having a nitrogen atom.

2. The method according to claim 1, wherein the basic composition comprises a copolymer of the structural unit (x0) and at least one structural unit selected from the group consisting of a structural unit containing a lactone-containing cyclic group and a structural unit containing an acid non-dissociable cyclic group.

3. The method according to claim 1, wherein the basic composition further comprises an organic solvent.

4. The method according to claim 1, wherein, the exposed resist film is developed using an organic solvent to form a negative-tone resist pattern as the first resist pattern.

5. The method according to claim 1, wherein
the developing solution insoluble region is a contacted portion of the first resist pattern with the basic composition, and
the polymeric compound has a glass transition temperature of 100° C. or higher.

6. The method according to claim 1, wherein the dispersity (weight average molecular weight/number average molecular weight) of the polymeric compound is 1.5 or less.

7. The method according to claim 6, wherein the amount of components having a molecular weight of 1,000 or less within the polymeric compound, based on the total area of a pattern obtained by gel permeation chromatography (GPC) is 20% or less in terms of the area of pattern of components having a molecular weight of 1,000 or less.

8. The method according to claim 6, wherein, in the polymeric compound, the amount of components that exhibits a dissolution rate of 5 nm/sec or less in butyl acetate is 20% or less in terms of the area of pattern as measured by gel permeation chromatography, based on the total area of the pattern.

9. The method according to claim 1, wherein the block copolymer contains the block chain (b1) on a terminal of the main chain thereof.

10. The method according to claim 1, wherein the dispersity (weight average molecular weight/number average molecular weight) of the block copolymer is 1.5 or less.

11. A method of forming a resist pattern, comprising:
forming a first resist pattern on a substrate,
applying a basic composition to cover the first resist pattern,
neutralizing a base contained in the basic composition and the first resist pattern to form a developing solution insoluble region on a surface of the first resist pattern, and developing the covered first resist pattern,
wherein the basic composition comprises a basic component, and the basic component comprises a polymeric compound having a structural unit (x0) represented by general formula (x0-1) shown below:

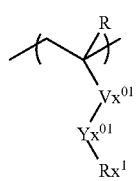

(x0-1)

wherein R represents a hydrogen atom, an alkyl group of 1 to 5 carbon atoms or a halogenated alkyl group of 1 to 5 carbon atoms; $Vx^{01}$ represents a divalent hydrocarbon group having an ether bond or an amide bond, a divalent aromatic hydrocarbon group, or a single bond; $Yx^{01}$ represents a single bond or a divalent linking group; and $Rx^1$ represents a substituent having a nitrogen atom, the polymeric compound having an amino group or a group containing a structure represented by any one of formulae (x-1) to (x-4) shown below on at least one terminal of the main chain thereof

(x-1)

(x-2)

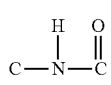

(x-3)

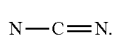

(x-4)

12. The method according to claim 11, further comprising conducting polymerization using an initiator having an amino group or a group containing a structure represented by any one of formulae (x-1) to (x-4) to obtain the polymeric compound.

13. The method according to claim 11, wherein the dispersity of the basic composition is less than 1.5.

14. A method of forming a resist pattern, comprising:
forming a first resist pattern on a substrate;
applying a basic composition to cover the first resist pattern;
applying an acidic composition to cover the layer of the basic composition, so as to form an acidic layer,
neutralizing a base contained in the basic composition and the first resist to form a developing solution insoluble region on a surface of the first resist pattern; and
developing the covered first resist pattern,
wherein the basic composition comprises a basic component, and the basic component comprises a polymeric compound having a structural unit (x0) represented by general formula (x0-1) shown below:

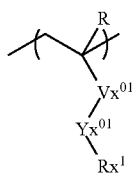

(x0-1)

wherein R represents a hydrogen atom, an alkyl group of 1 to 5 carbon atoms or a halogenated alkyl group of 1 to 5 carbon atoms; $Vx^{01}$ represents a divalent hydrocarbon group having an ether bond or an amide bond, a divalent aromatic hydrocarbon group, or a single bond; $Yx^{01}$ represents a single bond or a divalent linking group; and Rx' represents a substituent having a nitrogen atom.

15. The method according to claim 14, which further comprises, applying a basic composition is applied to cover the acidic layer, so as to form a second basic layer.

16. The method according to claim 15, which further comprises applying an acidic composition is applied to cover the second basic layer, so as to form a second acidic layer.

17. A method of forming a resist pattern, comprising:
forming a first resist pattern on a substrate;
applying a basic composition to cover the first resist pattern;
neutralizing a base contained in the basic composition and the first resist pattern to form a developing solution insoluble region on a surface of the first resist pattern, and
developing the covered first resist pattern,
wherein the basic composition comprises a polymer (P1) which thickens the first resist pattern by itself and has a structural unit (x0) represented by general formula (x0-1) shown below, and a polymer (P2) which does not thicken the first resist pattern by itself:

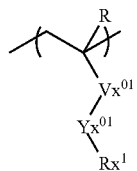

(x0-1)

wherein R represents a hydrogen atom, an alkyl group of 1 to 5 carbon atoms or a halogenated alkyl group of 1 to 5 carbon atoms; $Vx^{01}$ represents a divalent hydrocarbon group having an ether bond or an amide bond, a divalent aromatic hydrocarbon group, or a single bond; $Yx^{01}$ represents a single bond or a divalent linking group; and Rx' represents a substituent having a nitrogen atom.

18. The method according to claim 17, wherein the polymer (P1) comprises a structural unit containing a styrene skeleton.

19. The method according to claim 17, wherein the glass transition temperature of the polymer (P2) is at least the glass transition temperature of the polymer (P1).

20. The method according to claim 17, wherein the weight ratio of the polymer (P1) to the polymer (P2) is, polymer (P1)/polymer (P2)=1/9 to 9/1.

21. The method according to claim 17, wherein the first resist pattern is a hole pattern.

* * * * *